US010270999B2

(12) United States Patent
Kusaka

(10) Patent No.: US 10,270,999 B2
(45) Date of Patent: Apr. 23, 2019

(54) IMAGE SENSOR AND IMAGE-CAPTURING DEVICE

(71) Applicant: NIKON CORPORATION, Tokyo (JP)

(72) Inventor: Yosuke Kusaka, Yokohama (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 14/431,317

(22) PCT Filed: Sep. 25, 2013

(86) PCT No.: PCT/JP2013/075881
§ 371 (c)(1),
(2) Date: Mar. 26, 2015

(87) PCT Pub. No.: WO2014/050875
PCT Pub. Date: Apr. 3, 2014

(65) Prior Publication Data
US 2015/0256778 A1    Sep. 10, 2015

(30) Foreign Application Priority Data

Sep. 27, 2012 (JP) ................................. 2012-214452

(51) Int. Cl.
G02B 7/34 (2006.01)
H04N 9/04 (2006.01)
(Continued)

(52) U.S. Cl.
CPC ............... *H04N 5/378* (2013.01); *G02B 7/34* (2013.01); *G02B 7/346* (2013.01); *G03B 13/36* (2013.01);
(Continued)

(58) Field of Classification Search
CPC .. H04N 5/378; H04N 5/37455; H04N 5/3745; H04N 5/3696; H04N 5/23212;
(Continued)

(56) References Cited

U.S. PATENT DOCUMENTS 8,482,644 B2 * 7/2013 Mori ................. H01L 27/14603
348/294
8,520,105 B2 * 8/2013 Funatsu ............ H01L 27/14609
348/280
(Continued)

FOREIGN PATENT DOCUMENTS

CN    101485195 A    7/2009
CN    102007762 A    4/2011
(Continued)

OTHER PUBLICATIONS

Jan. 26, 2018 Office Action issued in Chinese Patent Application No. 201380050927.X.
(Continued)

Primary Examiner — Pritham D Prabhakher
(74) Attorney, Agent, or Firm — Oliff PLC

(57) ABSTRACT

An image sensor includes: first pixels, each of which receives a pair of light fluxes and outputs a pair of first analog signals; an A/D conversion unit that converts each of pairs of first analog signals to a pair of first digital signals; a digital adder unit that generates digital sum signals each by adding together the pair of first digital signals among pairs of first digital signals; a first output unit that outputs pairs of first digital signals to an external recipient; and a second output unit that outputs the digital sum signals to an external recipient.

14 Claims, 41 Drawing Sheets

(51) Int. Cl.
| | |
|---|---|
| *G03B 13/36* | (2006.01) |
| *H04N 5/225* | (2006.01) |
| *H04N 5/232* | (2006.01) |
| *H04N 5/369* | (2011.01) |
| *H04N 5/374* | (2011.01) |
| *H04N 5/378* | (2011.01) |
| *H04N 5/3745* | (2011.01) |

(52) U.S. Cl.
CPC ....... *H04N 5/2254* (2013.01); *H04N 5/23212* (2013.01); *H04N 5/3696* (2013.01); *H04N 5/374* (2013.01); *H04N 5/3745* (2013.01); *H04N 5/37455* (2013.01); *H04N 9/045* (2013.01)

(58) Field of Classification Search
CPC ...... H04N 5/374; H04N 5/2254; H04N 9/045; G02B 7/34; G02B 7/346; G03B 13/36
USPC ........................................................ 348/302
See application file for complete search history.

(56) References Cited

U.S. PATENT DOCUMENTS

| | | | | |
|---|---|---|---|---|
| 8,648,940 | B2* | 2/2014 | Ogawa | H04N 5/367 348/241 |
| 8,964,079 | B2* | 2/2015 | Fukuda | H01L 27/14605 348/272 |
| 9,077,921 | B2* | 7/2015 | Hashimoto | H04N 5/3745 |
| 9,338,341 | B2* | 5/2016 | Taniguchi | G02B 7/34 |
| 2002/0036257 | A1* | 3/2002 | Yamashita | H04N 5/23212 250/208.1 |
| 2005/0151873 | A1* | 7/2005 | Murakami | H01L 27/14812 348/340 |
| 2007/0126909 | A1 | 6/2007 | Kuruma | |
| 2009/0096886 | A1* | 4/2009 | Kusaka | H04N 5/23212 348/222.1 |
| 2009/0122171 | A1* | 5/2009 | Suzuki | H04N 5/23212 348/294 |
| 2009/0295954 | A1* | 12/2009 | Mori | H01L 27/14603 348/294 |
| 2010/0091161 | A1* | 4/2010 | Suzuki | H01L 27/14609 348/302 |
| 2010/0214462 | A1* | 8/2010 | Itakura | H04N 5/335 348/302 |
| 2010/0253821 | A1* | 10/2010 | Yamamoto | H03K 4/02 348/294 |
| 2011/0013033 | A1 | 1/2011 | Mori | |
| 2011/0085065 | A1* | 4/2011 | Egawa | H04N 5/357 348/294 |
| 2011/0279727 | A1* | 11/2011 | Kusaka | H01L 27/14621 348/340 |
| 2012/0033128 | A1* | 2/2012 | Nagano | G02B 7/34 348/349 |
| 2012/0147238 | A1* | 6/2012 | Kita | H04N 5/23212 348/302 |
| 2012/0162488 | A1 | 6/2012 | Ogawa | |
| 2012/0217413 | A1* | 8/2012 | Kameshima | A61B 6/4233 250/394 |
| 2012/0262604 | A1* | 10/2012 | Ishii | H04N 5/23212 348/231.99 |
| 2012/0268634 | A1* | 10/2012 | Fukuda | H01L 27/14605 348/302 |
| 2013/0076972 | A1* | 3/2013 | Okita | H04N 5/23212 348/360 |
| 2013/0229557 | A1* | 9/2013 | Hashimoto | H04N 5/3745 348/301 |
| 2013/0321683 | A1 | 12/2013 | Sonoda et al. | |

FOREIGN PATENT DOCUMENTS

| | | |
|---|---|---|
| EP | 1 085 751 A2 | 3/2001 |
| EP | 2037674 A1 | 3/2009 |
| JP | 2001-083407 A | 3/2001 |
| JP | 2001-250931 A | 9/2001 |
| JP | 2005-277513 A | 10/2005 |
| JP | 2006-105771 A | 4/2006 |
| JP | 2007-150643 A | 6/2007 |
| JP | 2007-333720 A | 12/2007 |
| JP | 2008-015754 A | 1/2008 |
| JP | 2008-017019 A | 1/2008 |
| JP | 2008-103885 A | 5/2008 |
| JP | 2010-016536 A | 1/2010 |
| JP | 2012-168246 A | 9/2012 |
| JP | 2013-251874 A | 12/2013 |

OTHER PUBLICATIONS

May 24, 2016 Search Report issued in European Patent Application No. 13840731.7.
Aug. 7, 2018 Office Action issued in Japanese Patent Application No. 2017-103952.
Jan. 17, 2017 Office Action issued in Japanese Patent Application No. 2012-214452.
Jan. 7, 2014 International Search Report issued in International Application No. PCT/JP2013/075881.
Aug. 23, 2016 Office Action issued in Japanese Patent Application No. 2012-214452.
Apr. 1, 2017 Office Action issued in Chinese Patent Application No. 201380050927.X.
Feb. 22, 2017 Office Action issued in European Patent Application No. 13840731.7.
Aug. 21, 2018 Office Action issued in Chinese Patent Application No. 201380050927.X.
Dec. 7, 2018 Office Action issued in Indian Patent Application No. 2674/DELNP/2015.
Feb. 25, 2019 Extended Search Report issued in European Patent Application No. 19153802.4.

* cited by examiner

FIG.15
(a)
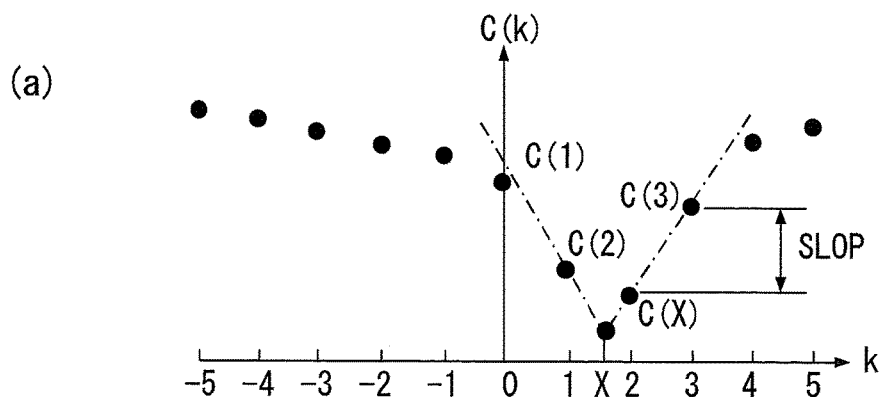
(b)
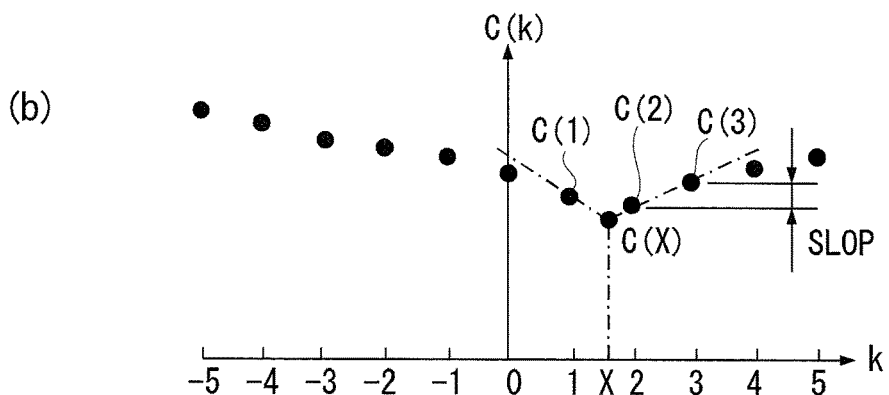
(c)
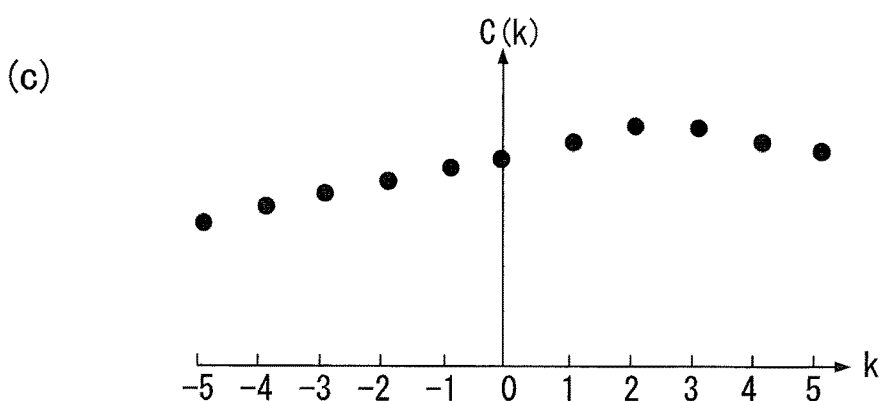

FIG.27
(a)
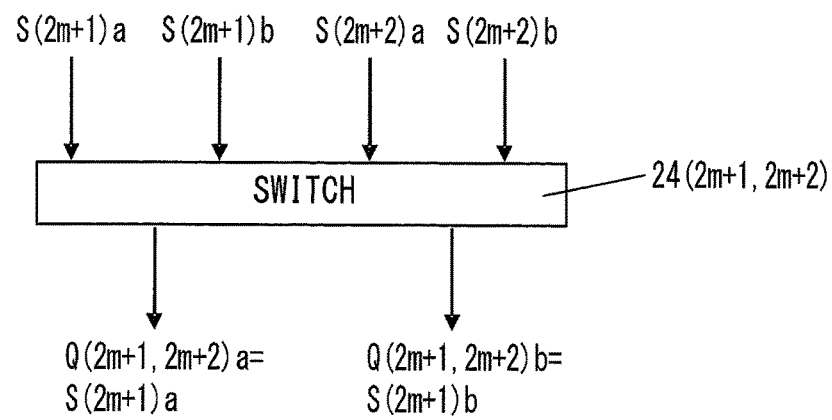
(b)
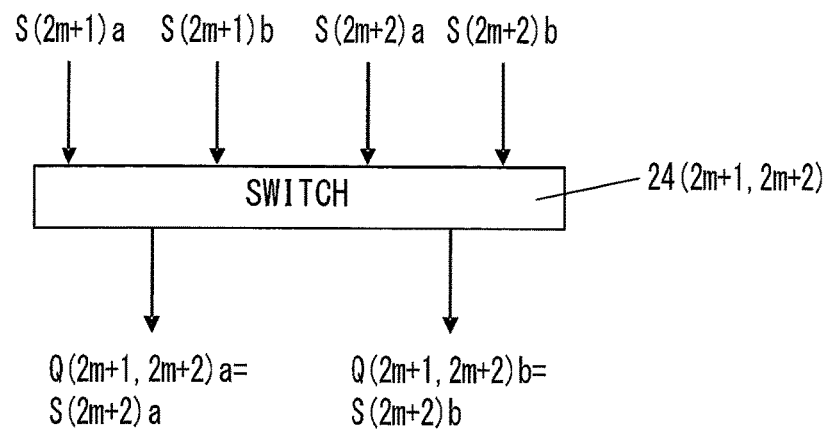

FIG.28
(a)
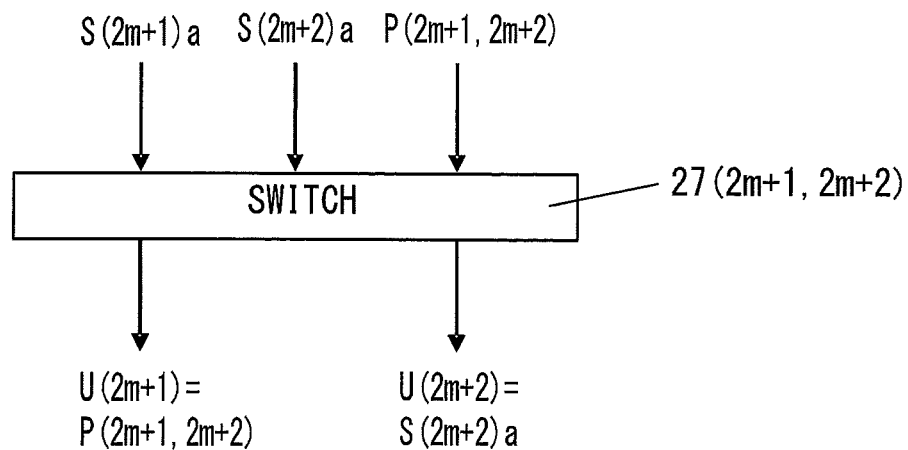
(b)
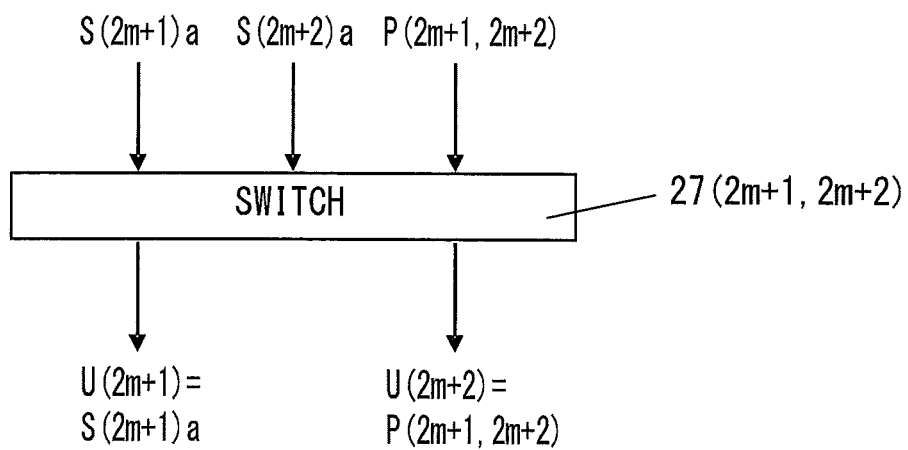

FIG.32
(a)
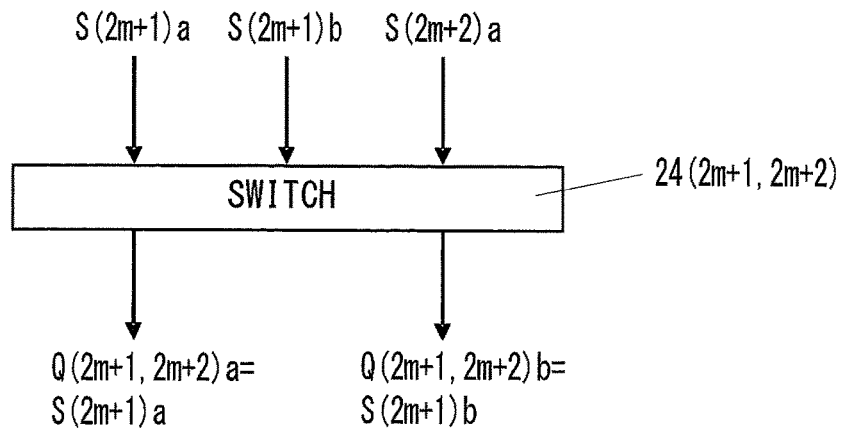
(b)
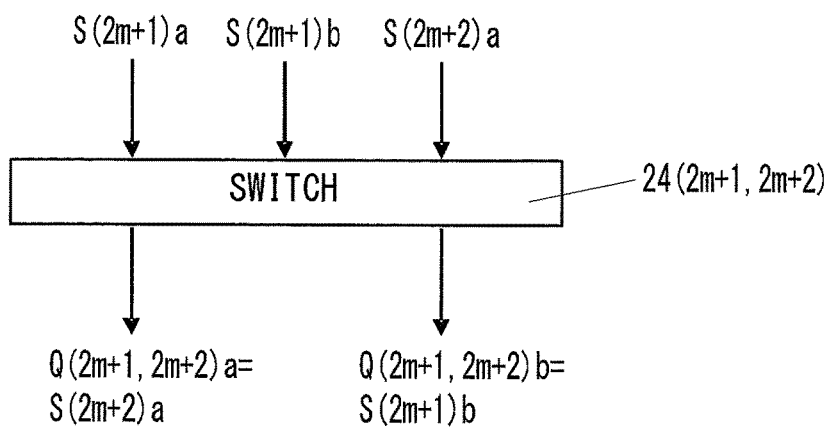

IMAGE SENSOR AND IMAGE-CAPTURING DEVICE

TECHNICAL FIELD

The present invention relates to an image sensor and an image-capturing device.

BACKGROUND ART

Image capturing devices known in the related art include the image-capturing device disclosed in patent literature 1. The image-capturing device includes an image sensor disposed on a predetermined focal plane of a photographic lens (optical system). The image sensor has arrayed thereat focus detection pixels, each constituted with a micro-lens and a pair of photoelectric conversion units disposed to the rear of the micro-lens. A pair of image signals corresponding to a pair of images formed with a pair of focus detection light fluxes passing through the optical system are generated as analog signals via the pair of photoelectric conversion units. The pair of analog signals are read out from the image sensor independently of each other and the focusing condition (defocus amount) at the photographic lens is detected by detecting an image shift amount (phase difference) indicating the extent of image shift manifested by the pair of image signals. Image information is generated as the analog signals, generated at the pair of photoelectric conversion units in each focus detection pixel, are analogously added together within the focus detection pixel and the analog signal resulting from the addition is read out as an image signal from the image sensor.

CITATION LIST

Patent Literature

PTL1: Japanese Laid Open Patent Publication No. 2001-83407

SUMMARY OF INVENTION

Technical Problem

In an image-capturing device such as that described above, the pair of analog signals undergo analog addition processing within the focus detection pixel. This means that while the pair of analog signals need to be read out independently of each other from the image sensor for focus detection operation, the pair of analog signals must be first added together and read out as the sum resulting from the addition from the image sensor in order to generate image information. Namely, there is an issue in that focus detection and image information generation cannot be executed at once when reading out signals for a given frame from the image sensor.

Solution to Problem

An image sensor according to a first aspect of the present invention comprises: first pixels, each of which receives a pair of light fluxes and outputs a pair of first analog signals; an A/D conversion unit that converts each of pairs of first analog signals to a pair of first digital signals; a digital adder unit that generates digital sum signals each by adding together the pair of first digital signals among pairs of first digital signals; a first output unit that outputs pairs of first digital signals to an external recipient; and a second output unit that outputs the digital sum signals to an external recipient.

According to a second aspect of the present invention, in the image sensor according to the first aspect, it is preferable to further comprise: a pixel array unit that includes first pixel groups each formed with the first pixels disposed along a first direction, with the first pixel groups set side-by-side along a second direction intersecting the first direction; and a scanning unit that scans the first pixel groups in the pixel array unit along the second direction. The A/D conversion unit converts the pairs of first analog signals output via the first pixels, disposed in a first pixel group being scanned by the scanning unit, to the pairs of first digital signals in parallel within the first pixel group.

According to a third aspect of the present invention, in the image sensor according to the second aspect, it is preferable that the pixel array unit further includes second pixels, each of which receives a light flux and outputs a second analog signal; the first pixel groups each include the first pixels and the second pixels disposed along the first direction; the A/D conversion unit respectively converts the pairs of first analog signals and second analog signals to the pairs of first digital signals and second digital signals in parallel along the second direction; and the second output unit outputs the digital sum signals and the second digital signals, obtained as the A/D conversion unit converts the second analog signals, to the external recipient.

According to a fourth aspect of the present invention, in the image sensor according to the third aspect, it is preferable that the digital adder unit adds together the pair of first digital signals output via a switch that outputs the pair of first digital signals when the pair of first digital signals and the second digital signal respectively corresponding to a first pixel and a second pixel disposed next to each other are input thereto.

According to a fifth aspect of the present invention, in the image sensor according to the fourth aspect, it is preferable to further comprise: a plurality of signal lines to which the pairs of first signals and the second analog signals are individually output from the first pixels and the second pixels disposed within the first pixel group being scanned by the scanning unit. Among the plurality of signal lines, a signal line corresponding to one of each pair of first analog signals also corresponds to the second analog signal output from the second pixel in the first pixel group that is scanned by the scanning unit next.

According to a sixth aspect of the present invention, it the image sensor according to any one of the third to fifth aspects, it is preferable that the first output unit and the second output unit share a common scanning circuit that outputs a scan signal; in response to the scan signal, the first output unit outputs the pairs of first digital signals to the external recipient; and in response to the scan signal, the second output unit outputs the digital sum signals and the second digital signals to the external recipient.

According to a seventh aspect of the present invention, in the image sensor according to the sixth aspect, it is preferable that the plurality of pixels, including the first pixels and the second pixels, disposed at the pixel array unit each include a red color filter, a green color filter or a blue color filter among red color filters, green color filters and blue color filters disposed in a Bayer array pattern, and the first pixels have green color filters.

According to an eighth aspect of the present invention, in the image sensor according to the seventh aspect of the present invention, it is preferable that the pixel array unit includes a plurality of second pixel groups each formed with third pixels, each of which receives a pair of light fluxes and outputs a pair of third analog signals, and the second pixels disposed along the first direction, with the plurality of second pixel groups disposed along the second direction so that a first pixel group and a second pixel group are set side-by-side at alternate positions; the first pixels each include a pair of first photoelectric conversion units set side-by-side along the first direction; and the third pixels each include a pair of third photoelectric conversion units set side-by-side along the second direction.

According to a ninth aspect of the present invention, in the image sensor according to the first aspect, it is preferable to further comprise: a first memory in which the pairs of first digital signals obtained as the A/D conversion unit converts the pairs of first analog signals are stored; and a second memory in which the digital sum signals each obtained by adding together, via the digital adder unit, the pair of first digital signals are stored. The first output unit outputs the pairs of first digital signals stored in the first memory to the external recipient; and the second output unit outputs the digital sum signals stored in the second memory to the external recipient.

According to a tenth aspect of the present invention, in the image sensor according to any one of the third to eighth aspects, it is preferable to further comprise: a first memory in which the pairs of first digital signals obtained as the A/D conversion unit converts the pairs of first analog signals are stored; and a second memory in which the digital sum signals each obtained by adding together, via the digital adder unit, the pair of first digital signals and the second digital signals obtained as the A/D conversion unit converts the second analog signals are stored. The first output unit outputs that pairs of first digital signals stored in the first memory to the external recipient; and the second output unit outputs the digital sum signals and the second digital signals stored in the second memory to the external recipient.

According to an eleventh aspect of the present invention, in the image sensor according to any one of the second to tenth aspects, it is preferable that the first pixels each include a micro-lens; and via the micro-lens, a pair of photoelectric conversion units in the first pixel and partial areas ranging in different areas of an exit pupil, through which the pair of light fluxes to be received at the pair of photoelectric conversion units in the first pixel pass, achieve a conjugate relation to each other.

According to a twelfth aspect of the present invention, in the image sensor according to the eleventh aspect, it is preferable that the image sensor is a backside illumination-type image sensor having a wiring layer disposed on a side opposite from a side where the micro-lens is present relative to the pair of photoelectric conversion units in the first pixel.

An image-capturing device according to a thirteenth aspect comprises: an image sensor according to any one of the first to twelfth aspects; a focus detection unit that detects a focusing condition at the optical system by calculating a defocus amount representing an extent of defocus at the optical system through a phase difference detection method based upon the pairs of first digital signals output through the first output unit; a focus adjustment unit that adjusts the focusing condition based upon the defocus amount calculated by the focus detection unit; and image generation unit that generates image data based upon the digital sum signals output through the second output unit.

According to a fourteenth aspect of the present invention, in the image-capturing device according to the thirteenth aspect, it is preferable that the image generation unit generates the image data based upon the digital sum signals and the second digital signals output through the second output unit.

An image sensor according to a fifteenth aspect of the present invention comprises: pixels, each of which receives a pair of light fluxes and repeatedly outputs a pair of signals; a first output unit that outputs the pair of signals to an external recipient each time the pair of signals are output from a pixel; an adder unit that generates a sum signal by adding together the pair of signals each time the pair of signals are output from the pixel; and a second output unit that outputs, to an external recipient, the sum signal generated each time the sum signal is generated by the adder unit.

Advantageous Effects of Invention

According to the present invention, an image sensor and an image-capturing device that allow signals for focus detection and signals for image generation to be read out at high speed can be provided.

DESCRIPTION OF EMBODIMENTS

First Embodiment

Figure 1:
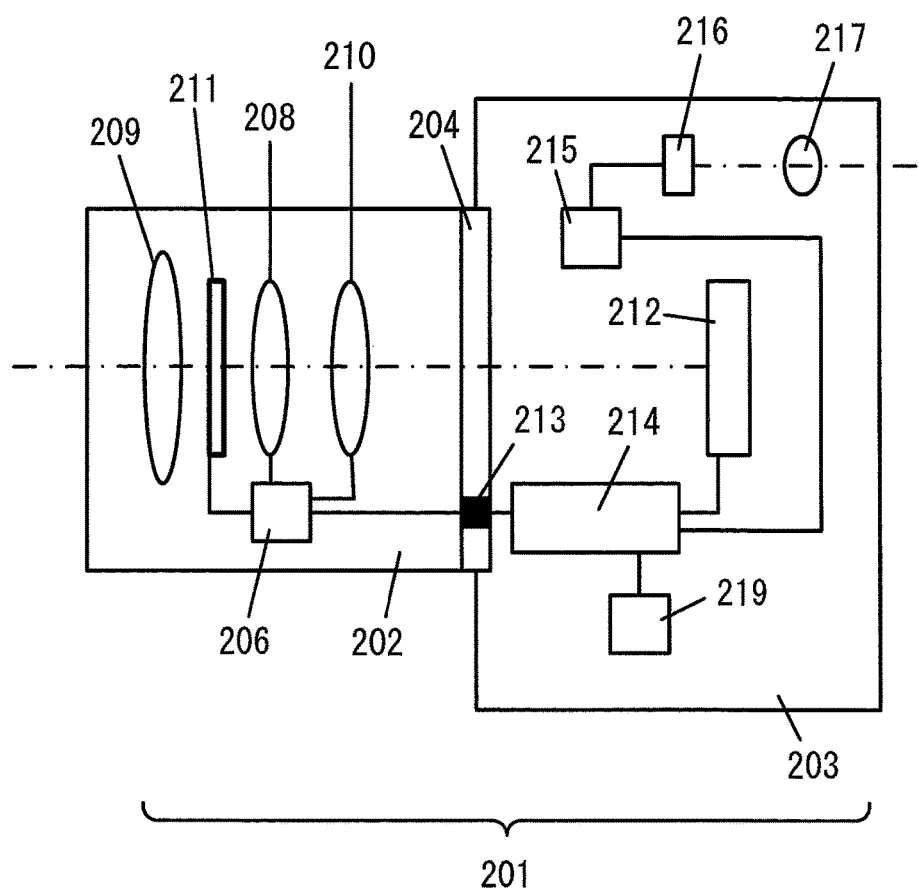
FIG. 1 A lateral sectional view showing a digital still camera with an interchangeable lens, having an image sensor achieved in a first embodiment installed therein FIG. 2 An illustration indicating a focus detection position set on the photographic image plane of the interchangeable lens FIG. 3 A front view showing the structure of an image sensor in detail FIG. 4 A front view showing the structure of the image sensor in detail FIG. 5 An illustration indicating the spectral sensitivity characteristics of various color filters FIG. 6 An illustration showing the structure of a focus detection pixel FIG. 7 An illustration of focus detection pixels in a sectional view FIG. 8 An illustration of the structure of a focus detection optical system adopting the split-pupil phase detection method FIG. 9 A block diagram indicating in detail the relationship between the image sensor and a body drive control device FIG. 10 A block diagram showing the structure of the image sensor FIG. 11 A timing chart of individual read operation for individually reading out signals output from the pair of photoelectric conversion units in each focus detection pixel and sum signal read operation for reading out the sum signal obtained by adding together the signals output from the pair of photoelectric conversion units, executed concurrently during a single frame period FIG. 12 A timing chart of individual read operation for individually reading out signals output from the pair of photoelectric conversion units in each focus detection pixel and sum signal read operation for reading out the sum signal obtained by adding together the signals output from the pair of photoelectric conversion units, executed concurrently during a single frame period FIG. 13 A flowchart of the processing executed by a CPUa engaged in focus detection operation in a body drive control device in the digital still camera FIG. 14 A flowchart of the processing executed by a CPUb engaged in image processing operation in the body drive control device in the digital still camera FIG. 15 Diagrams indicating correlation operation results obtained in conjunction with a pair of data strings FIG. 16 A timing chart pertaining to a partial row read FIG. 17 An illustration showing the structure of a focus detection pixel FIG. 18 A front view showing the structure of an image sensor in detail FIG. 19 A block diagram showing the structure of the image sensor FIG. 20 A front view showing the structure of an image sensor in detail FIG. 21 A front view showing the structure of an image sensor in detail FIG. 22 An illustration showing the structure of an image-capturing pixel FIG. 23 A sectional view of image-capturing pixels FIG. 24 An illustration of a photographic light flux FIG. 25 A front view showing the structure of an image sensor in detail FIG. 26 A block diagram showing the structure of the image sensor FIG. 27 Illustrations of selection operation at a switch disposed in correspondence to two adjacent pixel columns FIG. 28 Illustrations of selection operation at a switch disposed in correspondence to two adjacent pixel columns FIG. 29 A timing chart of individual read operation for reading out signals output from the pair of photoelectric conversion units in each focus detection pixel and read operation for reading out an output signal equivalent to a signal output from an image-capturing pixel, executed concurrently during a single frame period FIG. 30 A timing chart pertaining to a partial row read FIG. 31 A block diagram showing the structure of an image sensor FIG. 32 Illustrations of selection operation at a switch disposed in correspondence to two adjacent pixel columns FIG. 33 A front view showing the structure of an image sensor in detail FIG. 34 A block diagram showing the structure of the image sensor FIG. 35 A block diagram showing the structure of an image sensor FIG. 36 A front view showing the structure of an image sensor in detail FIG. 37 A front view showing the structure of the image sensor in detail FIG. 38 A block diagram showing the structure of the image sensor FIG. 39 A front view showing the structure of an image sensor in detail FIG. 40 A block diagram showing the structure of the image sensor FIG. 41 A block diagram showing the structure of an image sensor

An image sensor and an image-capturing device achieved in the first embodiment of the present invention will be described. FIG. 1 shows the structure of a digital still camera with an interchangeable lens, which includes the image sensor in the first embodiment installed therein, in a lateral sectional view. The digital still camera 201 achieved in the first embodiment comprises an interchangeable lens 202 and a camera body 203. The interchangeable lens 202 among various interchangeable lenses is mounted at the camera body 203 via a mount unit 204.

The interchangeable lens 202 includes a lens 209, a zooming lens 208, a focusing lens 210, an aperture 211 and a lens drive control device 206. The lens drive control device 206 is constituted with a microcomputer, a memory, a drive control circuit and the like (none shown). The lens drive control device 206 executes drive control for focus adjustment at the focusing lens 210 and for opening diameter adjustment at the aperture 211, detects the states of the zooming lens 208, the focusing lens 210 and the aperture 211, and engages in communication with a body drive control device 214 to be detailed later to transmit lens information to the body drive control device 214 and receive camera information from the body drive control device 214. The aperture 211 forms an opening, the diameter of which can be adjusted, centered on the optical axis for purposes of light amount adjustment and adjustment of the extent of blurring.

An image sensor 212, the body drive control device 214, a liquid crystal display element drive circuit 215, a liquid crystal display element 216, an eyepiece lens 217, a memory card 219 and the like are disposed at the camera body 203. The image sensor 212 includes pixels, which function as both image-capturing pixels and focus detection pixels, disposed thereat in a two-dimensional pattern. The image sensor 212 will be described in detail later.

The body drive control device 214 includes a microcomputer, a memory, a drive control circuit and the like. The body drive control device 214 is engaged in repeated execution of drive control for the image sensor 212, read of signals output from the image sensor 212, focus detection operation based upon the output signals and focus adjustment for the interchangeable lens 202. It also executes image processing based upon the output signals, records the image processing results, controls camera operations and the like. In addition, the body drive control device 214 engages in communication with the lens drive control device 206 via an electrical contact point 213 to receive the lens information and transmit the camera information (indicating a defocus amount, an aperture number and the like).

The liquid crystal display element 216 functions as an electronic viewfinder (EVF). A live view image provided via the image sensor 212 is brought up on display at the liquid crystal display element 216 by the liquid crystal display element drive circuit 215, and can be observed by the photographer via the eyepiece lens 217. The memory card 219 is an image storage medium in which images captured at the image sensor 212 are stored.

A subject image is formed on the light-receiving surface of the image sensor 212 with a light flux having passed through the interchangeable lens 202. The subject image undergoes photoelectric conversion at the individual pixels in the image sensor 212 and signals output from the pixels are transmitted to the body drive control device 214.

The body drive control device 214 calculates the defocus amount indicating the extent of defocus based upon signals output from various pixels at the image sensor 212 and transmits this defocus amount to the lens drive control device 206. In addition, the body drive control device 214 generates image data by processing the output signals provided from the individual pixels in the image sensor 212 and stores the image data thus generated into the memory card 219. It also provides live view image signals from the image sensor 212 to the liquid crystal display element drive circuit 215 so as to bring up a live view image on display at the liquid crystal display element 216. Moreover, the body drive control device 214 provides aperture control information to the lens drive control device 206 to enable control of the opening at the aperture 211.

The lens drive control device 206 updates the lens information in correspondence to the current focusing state, zooming state and aperture setting state, the maximum aperture number and the like. More specifically, the lens drive control device 206 detects the positions of the zooming lens 208 and the focusing lens 210 and the aperture number set for the aperture 211, and calculates the lens information based upon the lens positions and the aperture number. Alternatively, it may select the lens information corresponding to the lens positions and the aperture number from a lookup table prepared in advance.

The lens drive control device 206 calculates a lens drive quantity indicating the extent to which the lens is to be driven based upon the defocus amount having been received and drives the focusing lens 210 to a focus match position based upon the lens drive quantity. The lens drive control device 206 also drives the aperture 211 in correspondence to the aperture number it has received.

Figure 2:
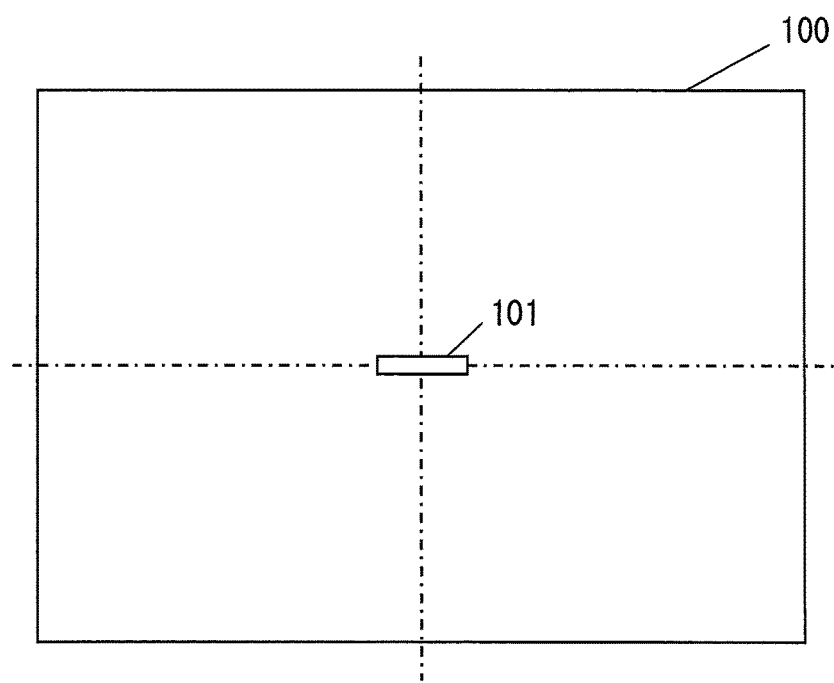

FIG. 2 shows a focus detection position (set through an operation of an operation member (not shown in FIG. 1) performed by the user) on the photographic image plane of the interchangeable lens 202. This focus detection position represents an example of an area (a focus detection area, a focus detection position) where an image is sampled on the photographic image plane when focus detection is executed via a focus detection pixel group at the image sensor 212, as will be detailed later. A focus detection area 101 in this example is set at the center of a rectangular photographic image plane 100. The rectangular focus detection area 101 extends along the horizontal direction at the photographic image plane, and output signals from pixels, disposed along a straight line extending along the longer sides of the focus detection area 101, are used for focus detection.

Figure 3:
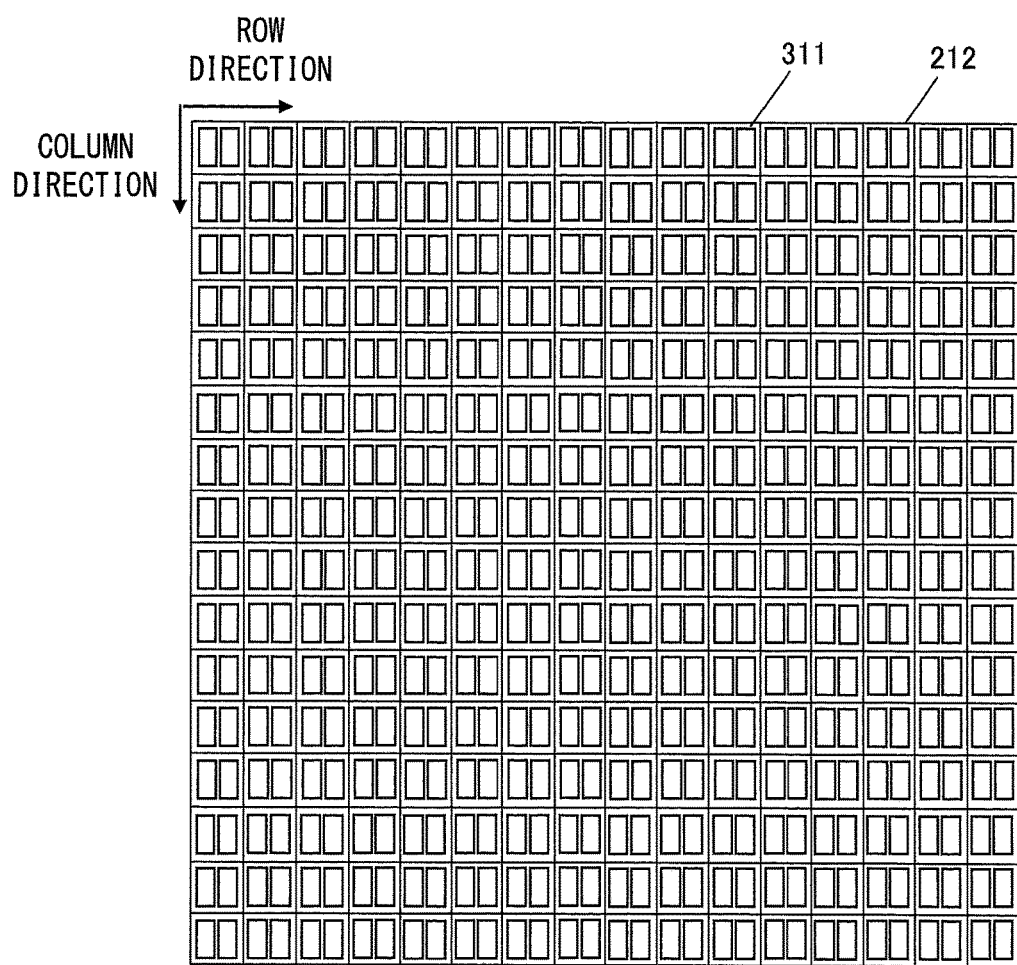
Figure 4:
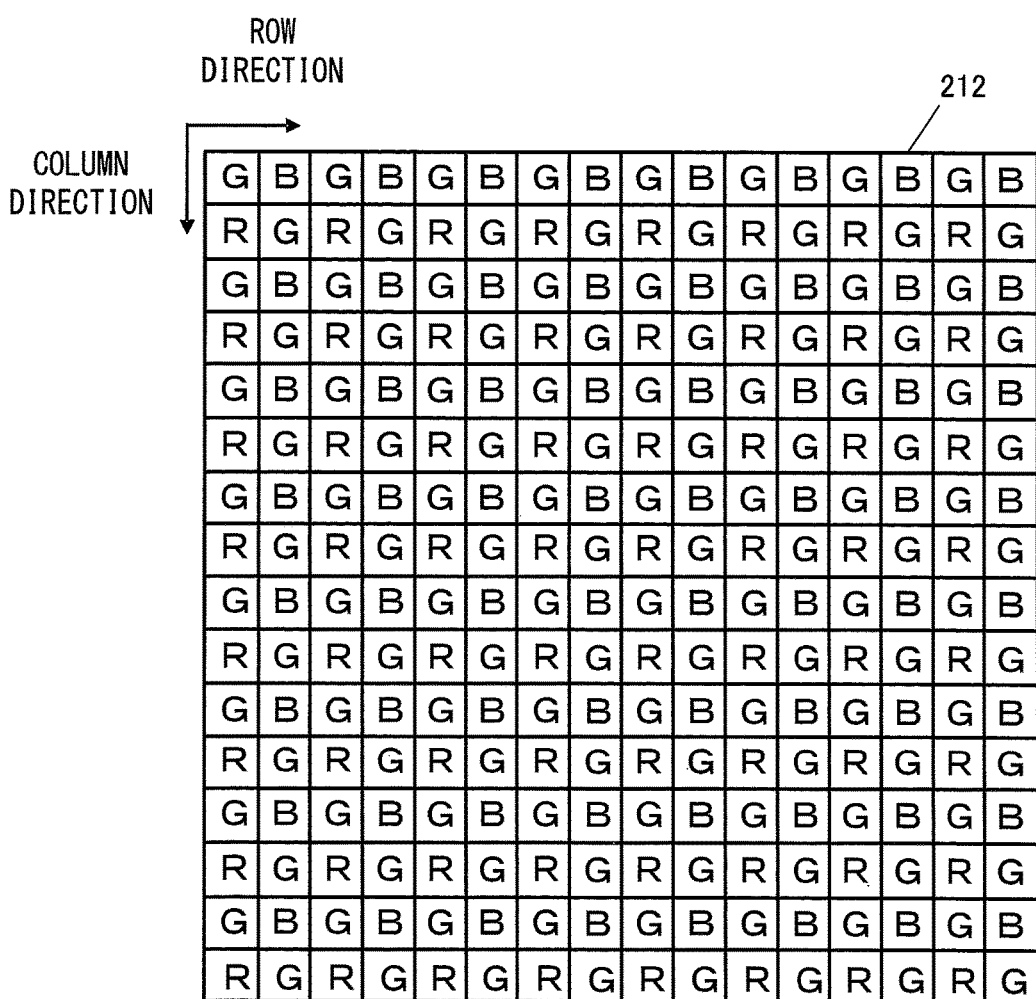
Figure 5:
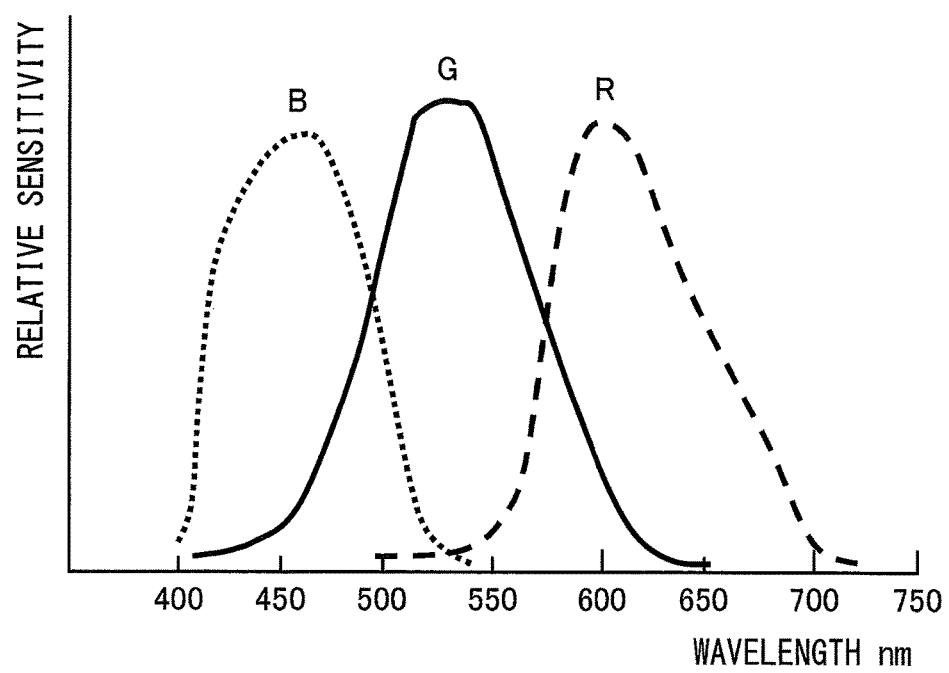

FIGS. 3 and 4 each show in detail the structure of the image sensor 212 in a front view of an enlargement of an area near the focus detection area 101 on the image sensor 212. FIG. 3 shows the layout of pixels 311 (hereafter referred to as focus detection pixels 311), which are used as both image-capturing pixels and focus detection pixels. The focus detection pixels 311 are disposed along a row direction (running along the horizontal direction) and along a column direction (running along the vertical direction) in a dense two-dimensional square grid pattern. FIG. 4 indicates the arrangement with which color filters are disposed at the focus detection pixels 311 in FIG. 3. Color filters, i.e., red color filters R, green color filters G and blue color filters B, achieving the spectral sensitivity characteristics indicated in FIG. 5, are disposed at the focus detection pixels 311 in conformance to the Bayer array rule.

Figure 6:
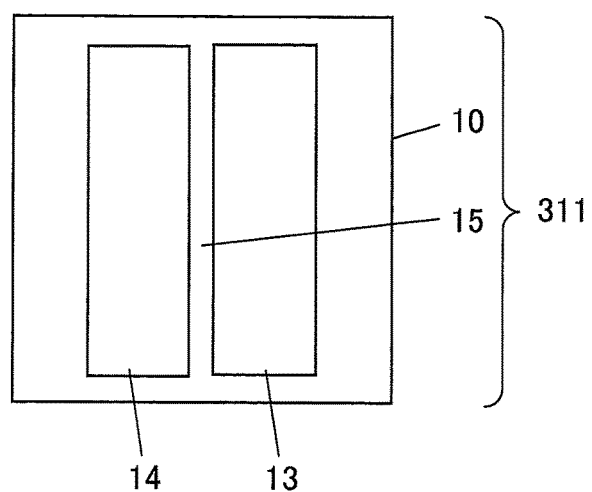

As FIG. 6 shows, the focus detection pixels 311 each comprise a rectangular micro-lens 10 and a pair of photoelectric conversion units 13 and 14 formed as splitting two parts separated from each other via an element separation area 15 ranging along the vertical direction. The pair of photoelectric conversion units 13 and 14 combined together achieve a size equivalent to that of the photoelectric conversion unit of a regular image-capturing pixel. It is to be noted that in order to simplify the illustration, FIG. 6 does not show any color filter. In addition, it is desirable to form the pair of photoelectric conversion units 13 and 14 as close as possible to each other by minimizing the width of the element separation area 15 so as to ensure that the sum of the outputs from the pair of photoelectric conversion units 13 and 14 at a focus detection pixel 311 is equivalent to the output of the photoelectric conversion unit in a regular image-capturing pixel.

Figure 7:
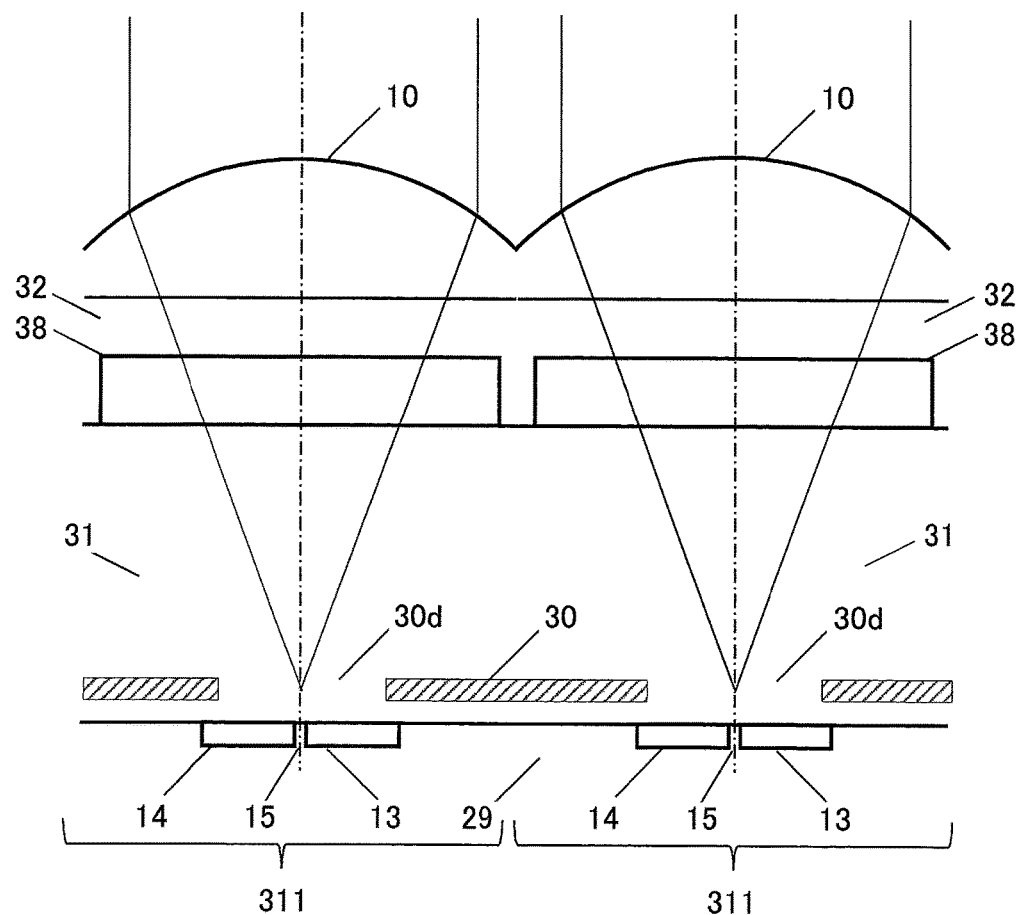

FIG. 7 shows focus detection pixels 311 structured as illustrated in FIG. 6 in a sectional view. A light-shielding mask 30 is formed above and in close proximity to the photoelectric conversion units 13 and 14, and each pair of photoelectric conversion units 13 and 14 receives light having passed through an opening 30d in the light-shielding mask 30. A leveling layer 31 is formed above the light-shielding mask 30 and above the leveling layer 31, color filters 38 are formed. A leveling layer 32 is formed above the color filters 38 and micro-lenses 10 are formed above the leveling layer 32. The shapes of the photoelectric conversion units 13 and 14, defined by the openings 30d, are projected forward via the micro-lenses 10 and thus, a pair of focus detection pupils is formed. The photoelectric conversion units 13 and 14 are formed on a semiconductor circuit substrate 29. In addition, the element separation area 15 is formed in order to separate the photoelectric conversion unit 13 from the photoelectric conversion unit 14 in each pair. The structure described above allows the photoelectric conversion units 13 and 14 to each receive a focus detection light flux in a pair of focus detection light fluxes passing through a pair of focus detection pupils in the exit pupil of the interchangeable lens.

Figure 8:
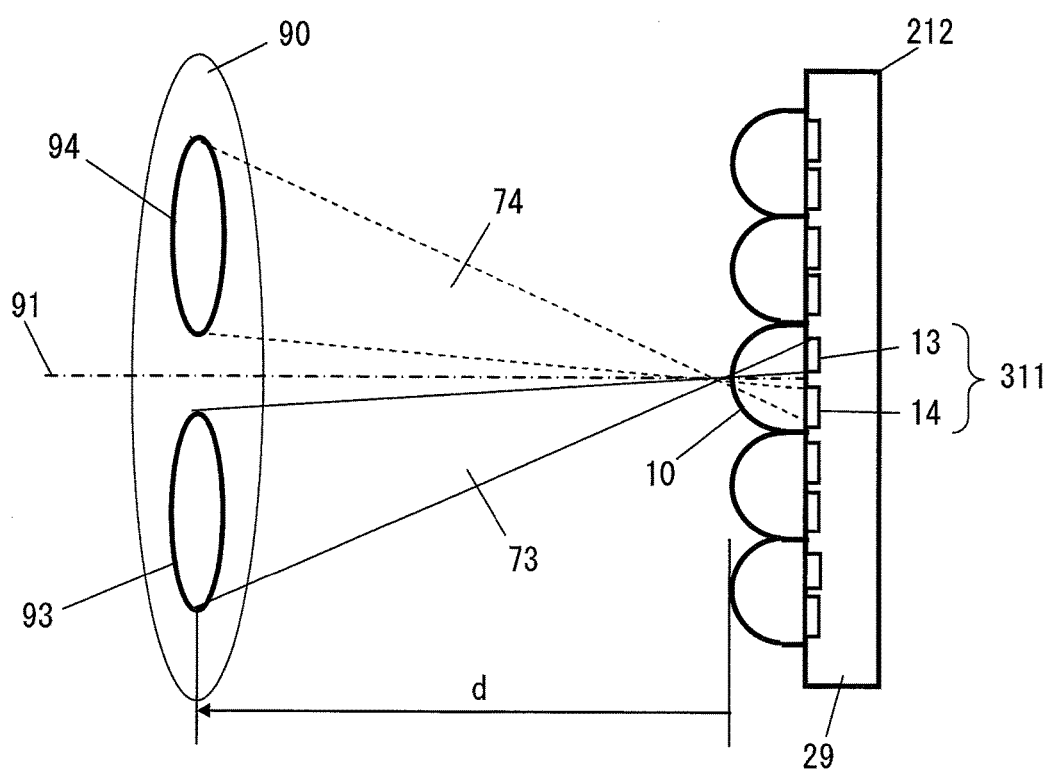
Figure 11:
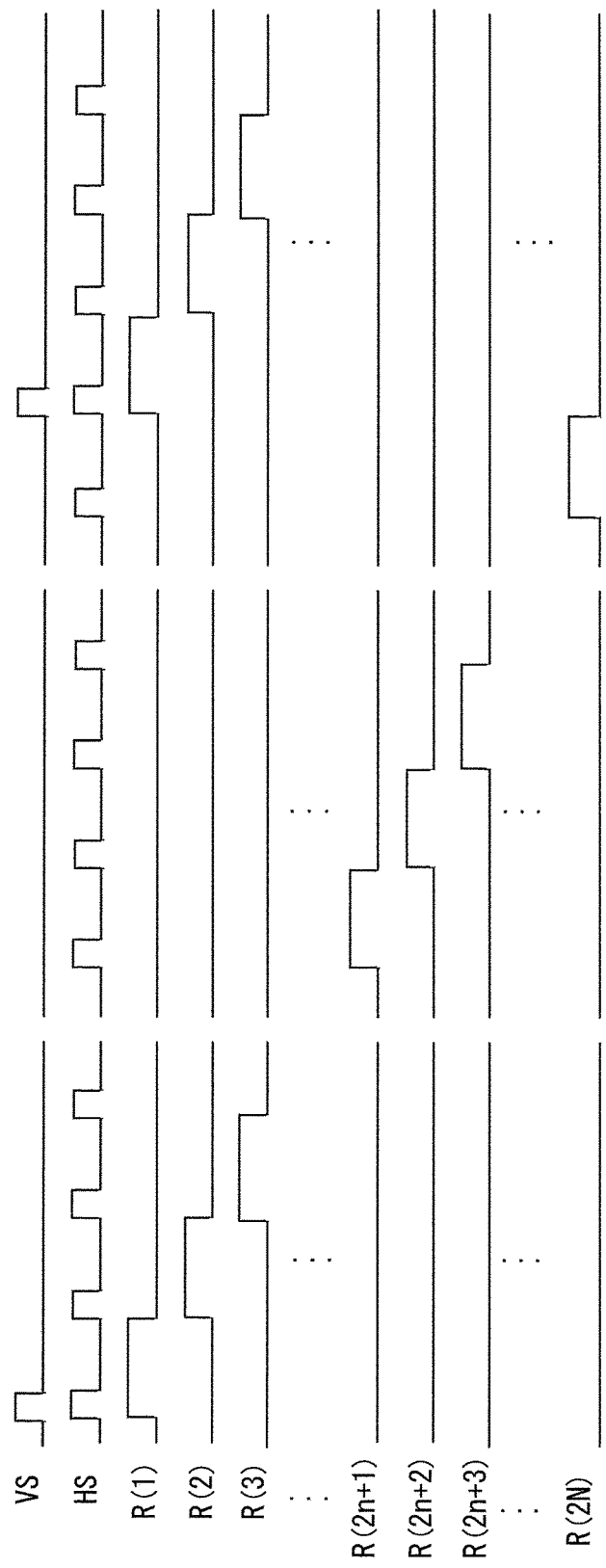

FIG. 8 shows the structure of a focus detection optical system used to detect the focusing condition via micro-lenses through the split-pupil phase detection method. It is to be noted that part of a focus detection pixel group in the focus detection area 101 is shown in an enlargement. An exit pupil 90 in FIG. 8 is set over a distance d along the frontward direction from the micro-lenses 10 disposed at the predetermined image-forming plane of the interchangeable lens 202 (see FIG. 1). The distance d is determined in correspondence to the curvature of the micro-lenses 10, the refractive index of the micro-lenses 10, the distance between the micro-lenses 10 and the photoelectric conversion units 13 and 14 and the like, and is referred to as a focus detection pupil distance in this description. FIG. 11 also shows an optical axis 91 of the interchangeable lens, micro-lenses 10, photoelectric conversion units 13 and 14, focus detection pixels 311 and focus detection light fluxes 73 and 74.

A focus detection pupil 93 is formed as a photoelectric conversion unit 13, with the light receiving area thereof defined by an opening 30d, is projected via the corresponding micro-lens 10. Likewise, a focus detection pupil 94 is formed as a photoelectric conversion unit 14, with the light receiving area thereof defined by the opening 30d, is projected via the corresponding micro-lens 10. The focus detection pupils 93 and 94 take up areas of the exit pupil 90, which are different from each other, are set side-by-side along the horizontal direction, and have shapes achieving line symmetry relative to a vertical line passing through the optical axis 91.

While FIG. 8 schematically illustrates five consecutive focus detection pixels 311 present near the photographic optical axis 91 within the focus detection area 101, the illustration simply provides an example, and the photoelectric conversion units at the other focus detection pixels 311 located toward the periphery of the image plane also receive light fluxes arriving at the respective micro-lenses from the corresponding focus detection pupils 93 and 94. Via the micro-lens 10, the pair of photoelectric conversion units 13 and 14 achieve a conjugate relation to the partial areas different from each other mentioned earlier, i.e., the pair of focus detection pupils 93 and 94.

The photoelectric conversion unit 13 in a focus detection pixel structured as described above outputs a signal corresponding to the intensity of an image formed on the micro-lens 10 of the focus detection pixel 311 with the focus detection light flux 73 having passed through the focus detection pupil 93 and having advanced toward the micro-lens 10. In addition, the photoelectric conversion unit 14 outputs a signal corresponding to the intensity of an image formed on the micro-lens 10 of the focus detection pixel 311 with the focus detection light flux 74 having passed through the focus detection pupil 94 and having advanced toward the micro-lens 10.

By integrating the outputs from the photoelectric conversion units 13 and 14 at the plurality of focus detection pixels 311 disposed side-by-side along the horizontal direction in the focus detection area 101 described above, into output groups each corresponding to one of the two focus detection pupils 93 and 94, information related to the intensity distribution of a pair of images formed on the array of focus detection pixels 311 with the focus detection light fluxes 73 and 74 passing through the focus detection pupil 93 and the focus detection pupil 94 is obtained. Image shift detection operation processing (correlation arithmetic processing, phase difference detection processing), to be detailed later, is subsequently executed by using the information thus obtained so as to detect an image shift amount representing the extent of image shift manifested by the pair of images through a method known as the split-pupil phase detection method. Then, by executing a conversion operation on the image shift amount in correspondence to the proportional relation of the focus detection pupil distance to the interval between the gravitational centers of the pair of focus detection pupils 93 and 94, the deviation (defocus amount) of the current image-forming plane (the image-forming plane at the focus detection position corresponding to the position assumed by the micro-lens array on the predetermined image-forming plane), relative to the predetermined image-forming plane, is calculated. In more specific terms, the defocus amount (i.e., the deviation of the image-forming plane relative to the predetermined image-forming plane, manifesting along the direction in which the optical axis 91 extends), is calculated by multiplying the image shift amount (indicating the extent of image shift occurring within the plane ranging perpendicular to the optical axis 91) by a specific conversion coefficient.

In addition, image signals equivalent to those provided via regular image-capturing pixels disposed in the Bayer array can be obtained in the form of output signals generated over the entire image plane and each representing the sum of the outputs from the photoelectric conversion units 13 and 14 in each focus detection pixel 311.

Figure 9:
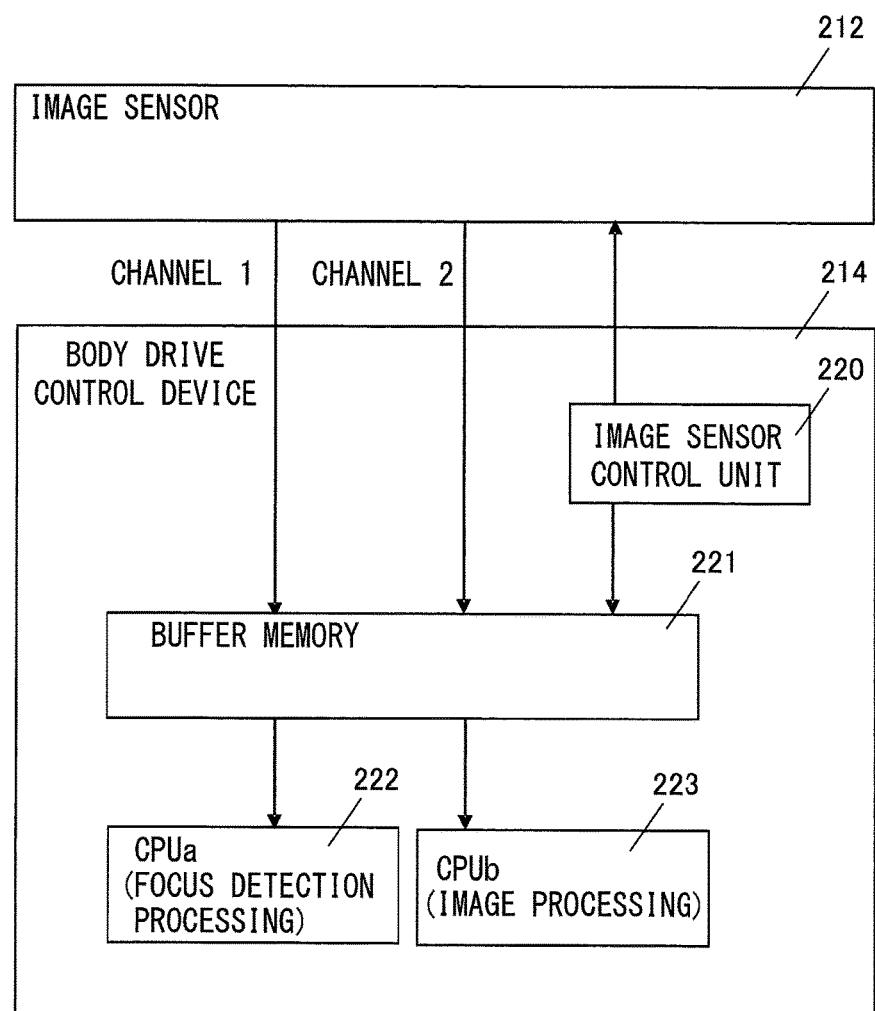

FIG. 9 is a block diagram showing in detail an aspect of the relationship between the image sensor 212 and the body drive control device 214, which is relevant to the present invention. An image sensor control unit 220, a buffer memory 221, a CPUa (microcomputer) 222 and a CPUb (microcomputer) 223 are installed in the body drive control device 214. Under control executed by the image sensor control unit 220, the image sensor 212 controls charge storage (the duration of the charge storage and the charge storage timing) at the focus detection pixels 311 and controls signal output. As will be described later, the image sensor 212 executes A/D conversion on signals output from the pairs of photoelectric conversion units 13 and 14 in focus detection pixels 311 and outputs the A/D conversion results as digital data (focus detection data) through a channel 1. At the same time, the image sensor 212 outputs digital data (signals equivalent to output signals provided from regular image-capturing pixels), generated by digitally adding together digital data obtained via the pair of photoelectric conversion units 13 and 14 in each focus detection pixel 311, through a channel 2. The digital data output through the channel 1 and the channel 2 are temporarily stored into the buffer memory 221 as digital data for a single frame. The CPUa 222 executes processing to be described later on the digital data (focus detection data) corresponding to the pairs of photoelectric conversion units 13 and 14 at the focus detection pixels 311 in the focus detection area, which have been stored in the buffer memory 221, and thus, executes focus detection. The CPUb 223 displays or records an image by executing image processing of the known art on the single frame digital data (image data) stored in the buffer memory 221.

As described above, the digital data to be used for purposes of focus detection and the digital data to undergo image processing are output from the image sensor 212 via different channels with a temporal overlap. In addition, since the focus detection digital data and the image generation digital data are processed independently of each other in the CPU 222 and the CPU 223, the need to temporally separate the focus detection processing and the image processing from each other is eliminated. In other words, they can be executed simultaneously and independently of each other.

Figure 10:
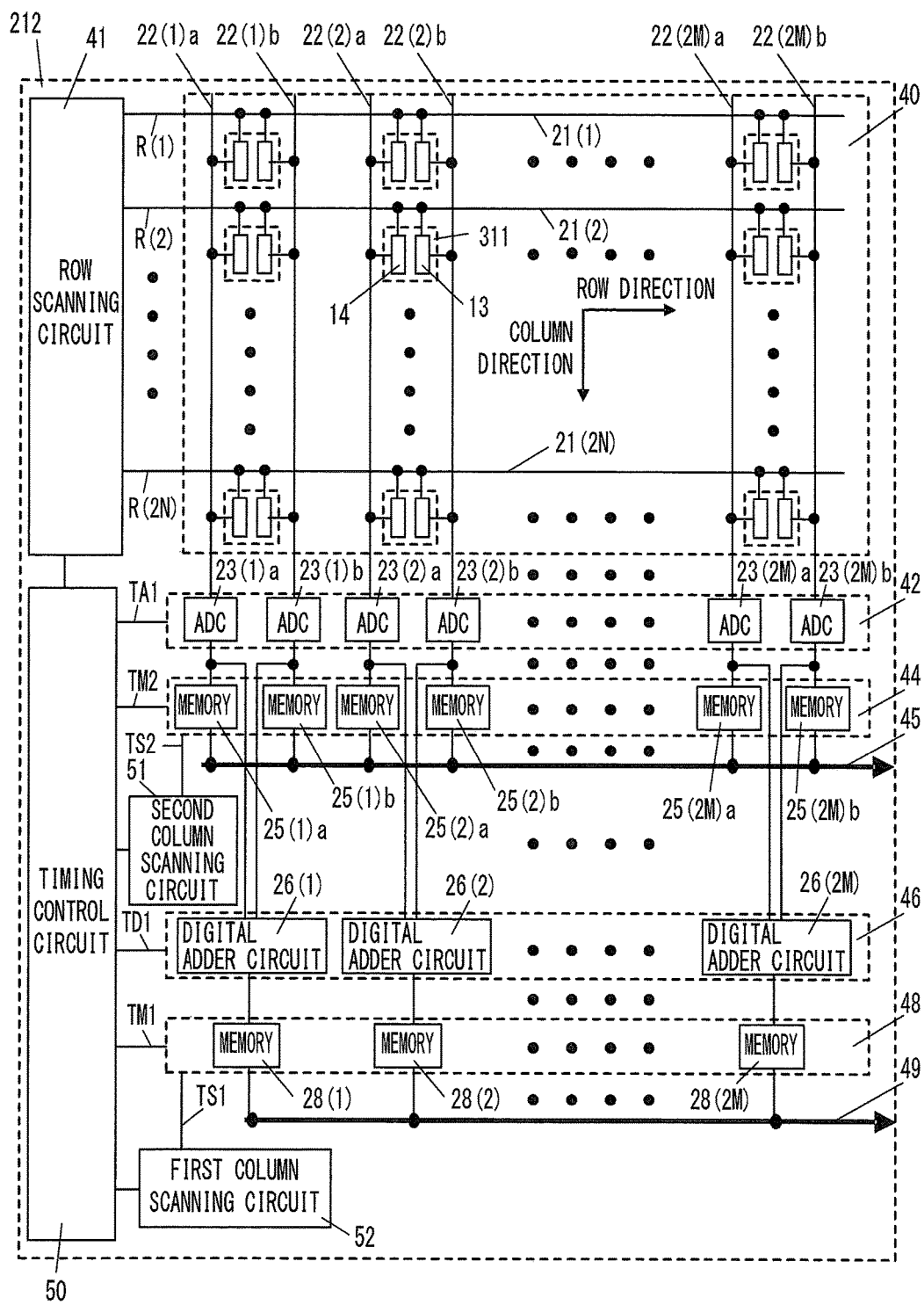

Next, in reference to FIG. 10, the structure of the image sensor 212, capable of simultaneously outputting, via the two channels, the digital data obtained via the pairs of photoelectric conversion units 13 and 14 in focus detection pixels 311 and the digital data (signals equivalent to signals output from regular image-capturing pixels) obtained by digitally adding together the digital data from the pair of photoelectric conversion units 13 and 14 in each focus detection pixel 311, will be described.

FIG. 10 is a block diagram showing the structure of the image sensor 212 (CMOS image sensor). In addition to a pixel array unit 40 achieved by disposing numerous focus detection pixels 311 each having a pair of photoelectric conversion units 13 and 14 in a two-dimensional matrix pattern, the image sensor 212 includes a row scanning circuit 41, a column A/D conversion device 42, a second line memory 44, a second column scanning circuit 51, a second horizontal output circuit 45, a column digital adder device 46, a first line memory 48, a first column scanning circuit 52, a first horizontal output circuit 49 and a timing control circuit 50.

Based upon a master clock input thereto from an external source and a control signal input thereto from the image sensor control unit 220, the timing control circuit 50 in this system configuration generates a clock signal, control signals and the like, in reference to which the row scanning circuit 41, the column A/D conversion device 42, the column digital adder device 46, the first line memory 48, the second line memory 44, the first column scanning circuit 52, the second column scanning circuit 51 and the like are engaged in operation. The timing control circuit 50 provides the clock signal, the control signals and the like thus generated to the row scanning circuit 41, the column A/D conversion device 42, the column digital adder device 46, the first line memory 48, the second line memory 44, the first column scanning circuit 52, the second column scanning circuit 51 and the like.

In addition, a drive system for the pixel array unit 40, via which drive control for the individual focus detection pixels 311 is achieved, and a signal processing system for the pixel array unit 40, i.e., the row scanning circuit 41, the column A/D conversion device 42, the column digital adder device 46, the first line memory 48, the second line memory 44, the first column scanning circuit 52, the second column scanning circuit 51, the first horizontal output circuit 49, the second horizontal output circuit 45, the timing control circuit 50 and the like, are integrated onto the chip (semiconductor substrate) on which the pixel array unit 40 is formed. Namely, the chip on which these systems are integrated is laminated on the chip on which the pixel array unit 40 is formed.

Although not shown, the focus detection pixels 311 may assume, for instance, a 3-transistor structure that includes a transfer transistor that transfers electric charges resulting from photoelectric conversion executed at the pair of photoelectric conversion units 13 and 14 (e.g., photodiodes) to an FD (floating diffusion) unit, a reset transistor that controls the potential at the FD unit and an amplifier transistor that outputs a signal corresponding to the potential at the FD unit in addition to the photoelectric conversion units 13 and 14, or a 4-transistor structure that further includes a selector transistor enabling pixel selection.

At the pixel array unit 40, focus detection pixels 311 are two-dimensionally disposed over 2N rows×2M columns. In other words, the pixel array unit 40 includes a focus detection pixel group made up with 2M focus detection pixels 311 disposed side-by-side along the horizontal direction, thus forming a row, and 2N rows of such focus detection pixel groups are set one next to another along the vertical direction running perpendicular to the horizontal direction. The focus detection pixel 311 in the upper left corner in FIG. 10 is the pixel taking up a first-row/first-column position, and a green color filter is disposed at this pixel in conformance to the Bayer array rule. Green color filters and blue color filters are disposed at the focus detection pixels forming the first-row pixel group. For this 2N row×2M column pixel array, a single row control line 21(21(1) through 21(2N)) is wired in correspondence to each row and two column signal lines ((22 (1)$a$ and 22(1)$b$ through 22(2M)$a$ and 22(2M)$b$) are wired in correspondence to each column. One end of each row control line 21 (21(1) through 21 (2N)) corresponding to a given row is connected to an output end of the row scanning circuit 41 corresponding to the particular row, and control signals R(1) through R(2N) are output to the respective row control lines 21. The row scanning circuit 41, configured with, for instance, a shift register, controls row addresses and row scanning in the pixel array unit 40 via the row control lines 21(21(1) through 21(2N)).

The pairs of photoelectric conversion units 13 and 14 in the various focus detection pixels 311 in a given row are connected to the row scanning circuit 41 through the common row control line 21. In response to a control signal among the control signals R(1), . . . R(L), . . . R(2N), charge storage control and signal read control for the corresponding row are executed simultaneously. One of the pair of photoelectric conversion units 13 and 14, i.e., the photoelectric conversion unit 13 in each focus detection pixel 311 is connected to one of the two column signal lines, i.e., the column signal line 22($m$)$b$, installed for the corresponding column. The output signal (analog signal) from the photoelectric conversion unit 13 is output to the column signal line 22($m$)$b$. The other photoelectric conversion unit 14 in the pair of photoelectric conversion units 13 and 14 in the focus detection pixel 311 is connected to the other column signal line 22($m$)$a$ of the two column signal lines installed in correspondence to the particular column. The output signal (analog signal) from the photoelectric conversion unit 14 is output to the column signal line 22($m$)$a$. For instance, assuming that the focus detection pixels 311 forming the focus detection pixel group in the Lth row in the pixel array unit 40 are selected by the control signal R(L) provided from the row scanning circuit 41, the output signals from the pairs of photoelectric conversion units 13 and 14 in the focus detection pixels 311 in the Lth row are output to the column signal lines (22(1)$a$ and 22(1)$b$ through 22(2M)$a$ and 22(2M)$b$).

The column A/D conversion device 42 includes ADC (analog-digital conversion) circuits 23(1)$a$ and 23(1)$b$ through 23(2M)$a$ and 23(2M)$b$ respectively disposed in correspondence to the column signal lines 22(1)$a$ and 22(1)$b$ through 22(2M)$a$ and 22(2M)$b$, which are installed in correspondence to the individual pixel columns in the pixel array unit 40. In response to a control signal TA1 provided from the timing control circuit 50, the column A/D conversion device 42 converts the pairs of analog signals output from the focus detection pixels 311 in the pixel array unit 40 in correspondence to the individual column positions, to H-bit digital signals and outputs the digital signals resulting from the conversion. "H bits", indicates a specific number of bits, which may be, for instance, 10 bits, 12 bits or 14 bits.

The second line memory 44 includes memories ((25(1)$a$ and 25(1)$b$ through 25(2M)$a$ and 25(2M)$b$) respectively installed in correspondence to the individual ADCs ((23(1)$a$ and 23(1)$b$ through 23(2M)$a$ and 23(2M)$b$) configuring the column A/D conversion device 42. In response to a control signal TM2 provided from the timing control circuit 50, the digital signals output in from the individual ADCs ((23(1)$a$ and 23(1)$b$ through 23(2M)$a$ and 23(2M)$b$) are stored as H-bit digital signals in the second line memory 44. In the various memories ((25(1)$a$ and 25(1)$b$ through 25(2M)$a$ and 25(2M)$b$) in the second line memory 44, the output signals from the pairs of photoelectric conversion units 13 and 14 in the single row of focus detection pixels are stored as digital signals.

The column digital adder device 46 includes digital adder circuits (26(1) through 26(2M)) each installed in correspondence to a pair of ADCs among the pairs of ADCs (23(1)$a$ and 23(1)$b$ through 23(2M)$a$ and 23(2M)$b$) configuring the column A/D conversion device 42. In response to a control signal TD1 provided from the timing control circuit 50, the column digital adder device 46 adds together the digital signals output from each pair of ADCs (among 23(1)$a$ and 23(1)$b$ through 23(2M)$a$ and 23(2M)$b$) and outputs the resulting signal as an H-bit digital sum signal.

The first line memory 48 includes memories (28(1) through 28(2M)) respectively installed in correspondence to the digital adder circuits (26(1) through 26(2M)) configuring the column digital adder device 46. In response to a control signal TM1 provided from the timing control circuit 50, the digital sum signals each output from one of the digital adder circuits (26(1) through 26(2M)) are stored into the first line memory 48 as H-bit digital signals. Through this operation, sum signals (equivalent to output signals provided from image-capturing pixels), each obtained by adding together the output signals from the pair of photoelectric conversion units 13 and 14 in each focus detection pixel among the focus detection pixels in a single row, are stored as digital signals in the individual memories (28(1) through 28(2M)) in the first line memory 48.

The second column scanning circuit 51, constituted with, for instance, a shift register, controls the column addresses and column scanning for the memories (25(1)$a$ and 25(1)$b$ through 25(2M)$a$ and 25(2M)$b$) in the second line memory 44 under control executed by the timing control circuit 50. The second line memory 44 is engaged in operation in response to a scan signal TS2 provided from the second column scanning circuit 51. The H-bit digital signals each stored in one of the memories (25(1)a and 25(1)b through 25(2M)a and 25(2M)b) are read out in sequence into the second horizontal output circuit 45, and subsequently are serially output to an external recipient as output signals (digital signals) provided via the pairs of photoelectric conversion units 13 and 14 to be used for purposes of focus detection via the second horizontal output circuit 45.

The first column scanning circuit 52, constituted with, for instance, a shift register, controls column addresses and column scanning for the memories (28(1) through 28(2M)) in the first line memory 48 under control executed by the timing control circuit 50. The first line memory 48 is engaged in operation in response to a scan signal TS1 provided from the first column scanning circuit 52. The H-bit digital sum signals each stored in one of the memories (28(1) through 28(2M)) are read out in sequence into the first horizontal output circuit 49, and subsequently are serially output via the first horizontal output circuit 49 to an external recipient as output signals (digital signals) equivalent to output signals provided from image-capturing pixels.

Figure 12:
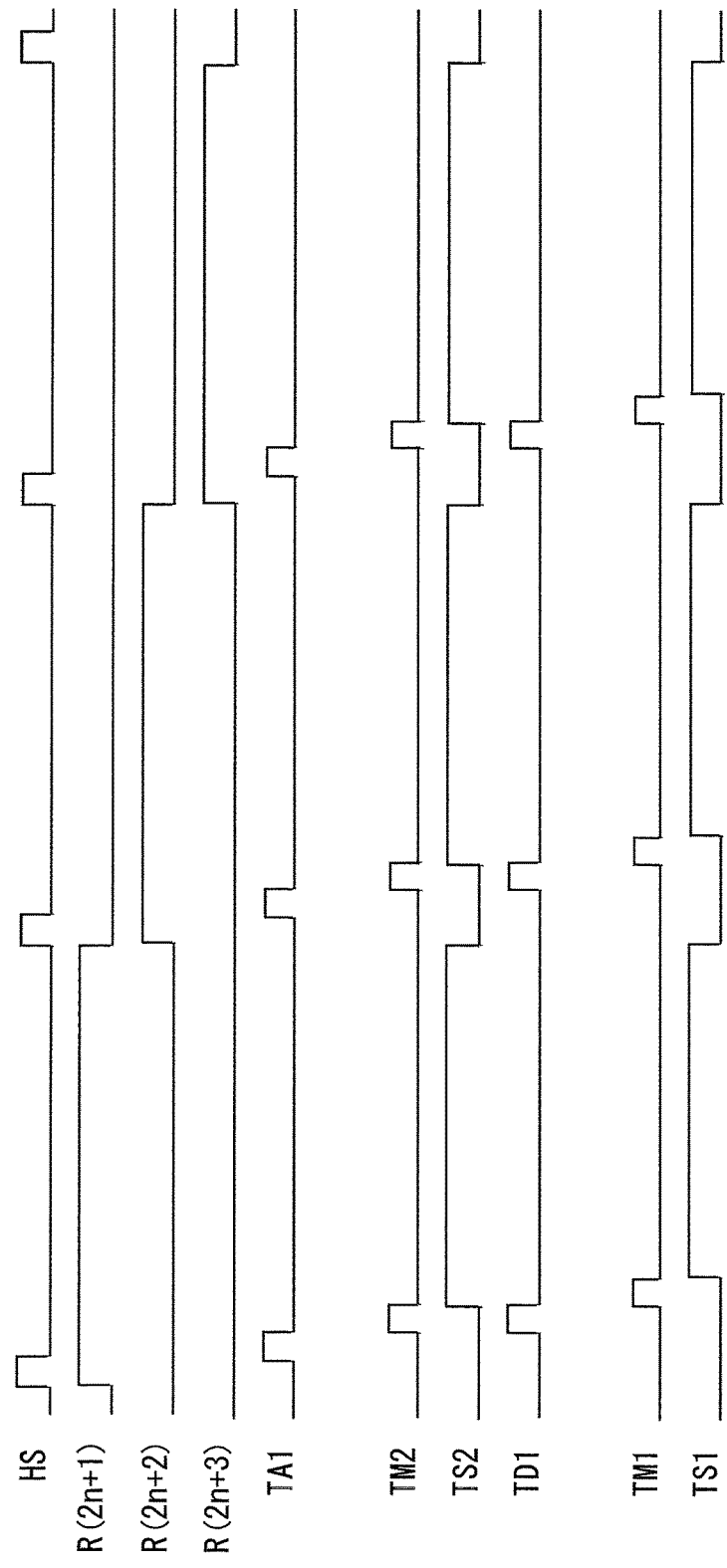

Next, in reference to the timing charts presented in FIG. 11 and FIG. 12, individual read operation for individually reading out the output signals from pairs of photoelectric conversion units in focus detection pixels and read operation for reading out the sum signals each obtained by adding together the output signals from the pair of photoelectric conversion units in each focus detection pixel, executed concurrently during a single frame period in the image sensor structured as shown in FIG. 10, will be explained. VS and HS in FIG. 11 and FIG. 12 respectively indicate a vertical synchronous signal representing the single frame period and a horizontal synchronous signal representing a single horizontal scan period.

In the operational procedure shown in FIG. 11, control signals R(1), R(2), R(3) through R(2n+1), R(2n+2), R(2n+3) through R(N) are issued sequentially from the row scanning circuit 41 to the pixel array unit 40 in synchronization with the horizontal synchronous signal HS. The analog signals from the pairs of photoelectric conversion units 13 and 14 in the focus detection pixels 311 for a single line disposed at a row corresponding to one of the control signals R(1), R(2), R(3) through R(2n+1), R(2n+2), R(2n+3) through R(N), are sequentially output to the column signal lines (22(1)a and 22(1)b through 22(2M)a and 22(2M)b).

FIG. 12 provides an enlarged view of the operation executed in relation to the (2n+1)th row, the (2n+2)th row and the (2n+3)th row in FIG. 11. As the (2n+1)th row in the pixel array unit 40 is selected by the control signal R(2n+1), the analog signals from the pairs of photoelectric conversion units 13 and 14 in the focus detection pixels 311 for a single line, disposed at the (2n+1)th row, are output to the column signal lines (22(1)a and 22(1)b through 22(2M)a and 22(2M)b). In response to the control signal TA1, the analog signals from the pairs of photoelectric conversion units 13 and 14 in the focus detection pixels 311 for the single line disposed at the (2n+1)th row, having been output to the column signal lines (22(1)a and 22(1)b through 22(2M)a and 22(2M)b) are respectively converted to digital signals via the ADCs (23(1)a and 23(1)b through 23(2M)a and 23(2M)b) in the column A/D conversion device 42 connected to the column signal lines (22(1)a and 22(1)b through 22(2M)a and 22(2M)b).

In response to the control signal TM2, the digital signals corresponding to the pairs of photoelectric conversion units 13 and 14 in the focus detection pixels 311 for the single line disposed at the (2n+1)th row resulting from the digital conversion are stored into the memories (25(1)a and 25(1)b through 25(2M)a and 25(2M)b) respectively in the second line memory 44 connected to the ADCs (23(1)a and 23(1)b through 23(2M)a and 23(2M)b) in the column A/D conversion device 42.

Concurrently as the digital signals are stored into the second line memory 44, the digital signals resulting from the digital conversion having been executed in correspondence to the pairs of photoelectric conversion units 13 and 14 in the focus detection pixels 311 for the single line are added together, in response to the control signal TD1. The digital signals corresponding to the pair of photoelectric conversion units 13 and 14 in each of the focus detection pixels 311 disposed at the (2n+1)th row are added together via one of the digital adder circuits (26(1) through 26(2M)) in the column digital adder device 46, each installed in correspondence to a specific pair of ADCs among the pairs of ADCs (23(1)a and 23(1)b through 23(2M)a and 23(2M)b) configuring the column A/D conversion device 42.

In response to the control signal TM1, the digital sum signals corresponding to the focus detection pixels 311 for the single line disposed at the (2n+1)th row, each obtained by adding together the output signals from a pair of photoelectric conversion units 13 and 14, are stored into the memories (28(1) through 28(2M)) in the first line memory 48 connected to the digital adder circuits (26(1) through 26(2M)) respectively in the column digital adder device 46.

The digital signals corresponding to the pairs of photoelectric conversion units 13 and 14 in the focus detection pixels 311 for the single line disposed at the (2n+1)th row, having been stored into the memories (25(1)a and 25(1)b through 25(2M)a and 25(2M)b) in the second line memory 44, are provided, in response to the scan signal TS2, in sequence through a serial output to an external recipient via the second horizontal output circuit 45 during the period of time elapsing until the next horizontal synchronous signal HS is generated. Based upon the digital signal output from the second horizontal output circuit 45, the focus detection CPUa 222 in the body drive control device 214 detects the focusing condition at the interchangeable lens 202 (optical system) and adjusts the focusing condition as will be described later in reference to FIG. 13.

Likewise, the digital sum signals corresponding to the focus detection pixels 311 for the single line disposed at the (2n+1)th row, each obtained by adding together the output signals from a pair of photoelectric conversion units 13 and 14, having been stored into the memories (28(1) through 28(2M)) in the first line memory 48, are provided in response to the scan signal TS1, in sequence through a serial output to an external recipient via the first horizontal output circuit 49 during the period of time elapsing until the next horizontal synchronous signal HS is generated. Based upon the digital sum signals output from the first horizontal output circuit 49, the image processing CPUb 223 generates image data as will be described later in reference to FIG. 14.

As the control signal R(2n+2) is issued in synchronization with the next horizontal synchronous signal HS and the (2n+2)th row in the pixel array unit 40 is thus selected, processing is executed for the analog signals from the pairs of photoelectric conversion units 13 and 14 in the focus detection pixels 311 for a single line disposed at the (2n+2)th row by following a similar operational procedure. Similar processing will be repeatedly executed in response to the control signal R(2n+3) issued in synchronization with the subsequent horizontal synchronous signal HS, as well.

Figure 13:
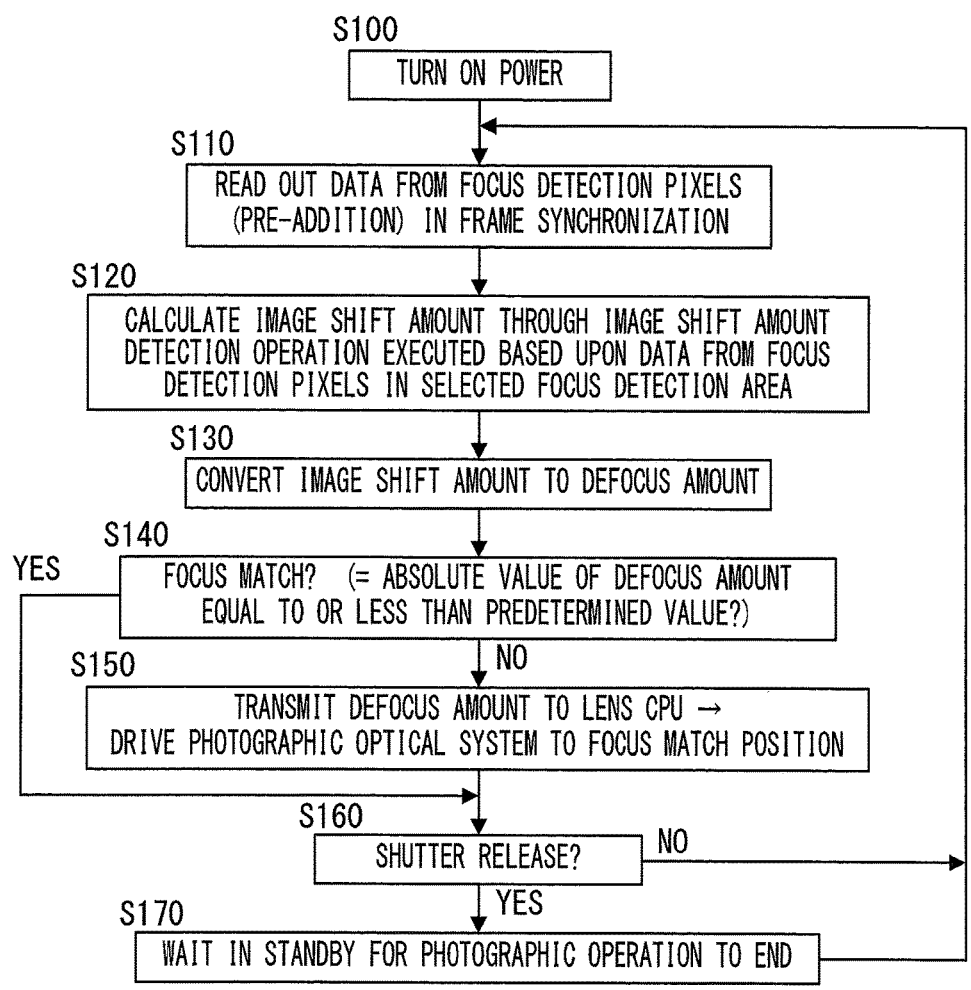
Figure 14:
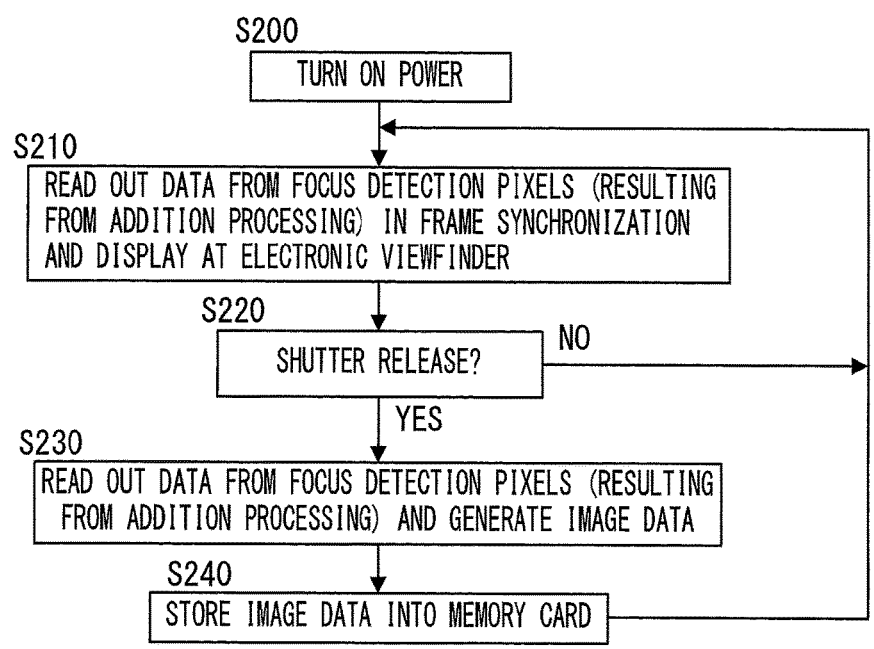

FIG. 13 and FIG. 14 present flowcharts of operations executed in the digital still camera (image-capturing device) 201 achieved in the first embodiment. Processing operations are executed concurrently as indicated in the flowcharts. FIG. 13 presents a flowchart of the operation executed by the focus detection CPUa 222 in the body drive control device 214. As power to the digital still camera 201 is turned on in step S100, the body drive control device 214 starts execution of the focus detection operation in step S110 and subsequent steps. In step S110, the body drive control device 214 reads out, in frame synchronization, a pair of sets of data provided via the pairs of photoelectric conversion units in the focus detection pixels disposed within the focus detection area having been selected. The pair of sets of data from the pairs of photoelectric conversion units are constituted with the digital signals output through the second horizontal output circuit 45, as has been explained earlier. In the following step S120, the body drive control device 214 calculates an image shift amount through image shift detection operation processing (correlation arithmetic processing, phase difference detection processing) to be detailed later based upon the data from the focus detection pixels. It is to be noted that the position of the focus detection area have been selected in advance by the photographer via an operation member (not shown).

In step S130, the body drive control device 214 converts the image shift amount to a defocus amount.

In step S140, the body drive control device 214 makes a decision as to whether or not the current focusing condition at the interchangeable lens 202 (optical system) is close to the focus match state, i.e., whether or not the absolute value of the defocus amount having been calculated is equal to or less than a predetermined value. If it is decided that the current condition is not close to the focus match state, the processing proceeds to step S150, in which the body drive control device 214 transmits the defocus amount to the lens drive control device 206 so as to drive the focusing lens 210 in the interchangeable lens 202 (optical system) to the focus match position and thus adjust the focusing condition at the interchangeable lens 202.

It is to be noted that the operation also branches to this step if focus detection cannot be executed. In this case, the body drive control device 214 transmits a scan-drive instruction to the lens drive control device 206 so as to scan-drive the focusing lens 210 in the interchangeable lens 202 over the range between infinity and maximum close-up. The operation then proceeds to step S160.

If, on the other hand, it is decided in step S140 that the current condition is close to the focus match state, the processing proceeds to step S160 in which the body drive control device 214 makes a decision as to whether or not a shutter release has occurred in response to an operation at a shutter release button (not shown). If it is decided that a shutter release has not occurred, the processing returns to step S110 to repeatedly execute the operation described above. If it is decided that a shutter release has occurred, the processing proceeds to step S170 in which the body drive control device 214 waits in standby for the photographing operation, executed in response to the shutter release, to end, and once the photographing operation ends, the processing returns to step S110 to repeatedly execute the operation described above.

The image shift detection operation processing (correlation arithmetic processing, phase difference detection processing) executed in step S120 and step S130 in FIG. 13 will be described in detail. It is to be noted that the pair of sets of data from the focus detection pixels 311 are obtained discriminately in correspondence to each of the colors in the Bayer array.

Since the focus detection pupils 93 and 94 may be vignetted by the aperture opening at the lens, a perfect balance may not be achieved with regard to the amounts of light in the pair of images detected via the focus detection pixels 311. Accordingly, the body drive control device 214 executes a specific type of correlation operation that allows a desired level of image shift detection accuracy to be maintained in spite of the imbalance in the amounts of light. The correlation operation is executed on a pair of data strings $A1_n$ ($A1_1, \ldots, A1_j$: j represents the number of sets of data) and $A2_n$ ($A2_1, \ldots, A2_j$) read out from the group of focus detection pixels 311, as expressed in standardized correlation operation expression (1) of the known art, applicable in relation to any color, disclosed in Japanese Laid Open Patent Publication No. 2007-333720, so as to calculate a correlation quantity C(k).

$$C(k)=\Sigma|A1_n \cdot A2_{n+1+k}-A2_{n+k} \cdot A1_{n+1}| \qquad (1)$$

In expression (1), the $\Sigma$ operation is cumulatively executed with regard to n. The range assumed for n is limited to the range over which the data $A1_n$, $A1_{n+1}$, $A2_{n+k}$ and $A2_{n+1+k}$ exist in correspondence to the image shift amount k. The shift amount k is an integer that represents a relative shift amount assuming a value taken in units matching the data interval with which the data in the data strings are sampled. The results of the arithmetic operation executed as expressed in (1) indicate a minimum value for the correlation quantity C(k) at the shift amount at which the pair of sets of data achieve a high level of correlation (when k=kj=2 in FIG. 15(a)), as shown in FIG. 15(a). Namely, the correlation quantity C(k) taking a smaller value indicates a higher level of correlation.

Next, the body drive control device 214 determines the shift amount X, which gives the smallest value C(X) in the continuous correlation quantity graph, by adopting a three-point interpolation method expressed in (2) through (5) below.

$$X=kj+D/SLOP \qquad (2)$$

$$C(X)=C(kj)-|D| \qquad (3)$$

$$D=\{C(kj-1)-C(kj+1)\}/2 \qquad (4)$$

$$SLOP=MAX\{C(kj+1)-C(kj),C(kj-1)-C(kj)\} \qquad (5)$$

The judgment as to whether or not the shift amount X calculated as expressed in (2) is reliable is made as follows. As shown in FIG. 15(b), the interpolated minimal value C(X) of the correlation quantity increases when the level of correlation between the pair of sets of data is low. Accordingly, if C(X) is equal to or greater than a predetermined threshold value, the body drive control device 214 judges that the shift amount is less reliable and cancels the calculated shift amount X. Alternatively, C(X) may be standardized with regard to the data contrast, and in such a case, if the value obtained by dividing C(X) by SLOP indicating a value in proportion to the contrast is equal to or greater than a predetermined value, the body drive control device 214 judges the calculated shift amount to be not reliable and accordingly, cancels the calculated shift amount X. As a further alternative, if SLOP indicating the value in proportion to the contrast is equal to or less than a predetermined value, the subject should be judged to be a low-contrast subject, and accordingly, the body drive control device 214 judges the reliability of the calculated shift amount to be low and cancels the calculated shift amount X.

If the level of correlation between the pair of sets of data is low and the correlation quantity C(X) does not dip at all over the shift range $k_{min}$ to $k_{max}$, as shown in FIG. 15(c), the minimal value C(X) cannot be determined. In this case, it is decided that focus detection cannot be executed.

Once the shift amount X, having been calculated, is determined to be reliable, it is converted to an image shift amount shft as expressed in (6) below.

$$shft = PY \cdot X \quad (6)$$

PY in expression (6) takes a value twice the pixel pitch with which the focus detection pixels 311 are disposed (i.e., the pixel pitch with which same-color focus detection pixels are disposed).

The body drive control device 214 converts the image shift amount shft calculated as expressed in (6) to a defocus amount def by multiplying the image shift amount by a predetermined conversion coefficient k.

$$def = k \cdot shft1 \quad (7)$$

The conversion coefficient k in expression (7) takes a value set in correspondence to the proportional relation of the gravitational center interval between the gravitational centers of the pair of focus detection pupils 93 and 94 to the focus detection pupil distance, which changes in correspondence to the aperture F-number at the optical system.

Once three defocus amounts are calculated, each in correspondence to one of the three colors assumed in the Bayer array, as described above, a final defocus amount is calculated for the selected focus detection area through averaging processing such as simple averaging or weighted averaging.

FIG. 14 presents a flowchart of the operation executed by the image processing CPUb 223 in the body drive control device 214. As power to the digital still camera 201 is turned on in step S200, execution of the image processing operation in step S210 and subsequent steps starts. In step S210, the CPUb 223 reads out, in frame synchronization, digital sum data (equivalent to data provided by image-capturing pixels), obtained by adding together the data output from the pairs of photoelectric conversion units in the focus detection pixels, executes image processing on the data so as to generate a display image and brings up an image display at the electronic viewfinder. The digital sum data read out in step S210 are constituted with the digital sum signals output from the first horizontal output circuit 49 as explained earlier.

In step S220, the CPUb 223 makes a decision as to whether or not a shutter release has occurred in response to an operation of the shutter release button (not shown). If it is decided that a shutter release has not occurred, the processing returns to step S210 to repeatedly execute the operation described above. If, on the other hand, it is decided that a shutter release has occurred, the processing proceeds to step S230, in which the CPUb 223 executes a photographing operation in response to the shutter release. The CPUb 223 first transmits an aperture adjustment instruction to the lens drive control device 206 so as to set the aperture number at the interchangeable lens 202 to a control F-number (an F-number selected by the photographer or an automatically set F-number). Once the aperture control is completed, the CPUb 223 reads out the digital sum data (equivalent to data from image-capturing pixels disposed in the Bayer array), obtained by adding together the output data from the pairs of photoelectric conversion units in the focus detection pixels. The CPUb 223 generates image data through image processing of the known art (de-mosaic processing, noise processing, gradation processing, white balance processing and the like) executed on the digital sum data, and stores the image data into the memory card in step S240. Once the sequence of the photographing operation is completed, the processing returns to step S210 to repeatedly execute the operation described above.

In the first embodiment described above, focus detection is executed for the selected focus detection area only. However, since the focus detection data for the entire image plane are stored in the buffer memory, focus detection may be executed in correspondence to a plurality of focus detection areas set anywhere on the image plane and the focusing condition at the lens may be adjusted based upon the results of such focus detection, provided that the focus detection CPUa 222, assures a high level of processing performance.

In the first embodiment described above, the data obtained by adding together the data output from the pairs of photoelectric conversion units in the focus detection pixels are read in their entirety for purposes of image generation in correspondence to each frame. However, a circuit system enabling culled read (from selected rows or columns) and pixel sum read (from selected rows or columns), instead of the entire data read, may be added to the configuration described above and image data obtained through such read may be used for purposes of image display or the like.

In the first embodiment described above, the data from the pairs of photoelectric conversion units in all the focus detection pixels used for purposes of focus detection are read out in correspondence to each frame. However, the load of reading out the data from the pairs of photoelectric conversion units in all the focus detection pixels is significant and furthermore, a considerable memory capacity needs to be assured in order to accommodate storage of such data. For this reason, data may be read out as necessary through a frame cull read (data are read out for a single frame out of several frames), through a row cull read (data are read out from one row out of several rows), through a partial row read (data are read out from only some rows), through a column cull read (data are read out from one column out of several columns) or through a partial column read (data are read out from only some columns).

Figure 16:
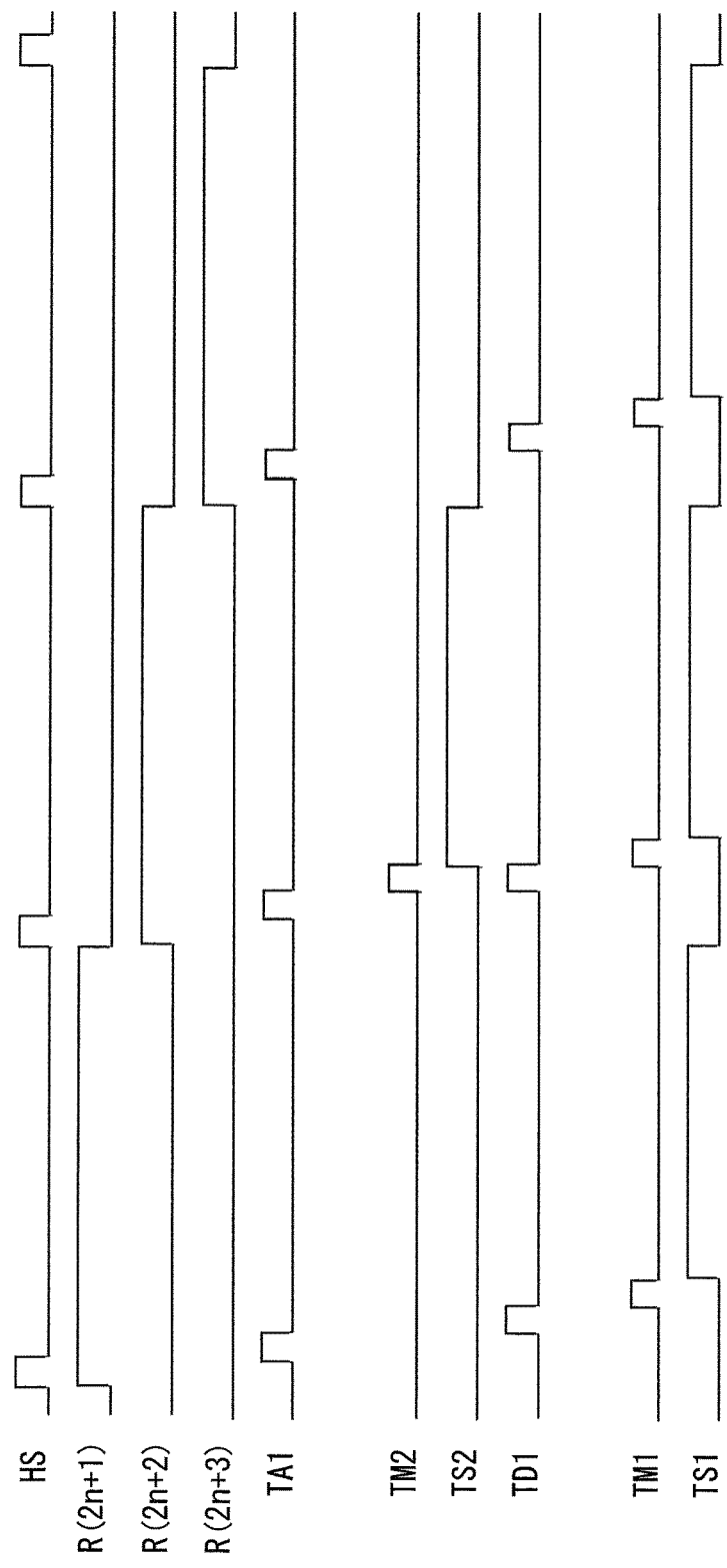

In the timing chart presented in FIG. 16, which corresponds to FIG. 12, the operation executed in relation to the (2n+1)th row, the (2n+2)th row and the (2n+3)th row in FIG. 11 for a partial row read (the data from the pairs of photoelectric conversion units in the focus detection pixels in the (2n+2)th row alone are read out) is illustrated in an enlargement.

An operation identical to that in FIG. 12 is executed when the (2n+2)th row in the pixel array unit 40 is selected by the control signal R(2n+2). However, if a row other than the (2n+2)th row is selected (in the operation executed in response to the control signal R(2n+1) or the control signal R(2n+3) in FIG. 16), no control signal TM is generated. In such a case, the digital signals from the pairs of photoelectric conversion units 13 and 14 in the focus detection pixels 311 for a single line, resulting from the digital conversion executed at the ADCs ((23(1)a and 23(1)b through 23(2M)a and 23(2M)b) in the column A/D conversion device 42 are not stored into the memories (25(1)a and 25(1)b through 25(2M)a and 25(2M)b) in the second line memory 44 connected to the ADCs ((23(1)a and 23(1)b through 23(2M)a and 23(2M)b) in the column A/D conversion device 42. In addition, since no scan signal TS2 is generated either, data are not sequentially provided through a serial output to the external recipient from the second horizontal output circuit 45 during the period of time elapsing until the next horizontal synchronous signal HS is generated.

Rows selected for a partial row read or columns selected for a partial column read can be adjusted based upon information transmitted from the body drive control device 214 to the image sensor 212 in correspondence to the position of the selected focus detection area.

The first embodiment described above includes the column A/D conversion device 42, which includes ADCs installed therein in a quantity corresponding to the number of photoelectric conversion units provided in pairs in the focus detection pixels forming each row. In addition, the structure achieved in the first embodiment includes the column digital adder device 46, which includes digital adder circuits 26, that digitally adds together digital output signals from the pairs of ADCs, installed therein in a quantity matching the number of focus detection pixels forming each row. This configuration enables concurrent execution of the individual read operations for individually reading out the output signals from the pairs of photoelectric conversion units in the focus detection pixels and read operations for reading out the sum signals (equivalent to signals output from image-capturing pixels) each obtained by adding together the output signals from a pair of photoelectric conversion units during a single frame readout period. As a result, the problem of the related art, i.e., the need to provide an analog adder device in correspondence to each focus detection pixel, is eliminated. Namely, the problem of the related art that the individual read operations for individually reading out the output signals from the pairs of photoelectric conversion units in the focus detection pixels and the read operations for reading out the sum signals (equivalent to output signals from image-capturing pixels) each obtained by adding together the output signals from a pair of photoelectric conversion units cannot be executed concurrently during a single frame period is overcome in the image sensor achieved in the embodiment.

The issue in the related art may conceivably be addressed by individually reading out the output data from the pairs of photoelectric conversion units in all the focus detection pixels at the image sensor during a single frame period, storing the output data thus read out into an external buffer memory and executing addition processing on the output data from the pairs of photoelectric conversion units having been stored in the buffer memory. However, this alternative is bound to increase the processing time for the length of time required for the addition processing and also increase the external processing load as well. The structure adopted in the image sensor achieved in the embodiment and the operations executed therein make it possible to handle the image data read and the image processing in much the same way as in a standard image sensor. In addition, the image sensor achieved in the present invention allows only some of the output data from the pairs of photoelectric conversion units in the focus detection pixels to be individually read out, and in such a case, the load of read processing can be reduced and furthermore, the buffer memory space allocated for data storage can be reduced as well.

The problem of the related art may also be addressed by adopting a structure that includes an alternative to the column digital adder device 46. For instance, the output data from the pairs of photoelectric conversion units in the focus detection pixels may be horizontally scanned to provide, in sequence, a serial output via a data holding memory (in which data are held with a delay matching the length of time required for output of a single set of data), and a digital data adder circuit, both disposed in parallel to the output end of the second horizontal output circuit 45, so as to generate sum data by adding together the output data from the pair of photoelectric conversion units in a focus detection pixel and output the sum data thus generated in synchronization with the output of each individual set of data. However, the data transfer rate will be lowered by an extent matching the length of time required for the addition processing (the length of time required for addition processing executed in correspondence to each focus detection pixel×the total number of focus detection pixels) and thus, high speed data read will not be possible. In the image sensor 212 achieved in the embodiment, which includes the column digital adder device 46, the addition processing is executed simultaneously in correspondence to the individual columns independently of one another, and thus, high speed read at a data transfer rate substantially matching that achieved at an image sensor constituted with regular image-capturing pixels alone is enabled.

Second Embodiment

Figure 17:
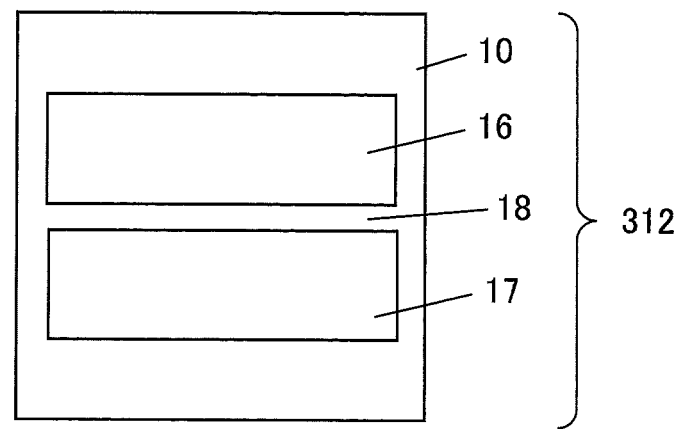

The pair of photoelectric conversion units 13 and 14 in each focus detection pixel 311 are set side-by-side along the horizontal direction (row direction) in the first embodiment. However, the pair of photoelectric conversion units in the focus detection pixel may be disposed side-by-side along a direction other than the horizontal direction (row direction) so as to detect an image shift manifesting along a direction other than the horizontal direction. FIG. 17 shows a focus detection pixel 312 having a structure achieved by rotating the focus detection pixel 311 in FIG. 6 by 90°. The focus detection pixels 312 each comprise a rectangular micro-lens 10 and a pair of photoelectric conversion units 16 and 17 formed with two parts separated from each other via an element separation area 18 ranging along the horizontal direction. The pair of photoelectric conversion units 16 and 17 combined together achieve a size equivalent to that of the photoelectric conversion unit of a regular image-capturing pixel.

Figure 18:
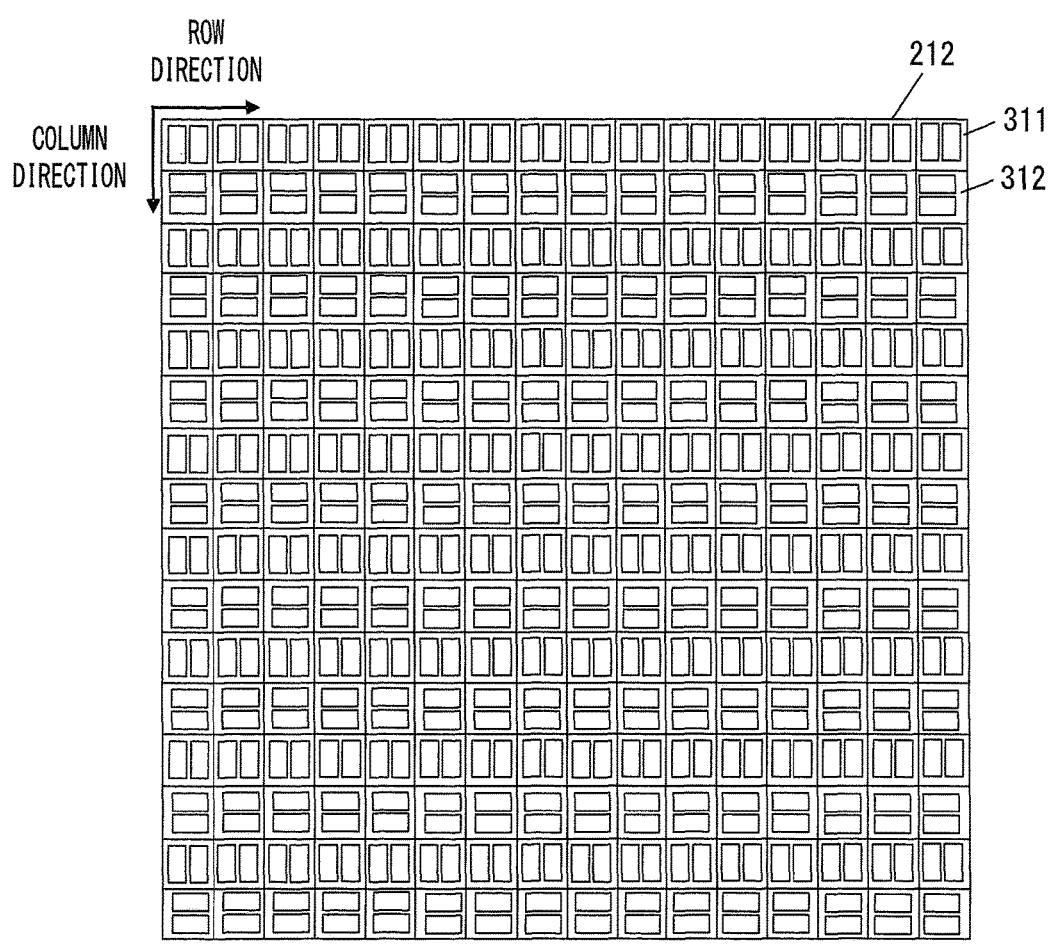

FIG. 18, presenting a pixel layout diagram (with a filter array matching that in FIG. 4), that corresponds to the pixel layout diagram in FIG. 3, shows in detail the structure of an image sensor 212 having focus detection pixels 311 and focus detection pixels 312 disposed thereat in a front view. FIG. 18 shows an area near the focus detection area 101 at the image sensor 212 in an enlarged view. The focus detection pixels 311 and the focus detection pixels 312 are disposed in alternate rows.

Figure 19:
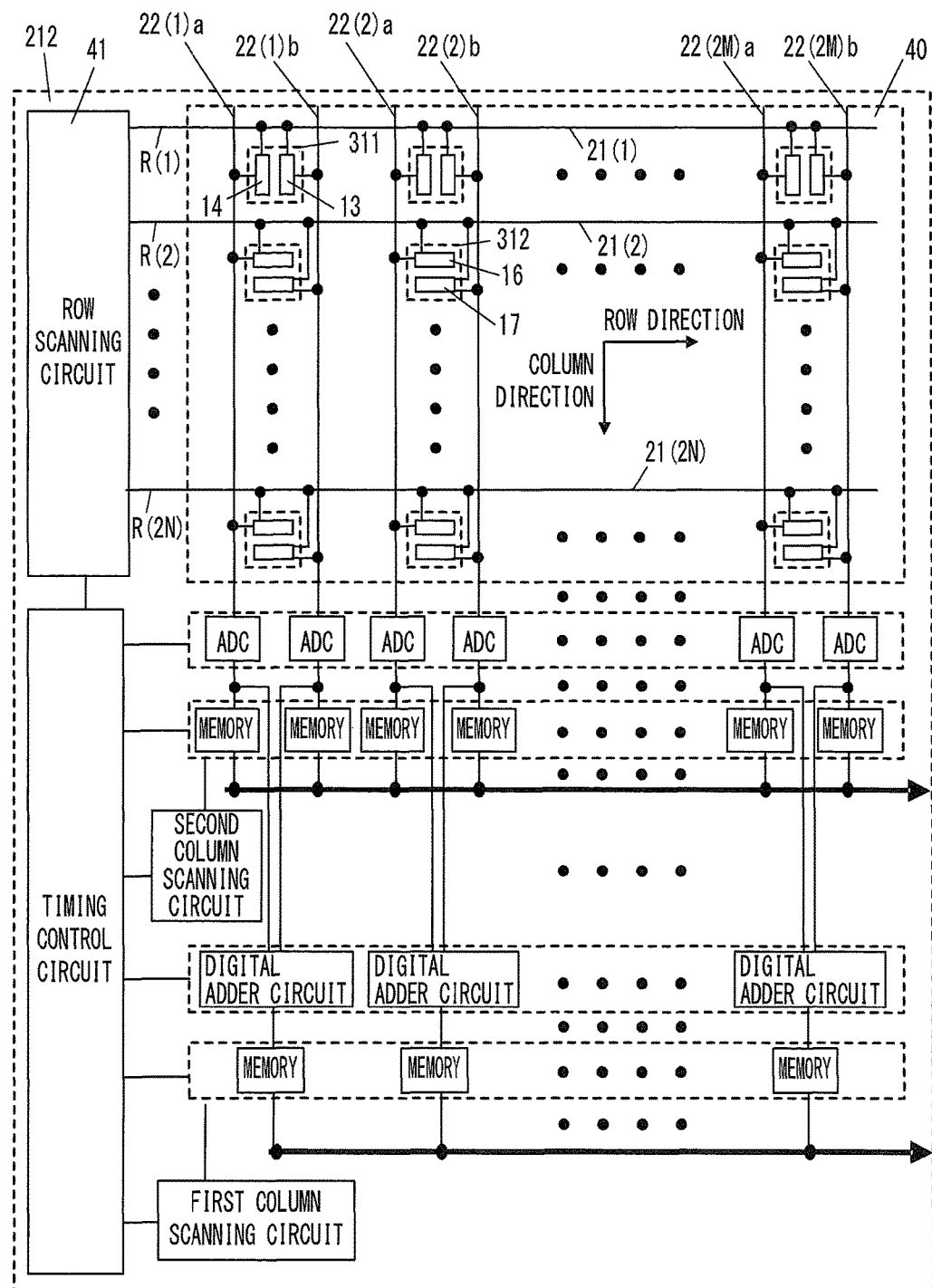

FIG. 19 is a block diagram showing the structure of the image sensor 212 assuming the pixel layout shown in FIG. 18. An explanation given in reference to FIG. 19 will focus on structural features characterizing the image sensor 212 and an explanation of structural elements identical to those in FIG. 10 is not provided. The pixel array unit 40 differs from that in FIG. 10 in that focus detection pixels 312 each having a pair of photoelectric conversion units 16 and 17, separated from each other along the vertical direction, are disposed in even-numbered rows.

The pairs of photoelectric conversion units 16 and 17 in the focus detection pixels 312 disposed in an even-numbered row are connected to the row scanning circuit 41 via a common row control line 21. In response to a control signal R(L) (L is an even number), charge storage control and signal read control are executed simultaneously. One of the pair of photoelectric conversion units 16 and 17, i.e., the photoelectric conversion units 16 in each focus detection pixel 312 disposed in a given even-numbered row, is connected to one of the two column signal lines, i.e., the column signal line 22(m)a, installed for the corresponding column. The output signal (analog signal) from the photoelectric conversion unit 16 is output to the column signal line 22(m)a. The other photoelectric conversion unit 17 in the pair of photoelectric conversion units 16 and 17 in the focus detection pixel 312 is connected to the other column signal line 22(m)b of the two column signal lines installed in correspondence to the particular column. The output signal (analog signal) from the photoelectric conversion unit 17 is output to the column signal line 22(m)b. For instance, assuming that the focus detection pixels 312 disposed in the Lth row in the pixel array unit 40 are selected by the control signal R(L) provided from the row scanning circuit 41, the output signals from the pairs of photoelectric conversion units 16 and 17 in the focus detection pixels 312 in the Lth row are output to the column signal lines ((22(1)a and 22(1)b through 22(2M)a and 22(2M)b).

Via the image sensor 212 structured as described above, a phase difference manifesting with regard to a subject image with a contrast change occurring along the horizontal direction can be detected based upon a pair of sets of data obtained by grouping, along the horizontal direction, the data from the photoelectric conversion units 13 and the data from the photoelectric conversion units 14 in the pairs of photoelectric conversion units 13 and 14 in the focus detection pixels 311 corresponding to a single color disposed in an odd-numbered row. In addition, a phase difference manifesting with regard to a subject image with a contrast change occurring along the vertical direction can be detected based upon a pair of sets of data obtained by grouping, along the vertical direction, the data from the photoelectric conversion units 16 and the data from the photoelectric conversion units 17 in the pairs of photoelectric conversion units 16 and 17 in the focus detection pixels 312 corresponding to a single color disposed in even-numbered rows.

Figure 20:
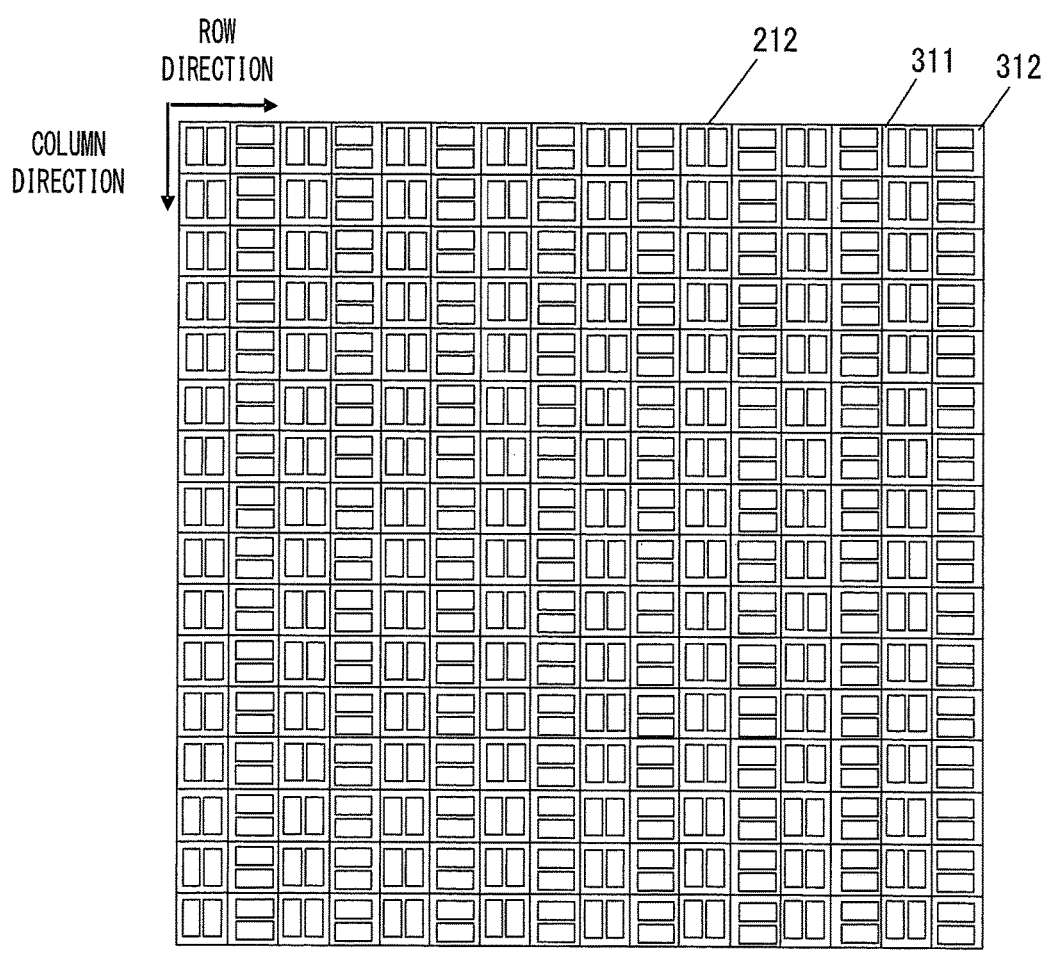

FIG. 20 shows a variation of FIG. 18, with focus detection pixels 311 and focus detection pixels 312 disposed in alternate columns. Via the image sensor 212 adopting such a structure, a phase difference manifesting with regard to a subject image with a contrast change occurring along the horizontal direction can be detected based upon a pair of sets of data obtained by grouping, along the horizontal direction, the data from the photoelectric conversion units 13 and the data from the photoelectric conversion units 14 in the pairs of photoelectric conversion units 13 and 14 in the focus detection pixels 311 corresponding to a single color disposed in odd-numbered columns. In addition, a phase difference manifesting with regard to a subject image with a contrast change occurring along the vertical direction can be detected based upon a pair of sets of data obtained by grouping, along the vertical direction, the data from the photoelectric conversion units 16 and the data from the photoelectric conversion units 17 in the pairs of photoelectric conversion units 16 and 17 in the focus detection pixels 312 corresponding to a single color disposed in an even-numbered column.

Figure 21:
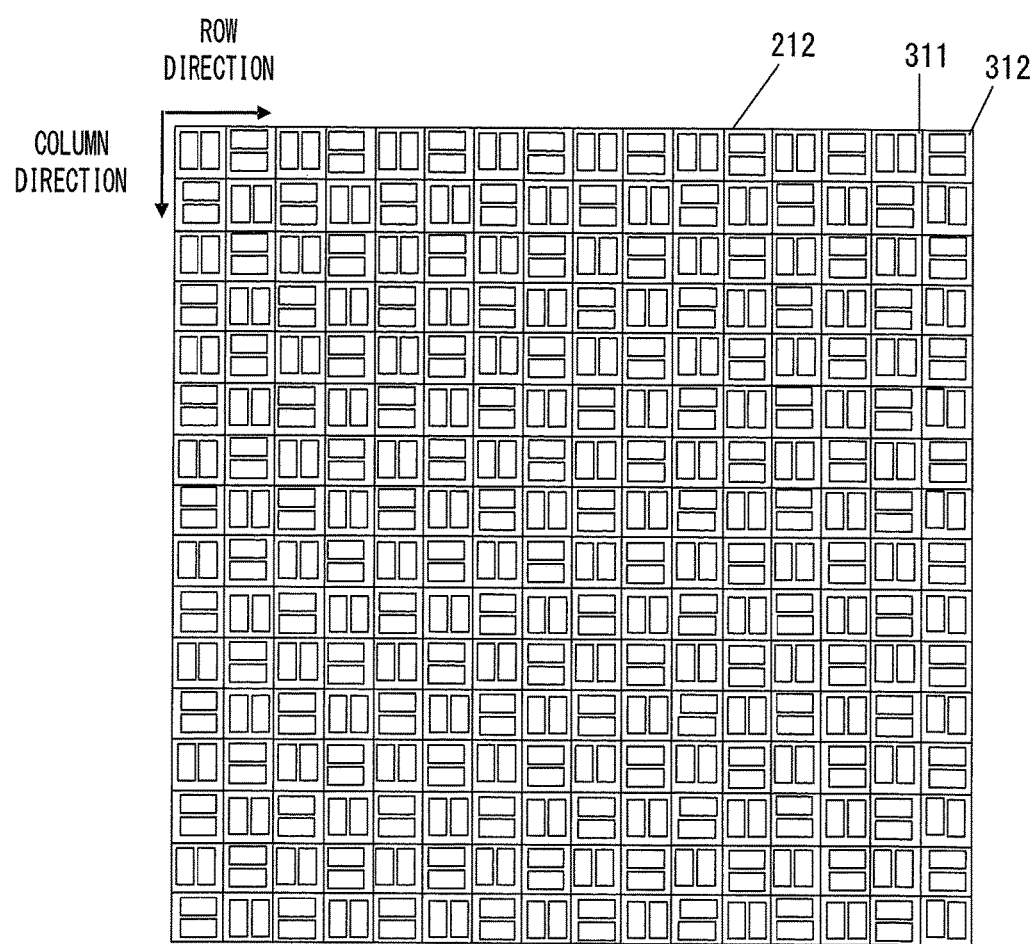

FIG. 21 shows a variation of FIG. 18, with focus detection pixels 311 and focus detection pixels 312 disposed at alternate positions in a staggered pattern. Namely, focus detection pixels 311 are disposed at "odd-numbered row/odd-numbered column" positions and at "even-numbered row/even-numbered column" positions, whereas focus detection pixels 312 are disposed at "odd-numbered row/even-numbered column" positions and at "even-numbered row/odd-numbered column" positions. Among the color filters set in the Bayer array pattern, the green filters are all disposed at the focus detection pixels 311 and the red color pixels and the blue color pixels are disposed at the focus detection pixels 312.

Via the image sensor 212 structured as described above, a phase difference manifesting with regard to a subject image with a contrast change occurring along the horizontal direction can be detected based upon a pair of sets of data obtained by grouping, along the horizontal direction, the data from the photoelectric conversion units 13 and the data from the photoelectric conversion units 14 in the pairs of photoelectric conversion units 13 and 14 in the focus detection pixels 311 having disposed thereat green color filters, which assume odd-numbered row/odd-numbered column positions or even-numbered row/even-numbered column positions. In addition, a phase difference manifesting with regard to a subject image with a contrast change occurring along the vertical direction can be detected based upon a pair of sets of data obtained by grouping, along the vertical direction, the data from the photoelectric conversion units 16 and the data from the photoelectric conversion units 17 in the pairs of photoelectric conversion units 16 and 17 in the focus detection pixels 312 having disposed thereat blue color filters, which assume odd-numbered row/even-numbered column positions or focus detection pixels 312 having disposed thereat red color filters, which assume even-numbered row/odd-numbered column positions.

Third Embodiment

The pixels included in the first embodiment are all focus detection pixels. However, regular image-capturing pixels each having a single, undivided photoelectric conversion unit and focus detection pixels each having photoelectric conversion units separated from each other may be used in combination so as to reduce the number of focus detection pixels disposed at the image sensor as a whole and simplify the overall structure of the image sensor. In addition, since the number of sets of focus detection data output from the image sensor to an external recipient is reduced, the focus detection data can be transferred at a data transfer rate comparable to the data transfer rate at which data used in image processing are typically transferred.

Figure 22:
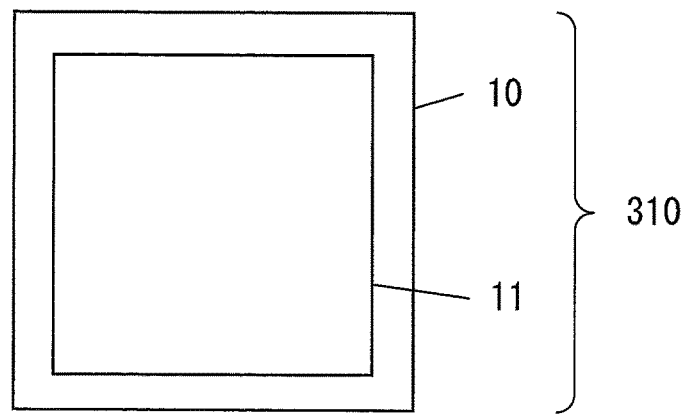

As FIG. 22 shows, an image-capturing pixel 310 comprises a rectangular micro-lens 10 and a photoelectric conversion unit 11 with a light receiving area thereof restricted by a light-shielding mask, as will be described later.

Figure 23:
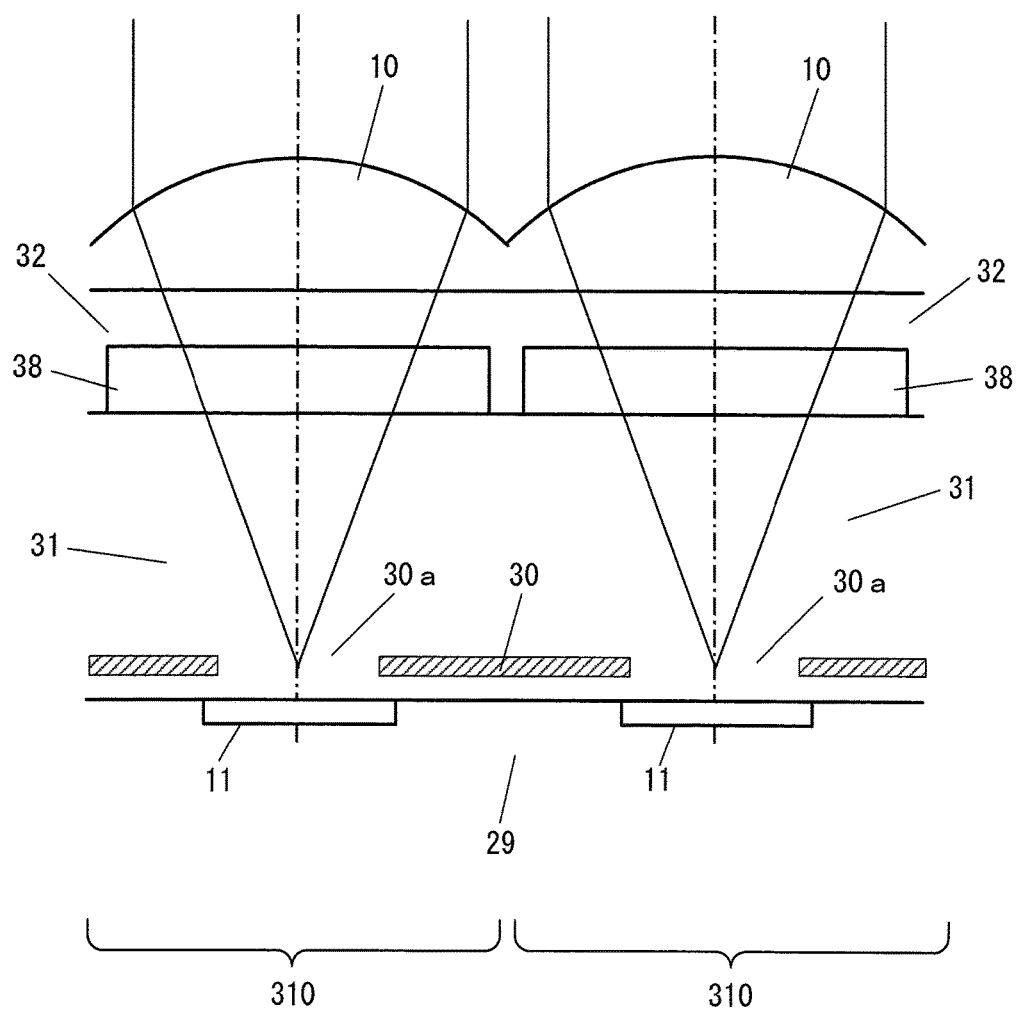

FIG. 23 shows image-capturing pixels 310 in FIG. 22 in a sectional view. A light-shielding mask 30 is formed above and in close proximity to the photoelectric conversion units 11 used for image-capturing operation at the image-capturing pixels 310. The photoelectric conversion units 11 each receive light having passed through an opening 30a in the light-shielding mask 30. Above the light-shielding mask 30, a leveling layer 31 is formed and color filters 38 are formed above the leveling layer 31. Above the color filters 38, a leveling layer 32 is formed and micro-lenses 10 are formed above the leveling layer 32. The shape of each opening 30a is projected forward via the corresponding micro-lens 10. The photoelectric conversion units 11 are formed on a semiconductor circuit substrate 29.

Figure 24:
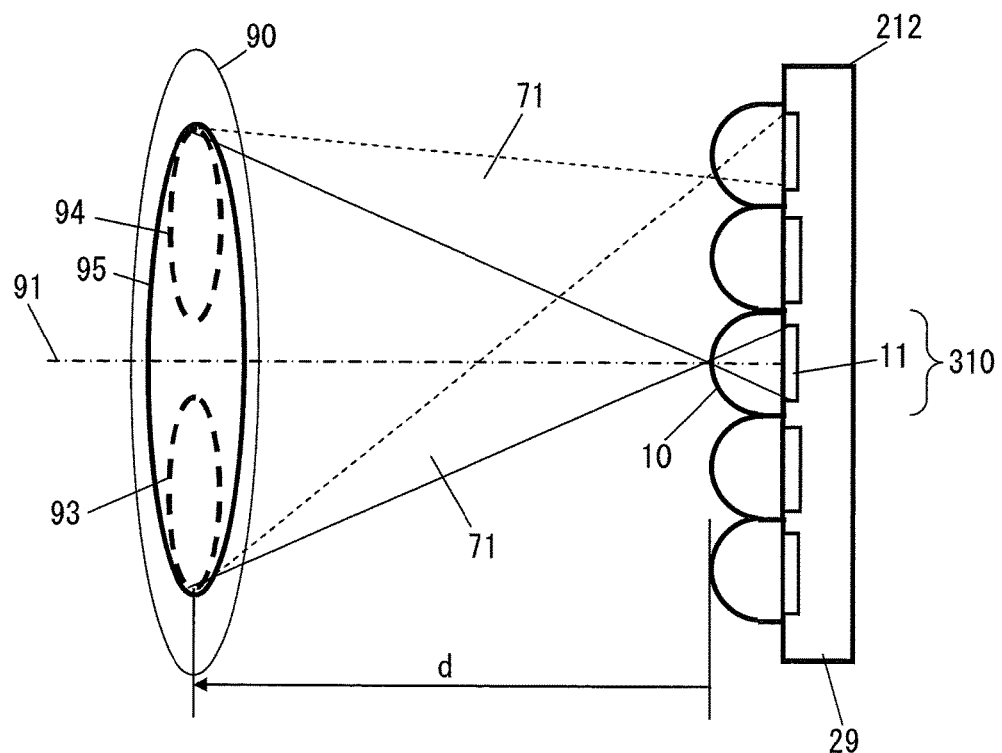

FIG. 24, which is to be referred to in comparison to FIG. 8, shows a photographic light flux 71 received at image-capturing pixels 310 structured as shown FIG. 22. An explanation of any illustrated items identical to those in FIG. 8 is omitted.

The image-capturing pixels 310 each comprise a micro-lens 10, a photoelectric conversion unit 11 disposed to the rear of the micro-lens and the like. The shape of an opening 30*a* (see FIG. 23) present in close proximity to the photoelectric conversion unit 11 is projected via the micro-lens 10 onto the exit pupil 90 set apart by the focus detection pupil distance d from the micro-lens 10. The shape of the projected image defines an area 95 that substantially circumscribes the focus detection pupils 93 and 94.

The photoelectric conversion unit 11 outputs a signal corresponding to the intensity of an image formed on the micro-lens 11 with a photographic light flux 71 having passed through the area 95 and having advanced toward the micro-lens 10.

Figure 25:
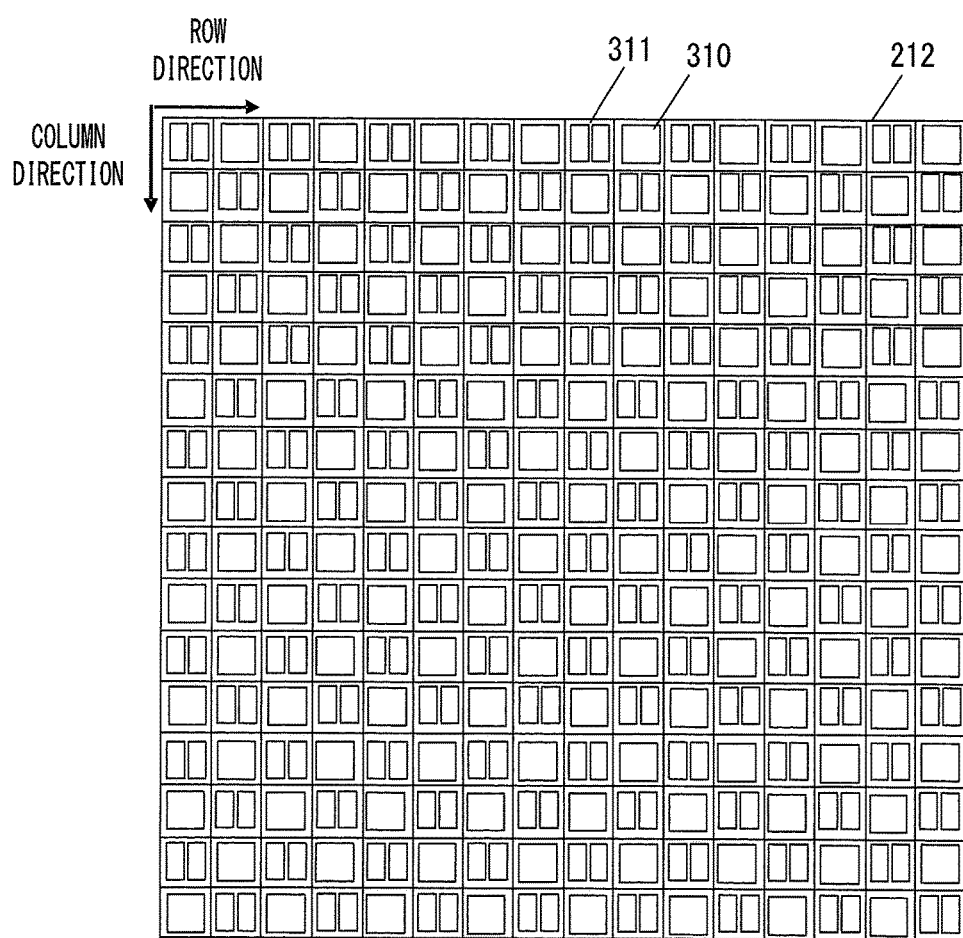

FIG. 25 presents a pixel layout diagram (with filters arrayed as illustrated in FIG. 4) that corresponds to the pixel layout diagram in FIG. 3. At the image sensor 212, part of which is shown in FIG. 25, image-capturing pixels 310 and focus detection pixels 311 are disposed at alternate positions in a staggered pattern. Namely, focus detection pixels 311 are disposed at "odd-numbered row/odd-numbered column" positions and at "even-numbered row/even-numbered column" positions, whereas image-capturing pixels 310 are disposed at "odd-numbered row/even-numbered column" positions and at "odd-numbered row/even-numbered column" positions. Among the color filters set in the Bayer array pattern, the green color filters are all disposed at the focus detection pixels 311 and the red color filters and the blue color filters are disposed at the image-capturing pixels 310. In order to assure maximum focus detection performance, it is desirable that green color filters, demonstrating spectral sensitivity characteristics over a range between those of the spectral sensitivity characteristics of red color filters and the spectral sensitivity characteristics of blue color filters, as indicated in FIG. 5, be disposed at the focus detection pixels 311. In addition, due to the presence of the element separation area 15 at each focus detection pixel 311, the sum of the surface areas of the pair of photoelectric conversion units 13 and 14 at the focus detection pixel 311 is smaller than the surface area of the photoelectric conversion unit 11 at an image-capturing pixel 310, as indicated in FIG. 6 and FIG. 22. This means that with respect to the image-capturing performance, the sum of the photoelectric conversion signal values output from the pair of photoelectric conversion units 13 and 14 at a focus detection pixel 311 is smaller than the photoelectric conversion signal value output from the photoelectric conversion unit 11 at an image-capturing pixel 312. For this reason, it is desirable that the green color filters, disposed in a greater quantity compared to the red color filters and the blue color filters, be provided at the focus detection pixels 311.

Figure 26:
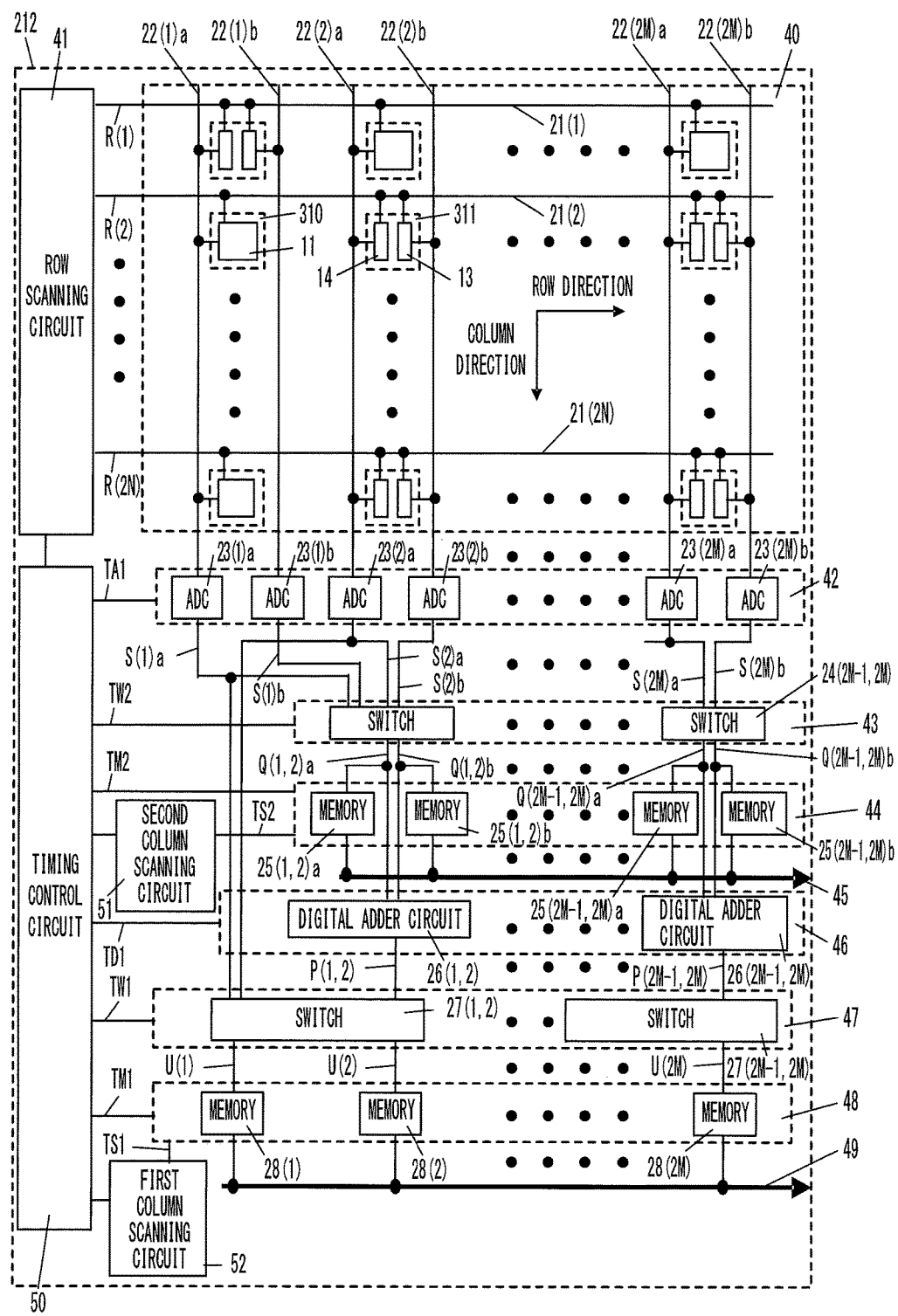

FIG. 26 is a block diagram showing the structure of the image sensor 212 assuming the pixel layout shown in FIG. 25. An explanation given in reference to FIG. 26 will focus on structural features characterizing the image sensor 212 and an explanation of structural elements identical to those in FIG. 10 will not be provided. The primary structural feature that differentiates this structure from that shown in FIG. 10 is a second column switch device 43 disposed at a position on one side of which the column A/D conversion device 42 is located and on the other side of which the second line memory 44 and the column digital adder device 46 are located. This structure allows both the number of memories configuring the second line memory 44 and the number of digital adder circuits configuring the column digital adder device 46 to be reduced.

In addition to the pixel array unit 40 with numerous focus detection pixels 311 each having a pair of photoelectric conversion units 13 and 14 disposed in a two-dimensional matrix pattern, the image sensor 212 includes the line scanning circuit 41, the column A/D conversion device 42, the second column switch device 43, the second line memory 44, the second column scanning circuit 51, the second horizontal output circuit 45, the column digital adder device 46, a first column switch device 47, the first line memory 48, the first column scanning circuit 52, the first horizontal output circuit 49 and the timing control circuit 50.

Based upon a master clock input thereto from an external source and a control signal input thereto from the image sensor control unit 220, the timing control circuit 50 in this system configuration generates a clock signal, control signals and the like, in reference to which the row scanning circuit 41, the column A/D conversion device 42, the first column switch device 47, the second column switch device 43, the column digital adder device 46, the first line memory 48, the first line memory 44, the first column scanning circuit 52, the second column scanning circuit 51, and the like are engaged in operation. The timing control circuit 50 provides the clock signal, the control signals and the like thus generated to the row scanning circuit 41, the column A/D conversion device 42, the first column switch device 47, the second column switch device 43, the column digital adder device 46, the first line memory 48, the first line memory 44, the first column scanning circuit 52, the second column scanning circuit 51 and the like.

At the pixel array unit 40, image-capturing pixels 310 and focus detection pixels 311 are two-dimensionally disposed over 2N rows×2M columns. The focus detection pixel 311 in the upper left corner in FIG. 26 is the pixel taking up a first-row/first-column position, and a green color filter is disposed at this pixel in conformance to the Bayer array rule. For this 2N row×2M column pixel array, a row control line 21 (21(1) through 21(2N)) is wired in correspondence to each row and two column signal lines (22 (1)*a* and 22(1)*b* through 22(2M)a and 22(2M)b) are wired in correspondence to each column. A total of 2N row control lines are installed, whereas a total of 4M column signal lines are installed. One end of each row control line 21 (21(1) through 21 (2N)) corresponding to a given row is connected to an output end of the row scanning circuit 41 corresponding to the particular row, and control signals R(1) through R(2N) are output to the respective row control lines 21.

The photoelectric conversion units in the image-capturing pixels 310 and the pairs of photoelectric conversion units 13 and 14 in the various focus detection pixels 311 disposed in a given row are connected to the row scanning circuit 41 through the common row control line 21. In response to a control signal R(L), charge storage control and signal read control are executed simultaneously. The photoelectric conversion unit 11 in each image-capturing pixel 310 is connected to one of the two column signal lines installed for the corresponding column, i.e., the column signal line 22(*m*)*a*. The signal (analog signal) output from the photoelectric conversion unit 11 is output to the column signal line 22(*m*)*a*. One of the pair of photoelectric conversion units 13 and 14, i.e., the photoelectric conversion units 13, in each focus detection pixel 311 is connected to one of the two column signal lines, i.e., the column signal line 22(*m*)*b*, installed for the corresponding column. The output signal (analog signal) from the photoelectric conversion unit 13 is output to the column signal line 22(*m*)*b*. The other photoelectric conversion unit 14 in the pair of photoelectric conversion units 13 and 14 in the focus detection pixel 311 is connected to the other column signal line 22(*m*)*a* of the two column signal lines installed in correspondence to the particular column. The output signal (analog signal) from the photoelectric conversion unit 14 is output to the column signal line 22(m)a. For instance, when the Lth row in the pixel array unit 40 is selected by the control signal R(L) provided from the row scanning circuit 41, the output signals from the photoelectric conversion units 11 in the image-capturing pixels 310 in the Lth row are output to the column signal lines (22(1)a through 22(2M)a) and the output signals from the pairs of photoelectric conversion units 13 and 14 in the focus detection pixels 311 in the Lth row are output to the column signal lines (22(1)a and 22(1)b through 22(2M)a and 22(2M)b). If L is an odd-numbered value, the signals on the column signal lines 22(2M)b corresponding to the even-numbered columns are invalid signals since image-capturing pixels 310 are disposed at the even-numbered column positions in this row. In addition, if L is an even-numbered value, the signals on the column signal lines 22(2m+1)b corresponding to the odd-numbered columns are invalid signals since image-capturing pixels 310 are disposed at the odd-numbered column positions in this row.

The column A/D conversion device 42 includes 4M ADC (analog-digital conversion) circuits 23(1)a and 23(1)b through 23(2M)a and 23(2M)b respectively disposed in correspondence to the column signal lines 22(1)a and 22(1)b through 22(2M)a and 22(2M)b, which are installed in correspondence to the individual pixel columns in the pixel array unit 40. In response to a control signal TA1 provided from the timing control circuit 50, the column A/D conversion device 42 converts analog signals output from the individual pixels in the pixel array unit 40 in correspondence to the individual columns, to H-bit digital signals (S(1)a and S(1)b through S(2M)a and S(2M)b) and outputs the digital signals resulting from the conversion.

The second column switch device 43 includes M switches 24(1, 2) through 24(2M−1, 2M), each disposed in correspondence to two successive pixel columns. In response to a control signal TW2 provided from the timing control circuit 50, the second column switch device 43 selects digital signals each output from one of the ADCs (23(1)a and 23(1)b through 23(2M)a and 23(2M)b) and outputs the selected signals.

FIGS. 27(a) and 27(b) illustrate selection operations executed at the switch 24(2m+1, 2m+2) disposed in correspondence to two successive pixel columns (i.e., the (2m+1)th column and the (2m+2)th column). Four digital signals S(2m+1)a, S(2m+1)b, S(2m+2)a, S(2m+2)b are input to the switch 24(2m+1, 2m+2) from the four ADCs 23((2m+1)a, 23(2m+1)b, 23(2m+2)a, 23(2m+2)b) corresponding to the two pixel columns (2m+1) and (2m+2). As an alternative, the switch 24(2m+1), (2m+2) may receive, for instance, 8 (i.e., a multiple of 4) digital signals S(2m+1)a, S(2m+1)b, S(2m+2)a, S(2m+2)b, S(2m+3)a, S(2m+3)b, S(2m+4)a and S(2m+4)b input thereto from 8 (a multiple of 4) ADCs ((23(2m+1)a, 23(2m+1)b, 23(2m+2)a, 23(2m+2)b), 23(2m+3)a, 23(2m+3)b, 23(2m+4)a and 23(2m+4)b corresponding to 4 (a multiple of 2) pixel columns (the (2m+1)th column, the (2m+2)th column, the (2m+3)th column and the (2m+4)th column). In this case, a focus detection pixel 311 is disposed at the (2m+1)th column position and image-capturing pixels 310 are disposed at the other column positions, i.e., the (2m+2)th column position, the (2m+3)th column position and the (2m+4)th column position.

FIG. 27(a) illustrates the selection operation executed at the switch 24(2m+1, 2m+2) when an odd-numbered row in the pixel array unit 40 is selected via the row scanning circuit 41. In the operation illustrated in FIG. 27(a), four digital signals S(2m+1)a, S(2m+1)b, S(2m+2)a and S(2m+2)b corresponding to the image-capturing pixel 310 disposed at the odd-numbered row/even-numbered column position and the focus detection pixel 311 disposed at the odd-numbered row/odd-numbered column position are input to the switch 24(2m+1, 2m+2). The signal S(2m+2)b among these signals is an invalid signal.

In response to the control signal TW2 (identification information indicating an odd-numbered row or an even-numbered row) input to the second column switch device 43, the switch 24(2m+1, 2m+2) selects the digital signals S(2m+1)a and S(2m+1)b corresponding to the pair of photoelectric conversion units in the focus detection pixel 311 as a pair of signals (Q(2m+1, 2m+2)a and Q(2m+1, 2m+2)b) to undergo digital addition and outputs the selected digital signals.

FIG. 27(b) illustrates the selection operation executed at the switch 24(2m+1, 2m+2) when an even-numbered row in the pixel array unit 40 is selected via the row scanning circuit 41. Four digital signals S(2m+1)a, S(2m+1)b, S(2m+2)a and S(2m+2)b corresponding to the image-capturing pixel 310 disposed at the even-numbered row/odd-numbered column position and the focus detection pixel 311 disposed at the even-numbered row/even-numbered column position are input to the switch 24(2m+1, 2m+2). The signal S(2m+1)b among these signals is an invalid signal.

In response to the control signal TW2 (identification information indicating an odd-numbered row or an even-numbered row) input to the second column switch device 43, the switch 24(2m+1, 2m+2) selects the digital signals S(2m+2)a and S(2m+2)b corresponding to the pair of photoelectric conversion units 13, 14 in the focus detection pixel 311 as a pair of signals (Q(2m+1, 2m+2)a and Q(2m+1, 2m+2)b) corresponding to the pair of photoelectric conversion units 13 and 14 in the focus detection pixel 311, and outputs the selected digital signals.

The second line memory 44 includes a total of 2M memories (25(1, 2)a and 25(1, 2)b through 25(2M−1, 2M)a and 25(2M−1, 2M)b) installed in pairs, each pair corresponding to one of the M switches 24(1, 2) through 24(2M−1, 2M) in the second column switch device 43. In response to a control signal TM2 provided from the timing control circuit 50, each pair of digital signals among pairs of digital signals (Q (1, 2)a and Q (1, 2)b through Q(2M−1, 2M)a and Q(2M−1, 2M)b) corresponding to the pairs of focus detection units 13 and 14 in the focus detection pixels 311, output via one of the M switches 24(1, 2) through 24(2M−1, 2M), are stored as H-bit digital signals into the second line memory 44. Through this operation, the output signals from the pairs of photoelectric conversion units 13 and 14 in the M focus detection pixels disposed in a single row are stored as digital signals in the individual memories (25 (1, 2)a and 25(1, 2)b through 25(22M−1, 2M)a and 25(22M−1, 2M)b) configuring the second line memory 44.

The column digital adder device 46 includes a total of M digital adder circuits (26(1, 2) through 26(2M−1, 2M)) respectively disposed in correspondence to the M switches 24(1, 2) through 24(2M−1, 2M) in the second column switch device 43. In response to a control signal TD1 provided from the timing control circuit 50, the column digital adder device 46 adds together the signals in each pair of digital signals among the pairs of digital signals (Q (1, 2)a and Q (1, 2)b through Q(2M−1, 2M)a and Q(2M−1, 2M)b) corresponding to the pairs of photoelectric conversion units 13 and 14 in the focus detection pixels 311 respectively output via the M switches 24(1, 2) through 24(2M−1, 2M), and outputs the results as H-bit digital sum signals (P(1, 2) through P(2M−1, 2M)).

The first column switch device 47 includes M switches 27(1, 2) through 27(2M−1, 2M), each disposed in correspondence to two successive pixel columns. In response to a control signal TW1 (identification information indicating an odd-numbered row or an even-numbered row) provided from the timing control circuit 50, the first column switch device 47 selects digital signals among the digital signal (S(1)a and S(2)a through 2(2M−1)a and S(2M)a) respectively output via the 2M ADCs (23(1)a through 23 (2M)a) and the digital sum signals (P (1, 2) through P (2M−1, 2M)) output respectively via the M digital adder circuits (26(1, 2) through 26(2M−1, 2M)) and outputs the selected signals.

FIGS. 28(a) and 28(b) illustrate selection operations executed at the switch 27(2m+1, 2m+2) disposed in correspondence to two successive pixel columns (i.e., the (2m+1)th column and the (2m+2)th column). Two digital signals S(2m+1)a and S(2m+2)a are input to the switch 27(2m+1, 2m+2) from the two ADCs (23(2m+1)a and 23(2m+2)a) corresponding to two pixel columns (2m+1) and (2m+2) and also a single digital sum signal P(2m+1, 2m+2) is input to the switch 27(2m+1, 2m+2) from the digital adder circuit 26(2m+1, 2m+2).

FIG. 28(a) illustrates the selection operation executed at the switch 27(2m+1, 2m+2) when an odd-numbered row in the pixel array unit 40 is selected via the row scanning circuit 41. In the operation executed as illustrated in FIG. 28(a), a single digital signal S(2m+2)a corresponding to the photoelectric conversion unit 11 in the image-capturing pixel 310 disposed at the odd-numbered row/even-numbered column position, a single digital signal S(2m+1)a corresponding to the photoelectric conversion unit 14 in the focus detection pixel 311 disposed at the odd-numbered row/odd-numbered column position, and the digital sum signal P(2m+1, 2m+2) (equivalent to a signal output from an image-capturing pixel) obtained by adding together the pair of signals S(2m+1)a and S(2m+1)b corresponding to the pair of photoelectric conversion units 13 and 14 in the focus detection pixel 311 disposed at the odd-numbered row/odd-numbered column position, provided via the digital adder circuit 26(2m+1, 2m+2), are input to the switch 27(2m+1, 2m+2). Among these signals, the signal S(2m+1)a input from the ADC 23(2m+1)a is not equivalent to a signal output from an image-capturing pixel.

In response to the control signal TW1 (identification information indicating an odd-numbered row or an even-numbered row) input to the first column switch device 47, the switch 27(2m+1, 2m+2) selects the digital sum signal P(2m+1, 2m+2) obtained by adding together the digital signals corresponding to the pair of photoelectric conversion units in the focus detection pixel 311 and outputs the selected digital sum signal as a signal U(2m+1) equivalent to an image-capturing pixel signal that would be output from a virtual image-capturing pixel disposed at the odd-numbered column position. The switch 27 (2m+1, 2m+2) also selects the digital signal S(2m+2)a corresponding to the image-capturing pixel 310 and outputs the selected signal as a signal U(2m+1) from the image-capturing pixel disposed at the even-numbered column position.

FIG. 28(b) illustrates the selection operation executed at the switch 27(2m+1, 2m+2) when an even-numbered row in the pixel array unit 40 is selected via the row scanning circuit 41. A single digital signal S(2m+1)a corresponding to the photoelectric conversion unit 11 in the image-capturing pixel 310 disposed at the even-numbered row/odd-numbered column position, a single digital signal S(2m+2)a corresponding to the photoelectric conversion unit 14 in the focus detection pixel 311 disposed at the even-numbered row/even-numbered column position, and the digital sum signal P(2m+1, 2m+2) (equivalent to a signal output from an image-capturing pixel) obtained by adding together the pair of signals S(2m+2)a and S(2m+2)b corresponding to the pair of photoelectric conversion units 13 and 14 in the focus detection pixel 311 disposed at the even-numbered row/even-numbered column position, provided via the digital adder circuit 26(2m+1, 2m+2) are input to the switch 27(2m+1, 2m+2). Among these signals, the signal S(2m+2)a is not equivalent to a signal output from an image-capturing pixel.

In response to the control signal TW1 (identification information indicating an odd-numbered row or an even-numbered row) input to the first column switch device 47, the switch 27(2m+1, 2m+2) selects the digital sum signal P(2m+1, 2m+2) obtained by adding together the digital signals corresponding to the pair of photoelectric conversion units in the focus detection pixel 311 and outputs the selected digital sum signal as a signal U(2m+2) equivalent to an image-capturing pixel signal that would be output from a virtual image-capturing pixel disposed at the even-numbered column position and also selects the digital signal S(2m+1)a corresponding to the image-capturing pixel 310 and outputs the selected signal as a signal U(2m+1) from the image-capturing pixel disposed at the odd-numbered column position.

The first line memory 48 includes a total of 2M memories (28(1) through 28(2M)) installed in pairs, with each pair corresponding to one of the M switches (27(1, 2) through 27(2M−1, 2M)) in the column switch device 47. In response to the control signal TM1 provided from the timing control circuit 50, each pair of digital signals output via one of the switches (27(1, 2) through 27(2M−1, 2M)) are stored as H-bit digital signals into the first line memory 48. Through this operation, in the individual memories (28(1) through 28(2M)) configuring the first line memory 48, the sum signals (equivalent to output signals from image-capturing pixels) each obtained by adding together the output signals from the pair of photoelectric conversion units 13 and 14 in one of the focus detection pixels in a single row, and the signals output from the photoelectric conversion units in the image-capturing pixels disposed in the row are stored as digital signals in a sequence corresponding to the order with which the focus detection pixels and the image-capturing pixels are disposed in the row.

The second column scanning circuit 51, constituted with, for instance, a shift register, controls column addresses and column scanning for the memories (25(1)a and 25(1)b through 25(2M)a and 25(2M)b) in the second line memory 44 under control executed by the timing control circuit 50. The second line memory 44 is engaged in operation in response to a scan signal TS2 provided from the second column scanning circuit 51. The individual H-bit digital signals stored in the memories (25(1, 2)a and 25(1, 2)b through 25(2M−1, 2M)a and 25(2M−1, 2M)b) are read out in sequence into the second horizontal output circuit 45, and subsequently are serially output (as 2M sets of data) to an external recipient as output signals (digital signals) provided via the pairs of photoelectric conversion units 13 and 14 to be used for purposes of focus detection via the second horizontal output circuit 45.

The first column scanning circuit 52, constituted with, for instance, a shift register, controls column addresses and column scanning for the memories (28(1) through 28(2M)) in the first line memory 48 under control executed by the timing control circuit 50. The first line memory 48 is engaged in operation in response to a scan signal TS1 provided from the first column scanning circuit 52. The individual H-bit digital signals and digital sum signals stored in the memories (28(1) through 28(2M)) are read out in sequence into the first horizontal output circuit 49, and subsequently are serially output, via the first horizontal output circuit 49, to an external recipient as output signals (digital signals) equivalent to output signals provided from image-capturing pixels.

Figure 29:
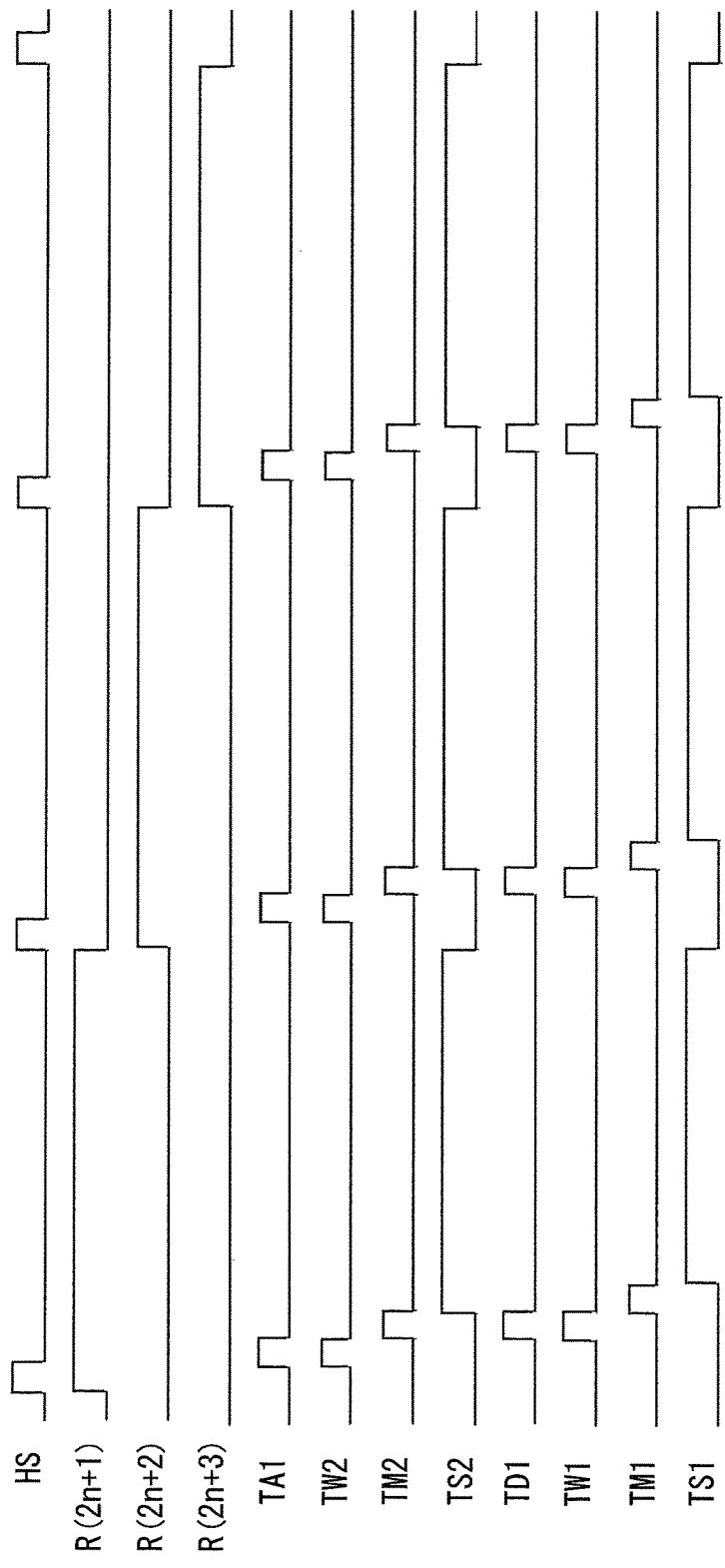

Next, in reference to the timing chart presented in FIG. 29, individual read operation for individually reading out the output signals (signals used for focus detection) from the pairs of photoelectric conversion units in the focus detection pixels and read operation for reading out the output signals (signals to undergo image processing) equivalent to output signals from image-capturing pixels, executed concurrently during a single frame period in the image sensor structured as shown in FIG. 26, will be explained.

The row scanning selection operation executed via the row scanning circuit 41 in the image sensor structured as shown in FIG. 26 is essentially identical to that explained in reference to FIG. 11.

FIG. 29 provides an enlarged view of the operation executed in relation to the (2n+1)th row, the (2n+2)th row and the (2n+3)th row in FIG. 11. As the (2n+1)th row in the pixel array unit 40 is selected by the control signal R(2n+1), the analog signals for a single line from the focus detection pixels 311 and the image-capturing pixels 310, disposed in the (2n+1)th row are output to the column signal lines (22(1)a and 22(1)b through 22(2M)a and 22(2M)b). In response to the control signal TA1, the analog signals for the single line from the pairs of photoelectric conversion units 13 and 14 in the focus detection pixels 311 and from the photoelectric conversion units 11 in the image-capturing pixels 310, respectively disposed at the odd-numbered column positions and the even-numbered column positions in the (2n+1)th row, having been output to the column signal lines (22(1)a and 22(1)b through 22(2M)a and 22(2M)b) are individually converted to digital signals via the ADCs (23(1)a and 23(1)b through 23(2M)a and 23(2M)b) in the column A/D conversion device 42 connected to the column signal lines 22(1)a and 22(1)b through 22(2M)a and 22(2M)b respectively.

In response to the control signal TW2, the digital signals corresponding to the pairs of photoelectric conversion units 13 and 14 in the focus detection pixels 311 disposed at the odd-numbered column positions, among the digital signals for a single line from the pairs of photoelectric conversion units 13 and 14 in the focus detection pixels 311 disposed at the odd-numbered column positions and the image-capturing pixels 310 disposed at the even numbered column positions in the (2n+1)th row, which are input from the column A/D conversion device 42 to the second column switch device 43, are selected via the second column switch device 43 (24(1, 2) through 24(2M−1, 2M)) and the digital signals thus selected are output.

In response to the control signal TM2, the digital signals corresponding to the pairs of photoelectric conversion units 13 and 14 in the focus detection pixels 311 disposed at the odd-numbered column positions, output from the second column switch device 43 (24(1, 2) through 24(2M−1, 2M)) are stored into the 2M memories (25(1, 2)a, and 25(1, 2)b through 25(2M−1, 2M)a and 25(2M−1, 2M)b) in the second line memory 44.

Concurrently as the operation described above is executed, the digital signals corresponding to the pair of photoelectric conversion units 13 and 14 in each of the focus detection pixels 311 disposed at the odd-numbered column positions are added together via one of the M digital adder circuits (26(1, 2) through 26(2M−1, 2M)) in the column digital adder device 46 in response to the control signal TD1 and the resulting sum signal is then output.

In response to the control signal TW1, the first column switch device 47 (27(1, 2) through 27(2M−1, 2M)) selects the digital sum signals each obtained by adding together the digital signals corresponding to the pair of photoelectric conversion units 13 and 14 in one of the focus detection pixels 311 disposed at the odd-numbered column positions and the digital signals corresponding to the photoelectric conversion units 11 in the image-capturing pixels 310 disposed at the even-numbered column positions, among the digital signals input to the first column switch device 47, i.e., the digital signals corresponding to the photoelectric conversion units 14 in the pairs of photoelectric conversion units in the focus detection pixels 311 disposed at the odd-numbered column positions, the digital signals corresponding to the photoelectric conversion units 11 in the image-capturing signals 310 disposed at the even-numbered column positions and the digital sum signals each obtained by adding together the digital signals corresponding to the pair of photoelectric conversion units 13 and 14 in one of the focus detection pixels 311 disposed at the odd-numbered column positions. The digital sum signals obtained by adding together the digital signals from the pairs of photoelectric conversion units 13 and 14 in the focus detection pixels 311 disposed at the odd-numbered column positions are output as signals that would be output from image-capturing pixels disposed at the odd-numbered column positions, whereas the digital signals from the photoelectric conversion units 11 in the image-capturing signals 310 disposed at the even-numbered column positions are output as signals from the image-capturing pixels disposed at the even-numbered column positions.

In response to the control signal TM1, the digital sum signals obtained by adding together the digital signals from the pairs of photoelectric conversion units 13 and 14 in the focus detection pixels 311 disposed at the odd-numbered column positions and the digital signals from the photoelectric conversion units 11 in the image-capturing signals 310 disposed at the even-numbered column positions, having been selected and output by the first column switch device 47, are stored into the memories (28(1) through 28(2M)) in the first line memory 48.

In response to the scan signal TS2, the digital signals corresponding to the pairs of photoelectric conversion units 13 and 14 in the M focus detection pixels 311 disposed at the odd-numbered column positions in the (2n+1)th row, having been stored into the 2M memories (25(1, 2)a and 25(1, 2)b through 25(2M−1, 2M)a and 25(2M−1, 2M)b) in the second line memory 44, are provided in sequence to an external recipient through a serial output from the second horizontal output circuit 45 over the period of time elapsing until the next horizontal synchronous signal HS is generated.

Likewise, in response to the scan signal TS1, the 2M digital signals equivalent to image-capturing pixel output signals for the (2n+1)th row (the digital sum signals obtained by adding together the digital signals from the pairs of photoelectric conversion units 13 and 14 in the focus detection pixels 311 disposed at the odd-numbered column positions and the digital signals from the photoelectric conversion units 11 in the image-capturing pixels 310 disposed at the even-numbered column positions), having been stored into the memories (28(1) through 28(2M)) in the first line memory 48, are sequentially provided to an external recipient through a serial output from the first horizontal output circuit 49 during the period of time elapsing until the next horizontal synchronous signal HS is generated.

As the control signal R(2n+2) is provided in synchronization with the next horizontal synchronous signal HS, and the (2n+2)th row in the pixel array unit 40 is selected, the analog signals for a single line are output from the focus detection pixels 311 and the image-capturing pixels 310 disposed in the (2n+2)th row to the column signal lines (22(1)a and 22(1)b through 22(2M)a and 22(2M)b). In response to the control signal TA1, the analog signals for a single line from the pairs of photoelectric conversion units 13 and 14 in the focus detection pixels 311 at the even-numbered column positions and from the photoelectric conversion units 11 in the image-capturing pixels 310 at the odd-numbered column positions in the (2n+2)th row having been output to the column signal lines (22(1)a and 22(1)b through 22(2M)a and 22(2M)b) are converted to digital signals via the ADCs (23(1)a and 23(1)b through 23(2M)a and 23(2M)b) in the column A/D conversion device 42 connected to the column signal lines (22(1)a and 22(1)b through 22(2M)a and 22(2M)b) respectively.

In response to the control signal TW2, the digital signals corresponding to the pairs of photoelectric conversion units 13 and 14 in the focus detection pixels 311 disposed at the even-numbered column positions, among the digital signals for a single line from the pairs of photoelectric conversion units 13 and 14 in the focus detection pixels 311 disposed at the even-numbered column positions and the photoelectric conversion units 11 in the image-capturing pixels 310 disposed at the odd-numbered column positions in the (2n+2)th row, which are input from the column A/D conversion device 42 to the second column switch device 43, are selected via the second column switch 43 (24(1, 2) through 24(2M−1, 2M)) and the digital signals thus selected are output.

In response to the control signal TM2, the digital signals corresponding to the pairs of photoelectric conversion units 13 and 14 in the focus detection pixels 311 disposed at the even-numbered column positions, output from the second column switch device 43 (24(1, 2) through 24(2M−1, 2M)) are stored into the 2M memories (25(1, 2)a, and 25(1, 2)b through 25(2M−1, 2M)a and 25(2M−1, 2M)b) in the second line memory 44.

Concurrently as the operation described above is executed, the digital signals corresponding to the pair of photoelectric conversion units 13 and 14 in each of the focus detection pixels 311 disposed at the even-numbered column positions are added together via one of the M digital adder circuits (26(1, 2) through 26(2M−1, 2M)) in the column digital adder device 46 in response to the control signal TD1 and the resulting sum signal is then output.

In response to the control signal TW1, the first column switch device 47 (27(1, 2) through 27(2M−1, 2M)) selects the digital sum signals each obtained by adding together the digital signals corresponding to the pair of photoelectric conversion units 13 and 14 in one of the focus detection pixels 311 disposed at the even-numbered column positions and the digital signals corresponding to the photoelectric conversion units 11 in the image-capturing pixels 310 disposed at the odd-numbered column positions, among the digital signals input to the first column switch device 47, i.e., the digital signals corresponding to the photoelectric conversion units 14 in the pairs of photoelectric conversion units in the focus detection pixels 311 disposed at the even-numbered column positions, the digital signals corresponding to the photoelectric conversion units 11 in the image-capturing signals 310 disposed at the odd-numbered column positions and the digital sum signals each obtained by adding together the digital signals corresponding to the pair of photoelectric conversion units 13 and 14 in one of the focus detection pixels 311 disposed at the even-numbered column positions. The digital sum signals obtained by adding together the digital signals from the pairs of photoelectric conversion units 13 and 14 in the focus detection pixels 311 disposed at the even-numbered column positions are output as signals that would be output from image-capturing pixels disposed at the even-numbered column positions, whereas the digital signals from the photoelectric conversion units 11 in the image-capturing signals 310 disposed at the odd-numbered column positions are output as signals from the image-capturing pixels disposed at the odd-numbered column positions.

In response to the control signal TM1, the digital sum signals obtained by adding together the digital signals from the pairs of photoelectric conversion units 13 and 14 in the focus detection pixels 311 disposed at the even-numbered column positions and the digital signals from the photoelectric conversion units 11 in the image-capturing signals 310 disposed at the odd-numbered column positions, having been selected and output by the first column switch device 47, are stored into the memories (28(1) through 28(2M)) in the first line memory 48.

In response to the scan signal TS2, the digital signals corresponding to the pairs of photoelectric conversion units 13 and 14 in the M focus detection pixels 311 disposed at the even-numbered column positions in the (2n+2)th row, having been stored into the 2M memories (25(1, 2)a and 25(1, 2)b through 25(2M−1, 2M)a and 25(2M−1, 2M)b) in the second line memory 44, are provided in sequence to an external recipient through a serial output from the second horizontal output circuit 45 over the period of time elapsing until the next horizontal synchronous signal HS is generated. Based upon the digital signals output through the second horizontal output circuit 45, the focus detection CPUa 222 in the body drive control device 214 detects the focusing condition at the interchangeable lens 202 (optical system) and adjusts the focusing condition as indicated in FIG. 13.

Likewise, in response to the scan signal TS1, the 2M digital signals equivalent to image-capturing pixel output signals for the (2n+2)th row (the digital sum signals obtained by adding together the digital signals from the pairs of photoelectric conversion units 13 and 14 in the focus detection pixels 311 disposed at the even-numbered column positions and the digital signals from the photoelectric conversion units 11 in the image-capturing pixels 310 disposed at the odd-numbered column positions), having been stored into the memories (28(1) through 28(2M)) in the first line memory 48, are sequentially provided to an external recipient through a serial output from the first horizontal output circuit 49 during the period of time elapsing until the next horizontal synchronous signal HS is generated. Based upon the 2M digital signals (the digital sum signals obtained by adding together the digital signals corresponding to the pairs of photoelectric conversion units 13 and 14 in the focus detection pixels 311 disposed at the even-numbered column positions and the digital signals corresponding to the photoelectric conversion units 11 in the image-capturing pixels 310 disposed at the odd-numbered column positions) output through the first horizontal output circuit 49, the image processing CPUb 223 in the body drive control device 214 generates image data as indicated in FIG. 14. However, in the processing executed in this embodiment in step S210 in FIG. 14, the data carried in the 2M digital signals (the digital sum signals obtained by adding together the digital signals corresponding to the pairs of photoelectric conversion units 13 and 14 in the focus detection pixels 311 disposed at the even-numbered column positions and the digital signals corresponding to the photoelectric conversion units 11 in the image-capturing pixels 310 disposed at the odd-numbered column positions) having been output through the first horizontal output circuit 49 are read out, the data thus read out undergo display image processing and then an image display is brought up at the electronic viewfinder. In addition, in step S230 in FIG. 14, the data carried in the 2M digital signals (the digital sum signals obtained by adding together the digital signals corresponding to the pairs of photoelectric conversion units 13 and 14 in the focus detection pixels 311 disposed at the even-numbered column positions and the digital signals corresponding to the photoelectric conversion units 11 in the image-capturing pixels 310 disposed at the odd-numbered column positions), having been output through the first horizontal output circuit 49, are read out, the data thus read out undergo image processing of the known art (de-mosaic processing, noise processing, gradation processing, white balance processing and the like) and image data are thus generated.

As the control signal R(2n+3) is issued in synchronization with the next horizontal synchronous signal HS and the (2n+3)th row in the pixel array unit 40 is selected, processing is repeatedly executed for the focus detection pixels 311 and the image-capturing pixels 310 in the (2n+3)th row accounting for another line through an operational procedure similar to that followed in conjunction with the control signal R(2n+1).

In the third embodiment described above, the image-capturing pixels 310 and the focus detection pixels 311 are disposed in combination at the pixel array unit 40, with the focus detection pixels 311 set at positions taken by the green filters in the Bayer array and the image-capturing pixels 310 set at positions taken by the red color filters and the blue color filters in the Bayer array. In addition, the selection processing executed at the first column switch device 47 and the second column switch device 43 is switched depending upon whether an odd-numbered row or an even-numbered row in the pixel array unit 40 has been scanned by the row scanning circuit 41. This system makes it possible to simplify the structure of the image sensor in the current embodiment compared to the structure adopted for the image sensor shown in FIG. 10. In more specific terms, the quantity of digital circuits configuring the column digital adder circuit 46, which are bound to take on a greater circuit scale compared to that of switch circuits, can be reduced (from 2M to M digital circuits). Likewise, the quantity of memories configuring the second line memory 44, which are bound to take on a greater circuit scale compared to that of switch circuits, can be reduced (from 4M to 2M memories). In addition, the number of sets of data output through the second horizontal output circuit 45 during a horizontal scan period is halved from 4M to 2M in comparison to the corresponding number of sets of data output at the image sensor shown in FIG. 10. With the number of sets of data output through the second horizontal output circuit 45 during the horizontal scan period reduced to equal the number of sets of data output through the first horizontal output circuit 49 during the horizontal scan period, the overall data transfer rate can be lowered. In addition, since the focus detection data read out from the second horizontal output circuit 45 are exclusively data originating from the focus detection pixels having disposed therein green filters, the focus detection operation is better facilitated (a great many subjects in natural environments assume a green color contrast and also, the focus position corresponding to green color is normally designated as the focus match position in conjunction with a photographic lens manifesting chromatic aberration).

Figure 41:
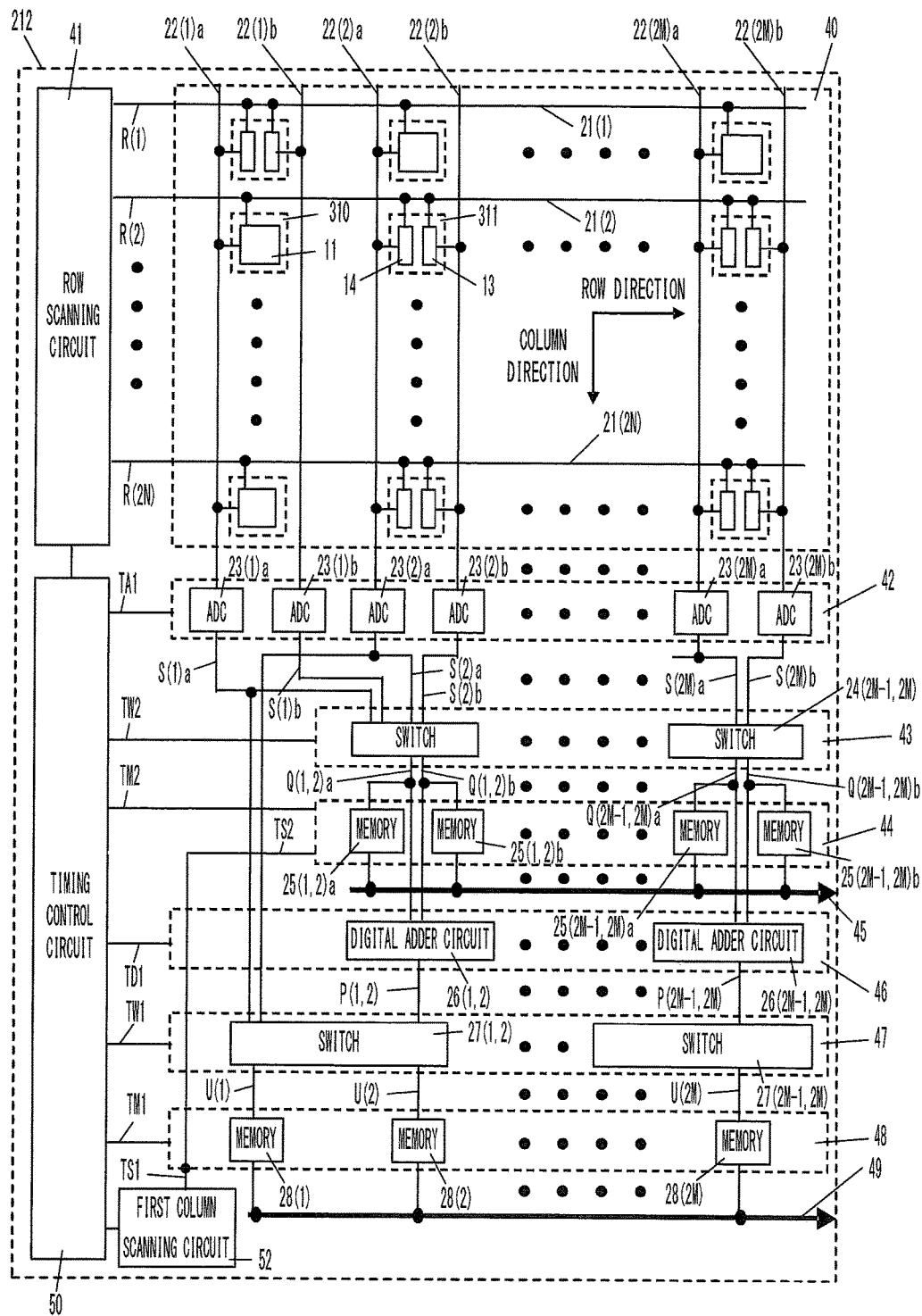

In the third embodiment described above, the number of sets of focus detection data output as a result of horizontal scanning of a given row, executed via the second column scanning circuit 51, and the number of sets of image processing data output as a result of horizontal scanning of the row executed via the first column scanning circuit 52, match each other. This means that the structure of the image sensor may be even further simplified through functional commonality of the second column scanning circuit 51 and the first column scanning circuit 52 by, for instance, using the scan signal TS1 for the first column scanning circuit 52 also as the scan signal TS2 for the second line memory 44. An example of an image sensor that only includes the first column scanning circuit 52 and dispenses with the second column scanning circuit 51, which is made possible through the use of the scan signal TS1 for the first column scanning circuit also as the scan signal TS2 for the second line memory 44, is presented in FIG. 41.

In the third embodiment described above, the data from the pairs of photoelectric conversion units in all the focus detection pixels are read out for purposes of focus detection in correspondence to each frame. However, the load of reading out the data from the pairs of photoelectric conversion units in all the focus detection pixels is significant and furthermore, considerable memory capacity needs to be assured in order to accommodate storage of such data. For this reason, data may be read out as necessary through a frame cull read (data are read out for a single frame out of several frames), through a row cull read (data are read out from one row out of several rows), through a partial row read (data are read out from only some rows), through a column cull read (data are read out from one column out of several columns) or through a partial column read (data are read out from only some columns).

Figure 30:
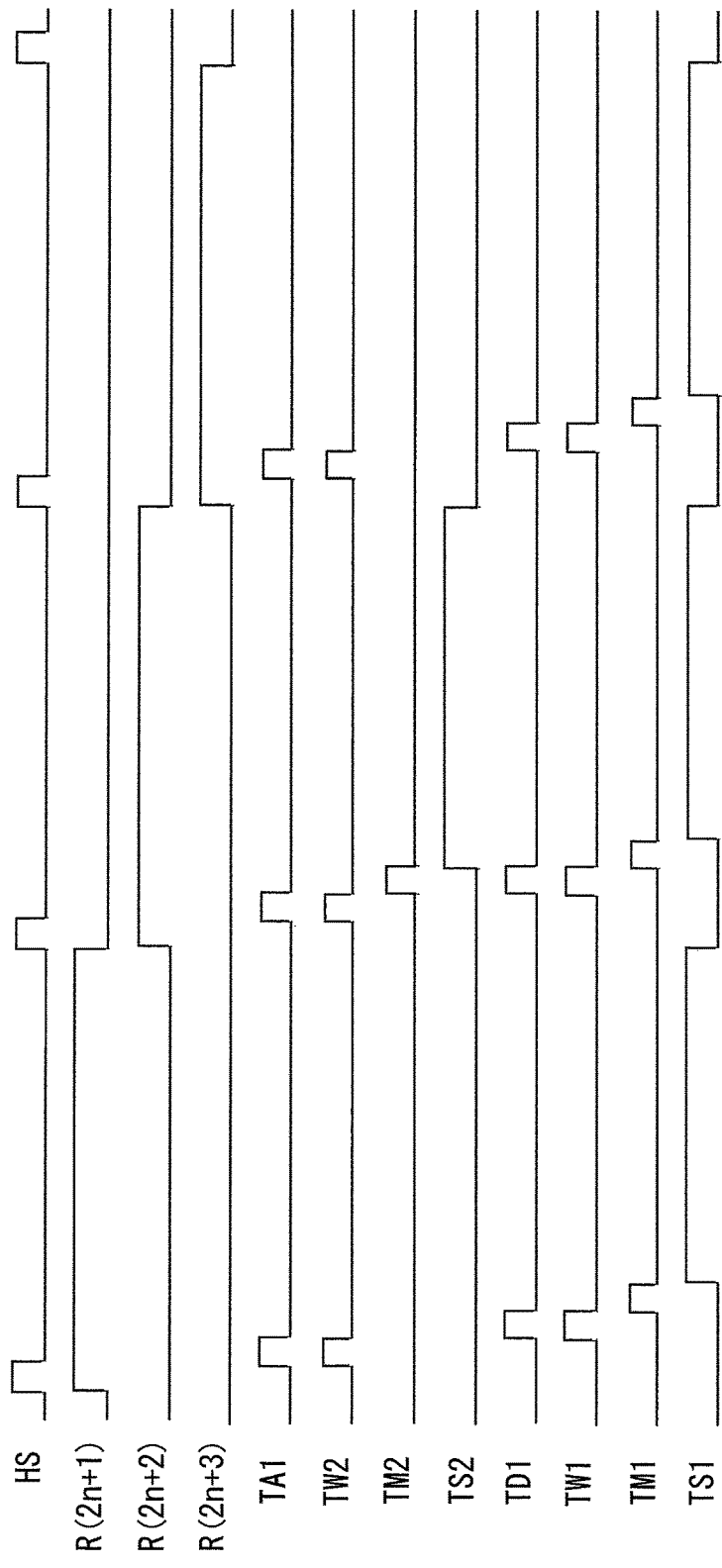

In reference to the timing chart presented in FIG. 30, which corresponds to FIG. 29, the operation executed for a partial row read (the data from the pairs of photoelectric conversion units in the focus detection pixels in the (2n+2)th row alone are read out) will be described. An operation identical to that in FIG. 29 is executed when the (2n+2)th row in the pixel array unit 40 is selected by the control signal R(2n+2). However, if a row other than the (2n+2)th row is selected (in the operation executed in response to the control signal R(2n+1) or the control signal R(2n+3) in FIG. 30), no control signal TM2 is generated, and data corresponding to the pairs of photoelectric conversion units in the focus detection pixels are not stored into the memories (25(1, 2)a and 25(1, 2)b through 25(2M−1, 2M)a and 25(2M−1, 2M)b) in the second line memory 44. In addition, since no scan signal TS2 is generated either, data are not sequentially provided through a serial output to the external recipient from the second horizontal output circuit 45 during the period of time elapsing until the next horizontal synchronous signal HS is generated.

Rows selected for a partial row read or columns selected for a partial column read can be adjusted based upon information transmitted from the body drive control device 214 to the image sensor 212 in correspondence to the position of the selected focus detection area.

Each of the switches configuring the first column switch device 47 in the third embodiment described above selects two signals equivalent to image-capturing pixel output signals based upon whether an odd-numbered row or an even-numbered row in the pixel array unit 40 has been selected via the row scanning circuit 41 as illustrated in FIG. 28. The individual switches in the first column switch device 47 each sort the two selected signals so as to line up with the pixel arrangement assumed in the selected row and the two signals thus selected are to be stored into the corresponding memory among the memories (28(1) through 28(2M)) in the first line memory 48. However, two signals may instead be stored into fixed memories among the memories (28(1) through 28(2M)) in the first line memory 48 without sorting the two selected signals to line up with the order in which the pixels are set in the selected row. In such a case, the scan signal TS1 can be modified to line up with the order in which the individual pixels are set in the selected row based upon whether an odd-numbered row or an even-numbered row in the pixel array unit 40 has been selected via the row scanning circuit 41 and the memories (28(1) through 28(2M)) in the first line memory 48 can be scanned in response to the modified scan signal TS1 provided from the first column scanning circuit 52 to the memories (28(1) through 28(2M)) in the first line memory 48.

Fourth Embodiment

Figure 31:
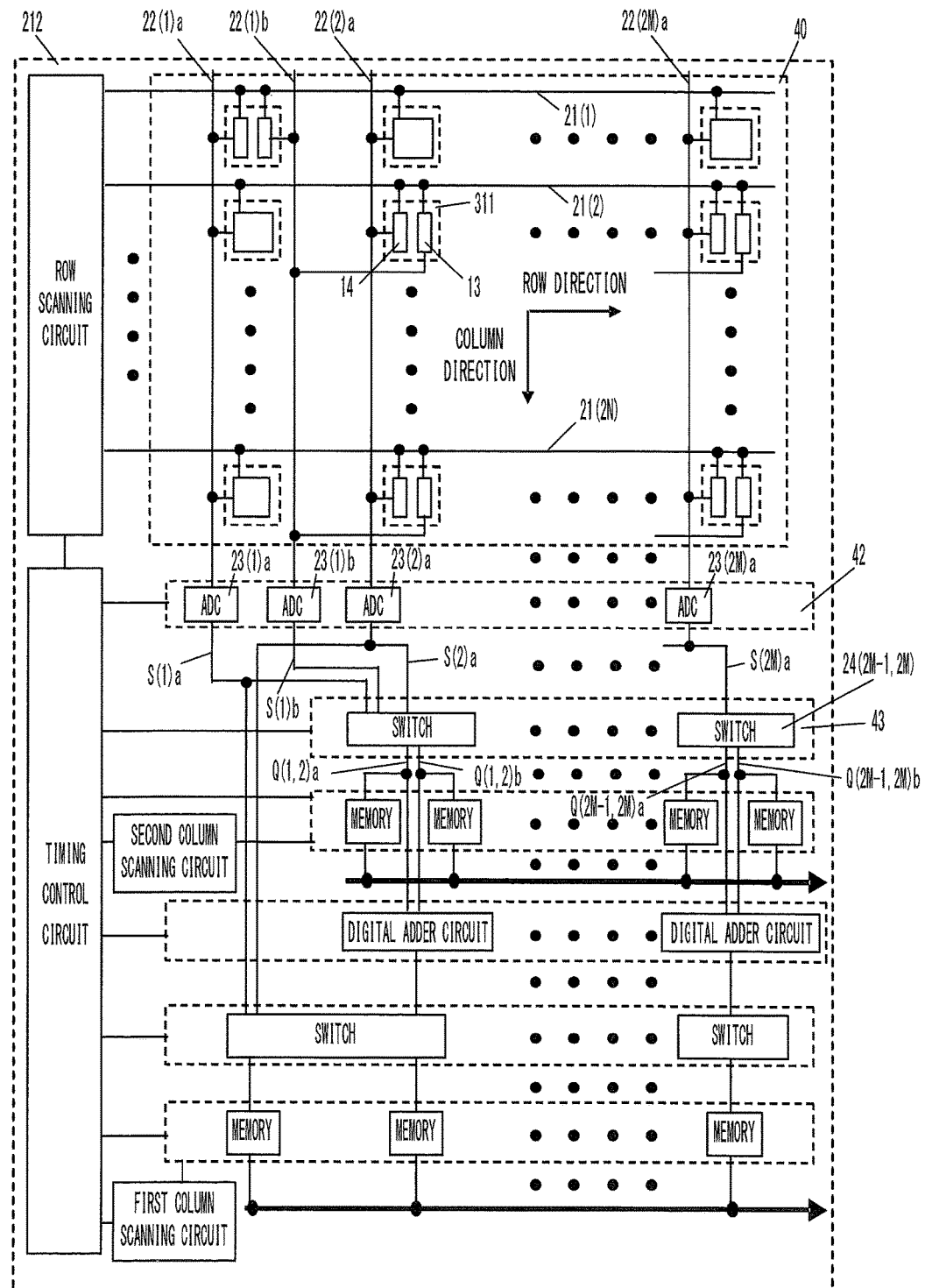

The fourth embodiment is achieved as a variation of the third embodiment. The structure of the image sensor 212 achieved in the fourth embodiment, as shown in FIG. 31, will be described by focusing on aspects thereof characterizing the embodiment without providing any repeated explanation of structural features identical to those in FIG. 26. The feature of the pixel array unit 40 differentiating it from that shown in FIG. 26 is as follows. In the pixel array unit 40 shown in FIG. 26, two column signal lines are installed in correspondence to each column for a total of 4M column signal lines (22(1)a and 22(1)b through 22(2M)a and 22(2M)b). The structure shown in FIG. 31 is distinguishable from this in that the number of column signal lines installed in correspondence to each even-numbered column is reduced to one and a column signal line installed for an odd-numbered column is shared with the even-numbered column, resulting in a reduction in the overall number of column signal lines to 3M. With the number of column signal lines reduced as described above, the wiring layout at the pixel array unit 40 can be rendered less crowded in the fourth embodiment. At the same time, since this also allows the photoelectric conversion units to take up a greater area, an even higher-quality image can be generated and focus detection can be executed with better accuracy.

In addition, as the number of column signal lines is reduced, the quantity of ADCs to configure the column A/D conversion device 42 can also be reduced (from 4M to 3M) and thus, the structure of the image sensor can be further simplified through the fourth embodiment.

As shown in FIG. 31, one end of each row control line 21 (21(1) through 21 (2N)) corresponding to a given row is connected to an output end of the row scanning circuit 41 corresponding to the particular row, and control signals R(1) through R(2N) are output to the respective row control lines 21.

Photoelectric conversion units in the image-capturing pixels 310 and the pairs of photoelectric conversion units 13 and 14 in the focus detection pixels 311 disposed in a given row are connected to the row scanning circuit 41 through the common row control line 21 and in response to a control signal R(L), charge storage control and signal read control are executed simultaneously. Two column signal lines 22(2m+1)a and 22(2m+1)b are installed at each odd-numbered column and a single column signal line 22(2m+2)a is installed at each even-numbered column in the pixel array unit 40. The photoelectric conversion units 11 in image-capturing pixels 310 disposed at an odd-numbered column position and the photoelectric conversion units 14 in focus detection pixels 311 disposed at the odd-numbered column position are connected to one of the two column signal lines installed at the odd-numbered column, i.e., the column signal line 22(2m+1)a. The photoelectric conversion units 13 in the focus detection pixels 311 disposed at the odd-numbered column position are connected to the other column signal line 22(2m+1)b installed at the odd-numbered column. In addition, the photoelectric conversion units 11 in image-capturing pixels 310 disposed at an even numbered column position and the photoelectric conversion units 14 in focus detection pixels 311 disposed at the even-numbered column position are connected to the column signal line 22(2m+2)a installed at the even-numbered column. The photoelectric conversion units 13 in the focus detection pixels 311 disposed at the even-numbered column position are connected to the column signal line 22(2m+1)b installed at the odd-numbered column.

When an odd-numbered row in the pixel array unit 40 is selected via the row scanning circuit 41, for instance, the output signals from the photoelectric conversion units 11 in the image-capturing pixels 310 in the odd-numbered row are each output to the corresponding column signal line 22(2m+2)a and the output signals from the pair of photoelectric conversion units 13 and 14 in each of the focus detection pixels 311 in the odd-numbered row are output to the corresponding column signal lines 22(2m+1)a and 22(2m+1)b. When an even-numbered row in the pixel array unit 40 is selected via the scanning circuit 41, on the other hand, the output signals from the photoelectric conversion units 11 in the image-capturing pixels 310 in the even-numbered row are each output to the corresponding column signal line 22(2m+1)a, the output signals from the photoelectric conversion units 14 in the focus detection pixels 311 in the even-numbered row are each output to the corresponding column signal line 22(2m+2)a and the output signals from the photoelectric conversion units 13 in the focus detection pixels 311 in the even-numbered row are each output to the column signal line 22(2m+1)b.

The column A/D conversion device 42 includes 3M ADC (analog-digital conversion) circuits 23(1)a and 23(1)b through 23(2M)a, respectively disposed in correspondence to the 3M column signal lines 22(1)a and 22(1)b through 22(2M)a, which are installed in correspondence to the individual pixel columns in the pixel array unit 40. In response to a control signal TA1 provided from the timing control circuit 50, the column A/D conversion device 42 converts analog signals, output from the individual pixels in the pixel array unit 40 in correspondence to the individual columns, to H-bit digital signals (S(1)a and S(1)b through S(2M)a) and outputs the digital signals resulting from the conversion.

The second column switch device 43 includes M switches 24(1, 2) through 24(2M−1, 2M), each disposed in correspondence to two successive pixel columns. In response to a control signal TW2 provided from the timing control circuit 50, the second column switch device 43 selects digital signals among the digital signals each output from one of the ADCs (23(1)a and 23(1)b through 23(2M)a) and outputs the selected signals.

FIGS. 32(a) and 32(b) illustrate selection operations executed at the switch 24(2m+1, 2m+2) disposed in correspondence to two successive pixel columns (i.e., the (2m+1)th column and the (2m+2)th column). Three digital signals S(2m+1)a, S(2m+1)b and S(2m+2)a are input to the switch 24(2m+1, 2m+2) from the two ADCs (23(2m+1)a and 23(2m+1)b) corresponding to the odd-numbered column (2m+1) and the single ADC (23(2m+2)a) corresponding to the even-numbered column (2m+2).

FIG. 32(a) illustrates the selection operation executed at the switch 24(2m+1, 2m+2) when an odd-numbered row in the pixel array unit 40 is selected via the row scanning circuit 41. In the operation illustrated in FIG. 32(a), the three digital signals S(2m+1)a, S(2m+1)b and S(2m+2)a corresponding to the image-capturing pixel 310 disposed at the odd-numbered row/even-numbered column position and the focus detection pixel 311 disposed at the odd-numbered row/odd-numbered column position are input to the switch 24(2m+1, 2m+2).

In response to the control signal TW2 (indicating the odd-numbered row) input to the second column switch device 43, the switch 24(2m+1, 2m+2) selects the digital signals S(2m+1)a and S(2m+1)b corresponding to the pair of photoelectric conversion units in the focus detection pixel 311 and outputs them as a pair of signals (Q(2m+1, 2m+2)a and Q(2m+1, 2m+2)b) to be digitally added together.

FIG. 32(b) illustrates the selection operation executed at the switch 24(2m+1, 2m+2) when an even-numbered row in the pixel array unit 40 is selected via the row scanning circuit 41. The three digital signals S(2m+1)a, S(2m+1)b and S(2m+2)a corresponding to the image-capturing pixel 310 disposed at the even-numbered row/odd-numbered column position and the focus detection pixel 311 disposed at the even-numbered row/even-numbered column position are input to the switch 24(2m+1, 2m+2).

In response to the control signal TW2 (indicating the even-numbered row) input to the second column switch device 43, the switch 24(2m+1, 2m+2) selects the digital signals S(2m+2)a and S(2m+1)b corresponding to the pair of photoelectric conversion units in the focus detection pixel 311 and outputs them as a pair of signals (Q(2m+1, 2m+2)a and Q(2m+1, 2m+2)b) corresponding to the pair of conversion units 13 and 14 in a focus detection pixel 311.

Fifth Embodiment

Figure 33:
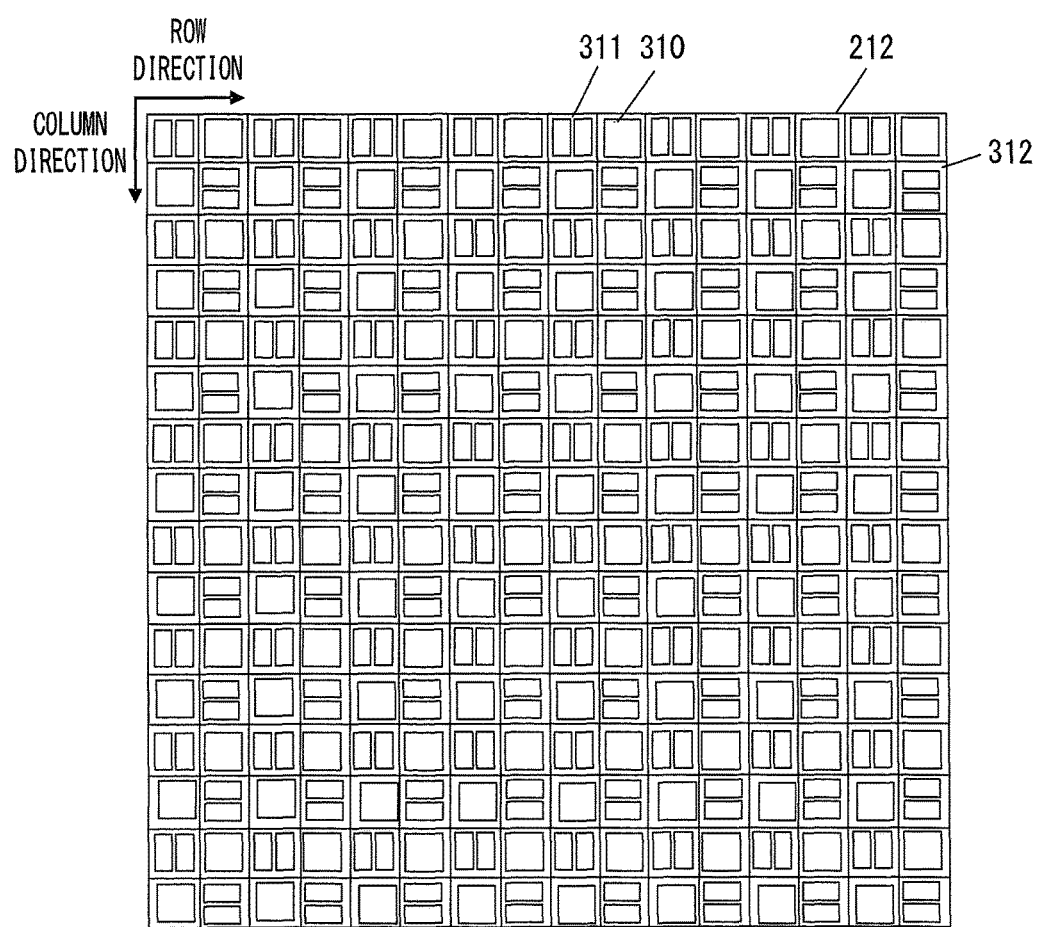

The fifth embodiment is achieved as an alternative with regard to the structure of the focus detection pixels in the pixel array unit in the third embodiment. FIG. 33 presents a layout diagram (with filters disposed as shown in FIG. 4) corresponding to the pixel layout diagram presented in FIG. 25. The image sensor 212, a part of which is shown in FIG. 33, includes focus detection pixels 312 each having a pair of photoelectric conversion units 16 and 17 set side-by-side along the vertical direction, replacing the focus detection pixels 311 disposed in even-numbered rows in FIG. 25.

Namely, focus detection pixels 311 are disposed at odd-numbered column positions and image-capturing pixels 310 are disposed at even-numbered column positions in odd-numbered rows, whereas image-capturing pixels 310 are disposed at odd-numbered column positions and focus detection pixels 312 are disposed at even-numbered column positions in even-numbered rows. Among the color filters set in the Bayer array pattern, the green filters are all disposed at the focus detection pixels 311 and the focus detection pixels 312, whereas the red color filters and the blue color filters are disposed at the image-capturing pixels 310.

Figure 34:
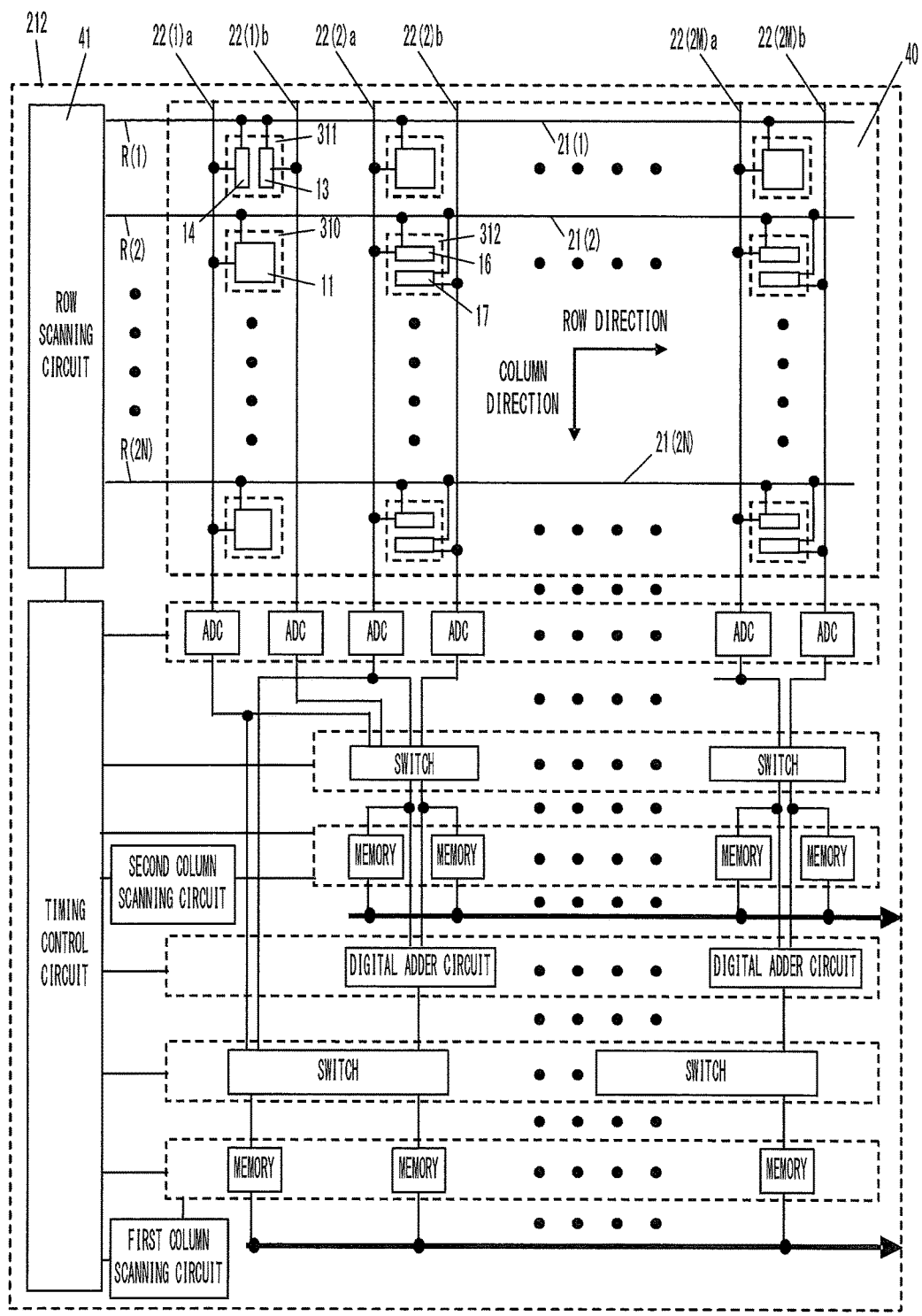

FIG. 34 is a block diagram showing the structure of the image sensor 212 assuming the pixel layout shown in FIG. 33. An explanation given in reference to FIG. 34 will focus on structural differences characterizing the image sensor and an explanation of the structural elements identical to those in FIG. 26 will not be provided. The pixel array unit 40 differs from that shown in FIG. 26 in that the focus detection pixels 312, each having a pair of photoelectric conversion units 16 and 17 separated from each other along the vertical direction, are disposed at even-numbered row/even-numbered column positions.

The pairs of photoelectric conversion units 16 and 17 in the individual focus detection pixels 312 disposed at the even-numbered column positions in an even-numbered row are connected via a common row control line 21, with the row scanning circuit 41. In response to a control signal R(L) (L is an even number), charge storage control and signal read control are simultaneously executed. One of the pair of photoelectric conversion units 16 and 17, i.e., the photoelectric conversion unit 16, at each of the focus detection pixels 312 disposed at the even-numbered row/even-numbered column positions is connected to one of the two column signal lines, i.e., the column signal line 22(2m+2)a, installed in correspondence to the particular column. The output signal (analog signal) from the photoelectric conversion unit 16 is output to the column signal line 22(2m+2)a. The other photoelectric conversion unit 17 in the pair of photoelectric conversion units 16 and 17 in each focus detection pixel 312 is connected to the other column signal line 22(2m+2)b of the two column signal lines installed in correspondence to the particular column. The output signal (analog signal) from the photoelectric conversion unit 17 is output to the column signal line 22(2m+2)b.

Via the image sensor 212 structured as described above, a phase difference manifesting with regard to a subject image with a contrast change occurring along the horizontal direction can be detected based upon a pair of sets of data obtained by grouping, along the horizontal direction, the data from the photoelectric conversion units 13 and the data from the photoelectric conversion units 14 in the pairs of photoelectric conversion units 13 and 14 in the focus detection pixels 311 with green color filters, disposed at even-numbered column positions in an odd-numbered row. In addition, a phase difference manifesting with regard to a subject image with a contrast change occurring along the vertical direction can be detected based upon a pair of sets of data obtained by grouping, along the vertical direction, the data from the photoelectric conversion units 16 and the data from the photoelectric conversion units 17 in the pairs of photoelectric conversion units 16 and 17 in the focus detection pixels 312 with green color filters, disposed at an even-numbered column position in even-numbered rows.

Sixth Embodiment

The sixth embodiment is achieved as an alternative with regard to the structure of the focus detection pixels in the pixel array unit in the fourth embodiment. The pixel layout adopted in the sixth embodiment is identical to that shown in FIG. 33. The image sensor 212, a part of which is shown in FIG. 33, includes focus detection pixels 312 each having a pair of photoelectric conversion units 16 and 17 set side-by-side along the vertical direction, replacing the focus detection pixels 311 disposed in even-numbered rows in FIG. 25.

Namely, focus detection pixels 311 are disposed at odd-numbered column positions and image-capturing pixels 310 are disposed at even-numbered column positions in odd-numbered rows, whereas image-capturing pixels 310 are disposed at odd-numbered column positions and focus detection pixels 312 are disposed at even-numbered column positions in even-numbered rows. Among the color filters set in the Bayer array pattern, the green filters are all disposed at the focus detection pixels 311 and the focus detection pixels 312, whereas the red color filters and the blue color filters are disposed at the image-capturing pixels 310.

Figure 35:
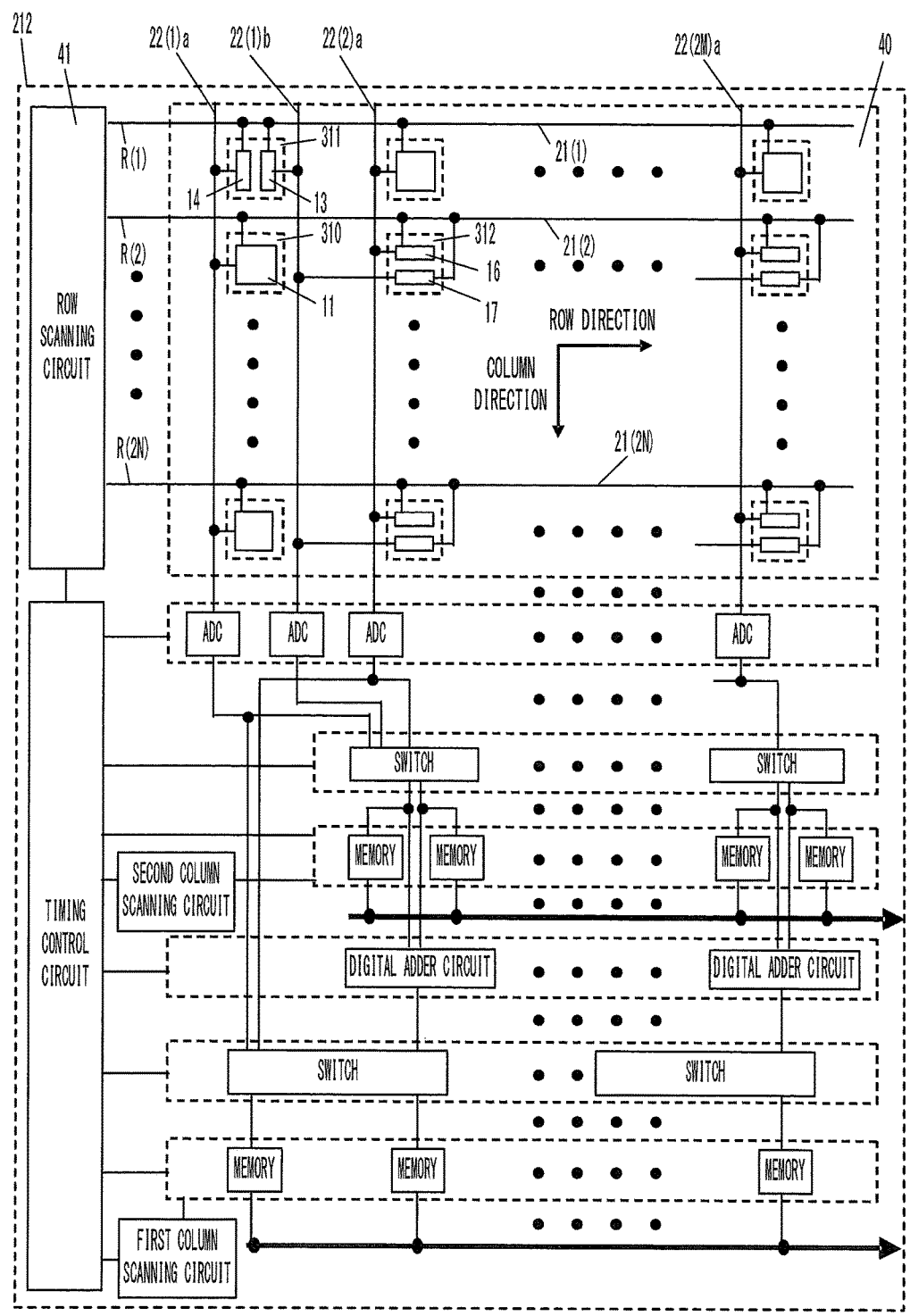

FIG. 35 is a block diagram showing the structure of the image sensor 212 assuming the pixel layout shown in FIG. 33. An explanation given in reference to FIG. 35 will focus on structural differences characterizing the image sensor and an explanation of the structural elements identical to those in FIG. 31 will not be provided. The pixel array unit 40 differs from that shown in FIG. 31 in that the focus detection pixels 312, each having a pair of photoelectric conversion units 16 and 17 separated from each other along the vertical direction, are disposed at even-numbered row/even-numbered column positions.

The pairs of photoelectric conversion units 16 and 17 in the individual focus detection pixels 312 disposed at even-numbered column positions in an even-numbered row are connected via a common row control line 21 with the row scanning circuit 41. In response to a control signal R(L) (L is an even number), charge storage control and signal read control are simultaneously executed. One of the pair of photoelectric conversion units 16 and 17, i.e., the photoelectric conversion unit 16, at each of the focus detection pixels 312 is connected to the one column signal line 22(2m+2)a installed for the corresponding even-numbered column. The output signal (analog signal) from the photoelectric conversion unit 16 is output to the column signal line 22(2m+2)a. The other photoelectric conversion unit 17 in the pair of photoelectric conversion units 16 and 17 in the focus detection pixel 312 is connected to one of the two column signal lines installed for an even numbered column, i.e., the column signal line 22(2m+1)b. The output signal (analog signal) from the photoelectric conversion unit 17 is output to the column signal line 22(2m+1)b.

Via the image sensor 212 structured as described above, a phase difference manifesting with regard to a subject image with a contrast change occurring along the horizontal direction can be detected based upon a pair of sets of data obtained by grouping, along the horizontal direction, the data from the photoelectric conversion units 13 and the data from the photoelectric conversion units 14 in the pairs of photoelectric conversion units 13 and 14 in the focus detection pixels 311 with green color filters disposed at even-numbered column positions in an odd-numbered row. In addition, a phase difference manifesting with regard to a subject image with a contrast change occurring along the vertical direction can be detected based upon a pair of sets of data obtained by grouping, along the vertical direction, the data from the photoelectric conversion units 16 and the data from the photoelectric conversion units 17 in the pairs of photoelectric conversion units 16 and 17 in the focus detection pixels 312 with green color filters disposed at an even-numbered column position in even-numbered rows.

Seventh Embodiment

While the pixels (focus detection pixels and image-capturing pixels) in the pixel array unit 40 are disposed in a square grid pattern in the pixel array unit 40 achieved in each of the first through sixth embodiments described above, the present invention may be adopted in conjunction with a pixel array pattern other than the square grid pattern.

Figure 36:
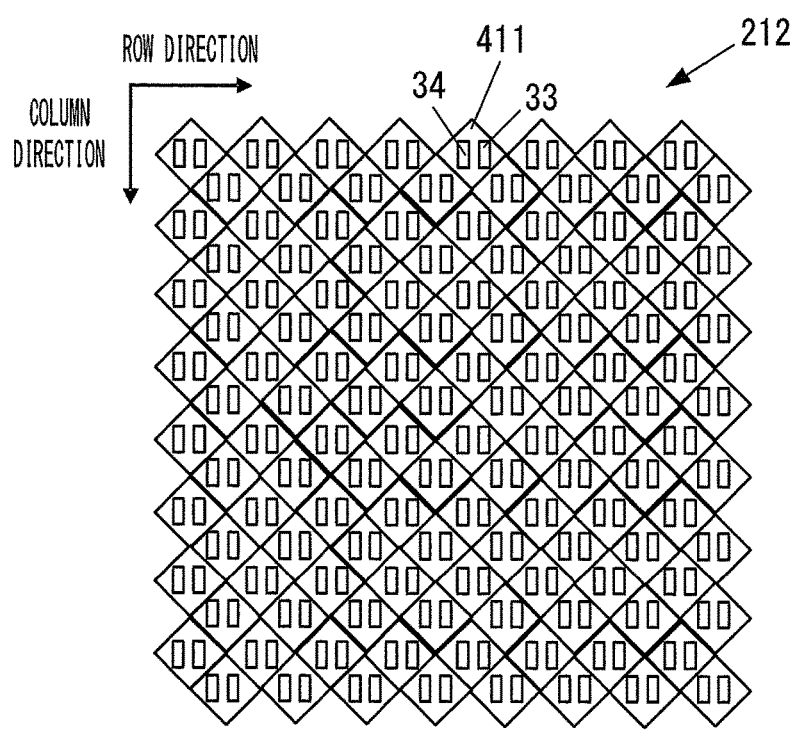
Figure 37:
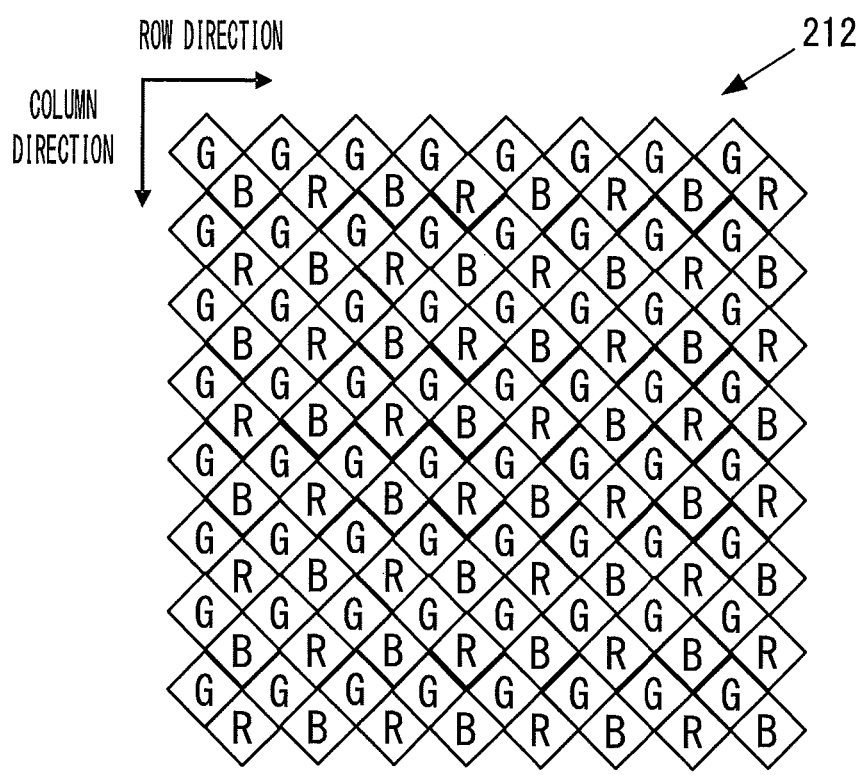

FIG. 36 shows a pixel array adopting an array pattern sometimes referred to as a honeycomb array. This array pattern is achieved by rotating a square grid pattern by 45°. The filter array corresponding to the pixel layout shown in FIG. 36 is shown in FIG. 37. The filter array in FIG. 37 is achieved by tilting the Bayer array pattern by 45°. The honeycomb array shown in FIG. 36 and FIG. 37 includes focus detection pixels 411 each having a pair of photoelectric conversion units 33 and 34 set side-by-side along the horizontal direction.

The terms "row" and "column" used in describing such a honeycomb array are defined as follows. Namely, a pixel row extending along the horizontal direction formed with pixels having green color filters disposed thereat is an odd-numbered row, whereas a pixel row extending along the horizontal direction formed with pixels each having a red color filter or a blue color filter disposed thereat is an even-numbered row. A pixel column extending along the vertical direction formed with pixels having green color filters disposed thereat is an odd-numbered column and a pixel column extending along the vertical direction formed with pixels each having a red color filter or a blue color filter disposed thereat is an even-numbered column.

Figure 38:
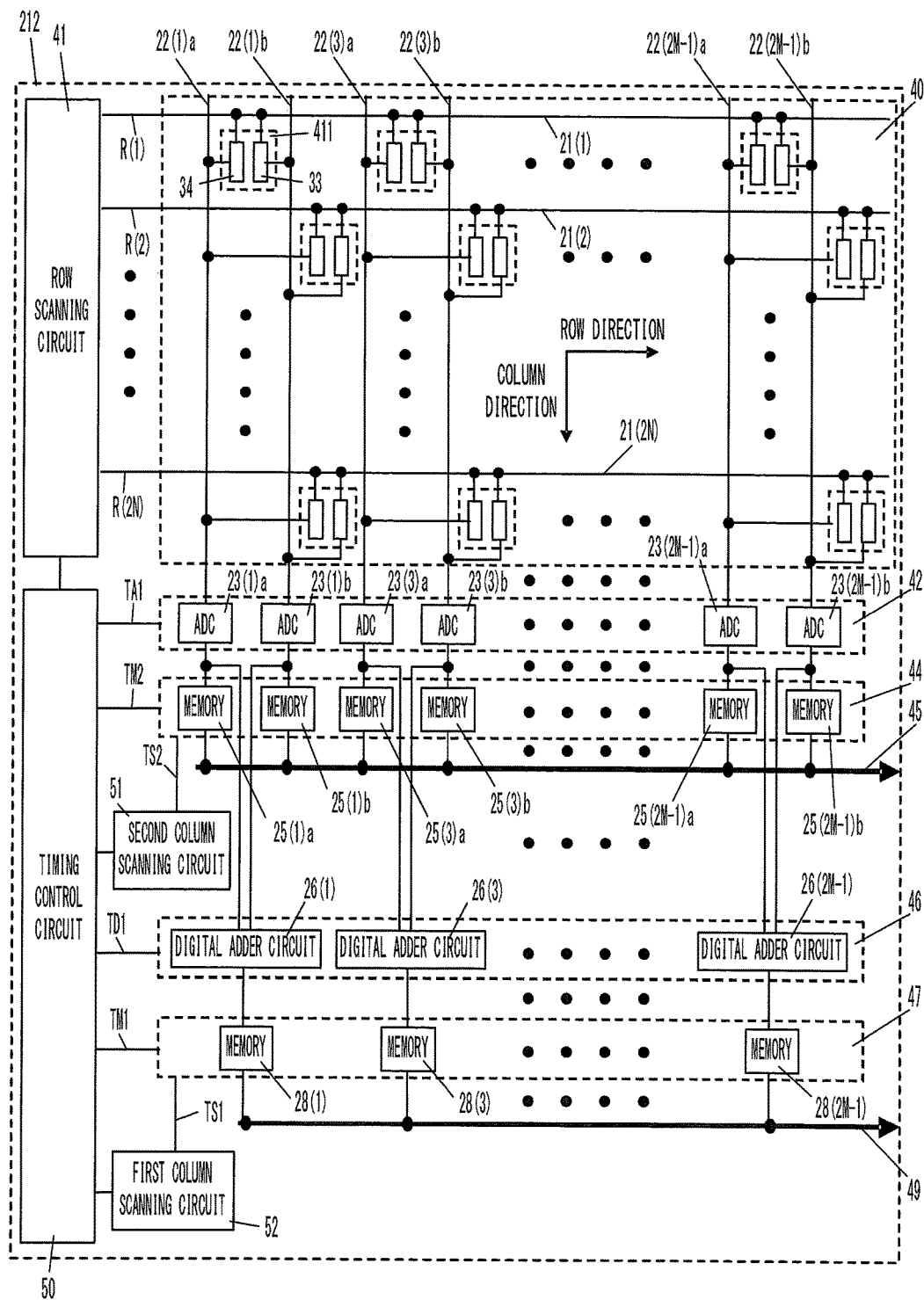

FIG. 38 is a block diagram showing the structure adopted in an image sensor 212 with the pixels thereof laid out in the honeycomb array shown in FIG. 36 (2N rows×2M columns). The structure adopted for the image sensor 212 in FIG. 38 is achieved by modifying the structure of the image sensor shown in FIG. 10 so that focus detection pixels 411 instead of the focus detection pixels 311 are disposed only at every other position in the pixel array unit 40. Namely, focus detection pixels 411 are disposed only at odd-numbered column positions in an odd-numbered row, whereas focus detection pixels 411 are disposed only at even-numbered column positions in an even-numbered row.

At the pixel array unit 40, the focus detection pixels 411 are two-dimensionally arrayed over 2N rows×2M columns. The focus detection pixel 411 in the upper left corner in FIG. 38 is the pixel taking up a first-row/first-column position, and a green color filter is disposed at this pixel. For this 2N row 2M column pixel array, a single row control line 21(21(1) through 21(2N)) is wired in correspondence to each row and two column signal lines (22 (1)a and 22(1)b through 22(2M−1)a and 22(2M−1)b) are wired in correspondence to each odd-numbered column. One end of each row control line 21 (21(1) through 21 (2N)) corresponding to a given row is connected to an output end of the row scanning circuit 41 corresponding to the particular row, and control signals R(1) through R(2N) are output to the respective row control lines 21.

The pairs of photoelectric conversion units 33 and 34 in the individual focus detection pixels 411 in a given row are connected, via a common row control line 21, with the row scanning circuit 41. In response to a control signal R(L), charge storage control and signal read control are simultaneously executed. One of the pair of photoelectric conversion units 33 and 34, i.e., the photoelectric conversion unit 33, in the focus detection pixel 411 disposed at an odd-numbered column position (2m+1) in an odd-numbered row is connected to one of the two column signal lines, i.e., the column signal line 22(2m+1)b, installed in correspondence to the odd-numbered column (2m+1). The output signal (analog signal) from the photoelectric conversion unit 33 is output to the column signal line 22(2m+1)b. The other photoelectric conversion unit 34 in the pair of photoelectric conversion units 33 and 34 in the focus detection pixel 411 is connected to the other column signal line 22(2m+1)a of the two column signal lines installed in correspondence to the odd-numbered column (2m+1). The output signal (analog signal) from the photoelectric conversion unit 34 is output to the column signal line 22(2m+1)a.

In addition, one of the pair of photoelectric conversion units 33 and 34, i.e., the photoelectric conversion unit 33, in the focus detection pixel 411 disposed at an even-numbered column position (2m+2) in an even-numbered row is connected to one of the two column signal lines, i.e., the column signal line 22(2m+1)b, installed in correspondence to the odd-numbered column (2m+1). The output signal (analog signal) from the photoelectric conversion unit 33 is output to the column signal line 22(2m+1)b. The other photoelectric conversion unit 34 in the pair of photoelectric conversion units 33 and 34 in the focus detection pixel 411 is connected to the other column signal line 22(2m+1)a of the two column signal lines installed in correspondence to the odd-numbered column (2m+1). The output signal (analog signal) from the photoelectric conversion unit 34 is output to the column signal line 22(2m+1).

The column A/D conversion device 42 includes ADC (analog-digital conversion) circuits 23(1)a and 23(1)b through 23(2M−1)a and 23(2M−1)b, respectively disposed in correspondence to the column signal lines 22(1)a and 22(1)b through 22(2M−1)a and 22(2M−1)b, which are installed in correspondence to pixel columns in the pixel array unit 40. In response to a control signal TA1 provided from the timing control circuit 50, the column A/D conversion device 42 converts pairs of analog signals output from the individual pixels in the pixel array unit 40 in correspondence to the individual columns, to H-bit digital signals and outputs the digital signals resulting from the conversion.

The second line memory 44 includes memories (25(1)a and 25(1)b through 25(2M−1)a and 25(2M−1)b) respectively installed in correspondence to the individual ADCs (23(1)a and 23(1)b through 23(2M−1)a and 23(2M−1)b) configuring the column A/D conversion device 42. In response to a control signal TM2 provided from the timing control circuit 50, the digital signals output in correspondence to the individual ADCs (23(1)a and 23(1)b through 23(2M−1)a and 23(2M−1)b) are stored as H-bit digital signals into the second line memory 44. In the various memories (25(1)a and 25(1)b through 25(2M−1)a and 25(2M−1)b) in the second line memory 44, the output signals from the pairs of photoelectric conversion units 33 and 34 in a single row of focus detection pixels are thus stored as digital signals.

The column digital adder device 46 includes digital adder circuits (26(1) through 26(2M−1)) each installed in correspondence to a pair of ADCs (among the pairs of ADCs (23(1)a and 23(1)b through 23(2M−1)a and 23(2M−1)b) configuring the column A/D conversion device 42. In response to a control signal TD1 provided from the timing control circuit 50, the column digital adder device 46 adds together the digital signals output from each pair of ADCs (among 23(1)a and 23(1)b through 23(2M−1)a and 23(2M−1)b) and outputs the resulting signal as an H-bit digital sum signal.

The first line memory 48 includes memories (28(1) through 28(2M−1)) respectively installed in correspondence to the digital adder circuits (26(1) through 26(2M−1)) configuring the column digital adder device 46. In response to a control signal TM1 provided from the timing control circuit 50, the digital sum signals each output from one of the digital adder circuits (26(1) through 26(2M−1)) are stored into the first line memory 48 as H-bit digital signals. Through this operation, sum signals (equivalent to output signals provided from image-capturing pixels), each obtained by adding together the output signals from the pair of photoelectric conversion units 33 and 34 in a focus detection pixel among the focus detection pixels forming a single row, are stored as digital signals in the individual memories ((28(1) through 28(2M−1)) in the first line memory 48.

The second line memory 44 is engaged in operation in response to a scan signal TS2 provided from the second column scanning circuit 51. The H-bit digital signals each stored in one of the memories (25(1)a and 25(1)b through 25(2M−1)a and 25(2M−1)b) are read out in sequence into the second horizontal output circuit 45, and subsequently are serially output to an external recipient as output signals (digital signals) provided via the pairs of photoelectric conversion units 33 and 34 to be used for purposes of focus detection via the second horizontal output circuit 45.

The first line memory 48 is engaged in operation in response to a scan signal TS1 provided from the first column scanning circuit 52. The H-bit digital sum signals each stored in one of the memories (28(1) through 28(2M−1)) are read out in sequence into the first horizontal output circuit 49, and subsequently are serially output to an external recipient as output signals (digital signals) equivalent to output signals provided from image-capturing pixels, via the first horizontal output circuit 49.

Eighth Embodiment

Figure 39:
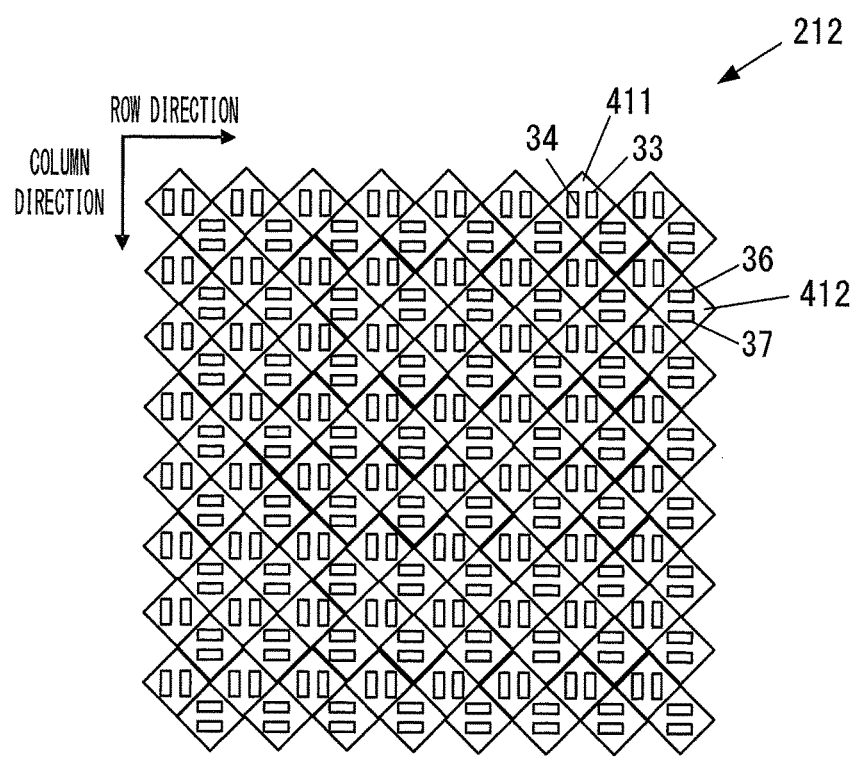

The eighth embodiment is achieved as an alternative with regard to the structure of the focus detection pixels in the pixel array unit in the seventh embodiment. FIG. 39 presents a layout diagram (with filters disposed as shown in FIG. 37) corresponding to the pixel layout diagram presented in FIG. 36. The image sensor 212, a part of which is shown in FIG. 39, includes focus detection pixels 412 each having a pair of photoelectric conversion units 36 and 37 set side-by-side along the vertical direction, replacing the focus detection pixels 411 disposed in even-numbered rows in FIG. 36.

Namely, focus detection pixels 411 are disposed at odd-numbered column positions in each odd-numbered row, whereas focus detection pixels 412 are disposed at even-numbered column positions in each even-numbered row.

Figure 40:
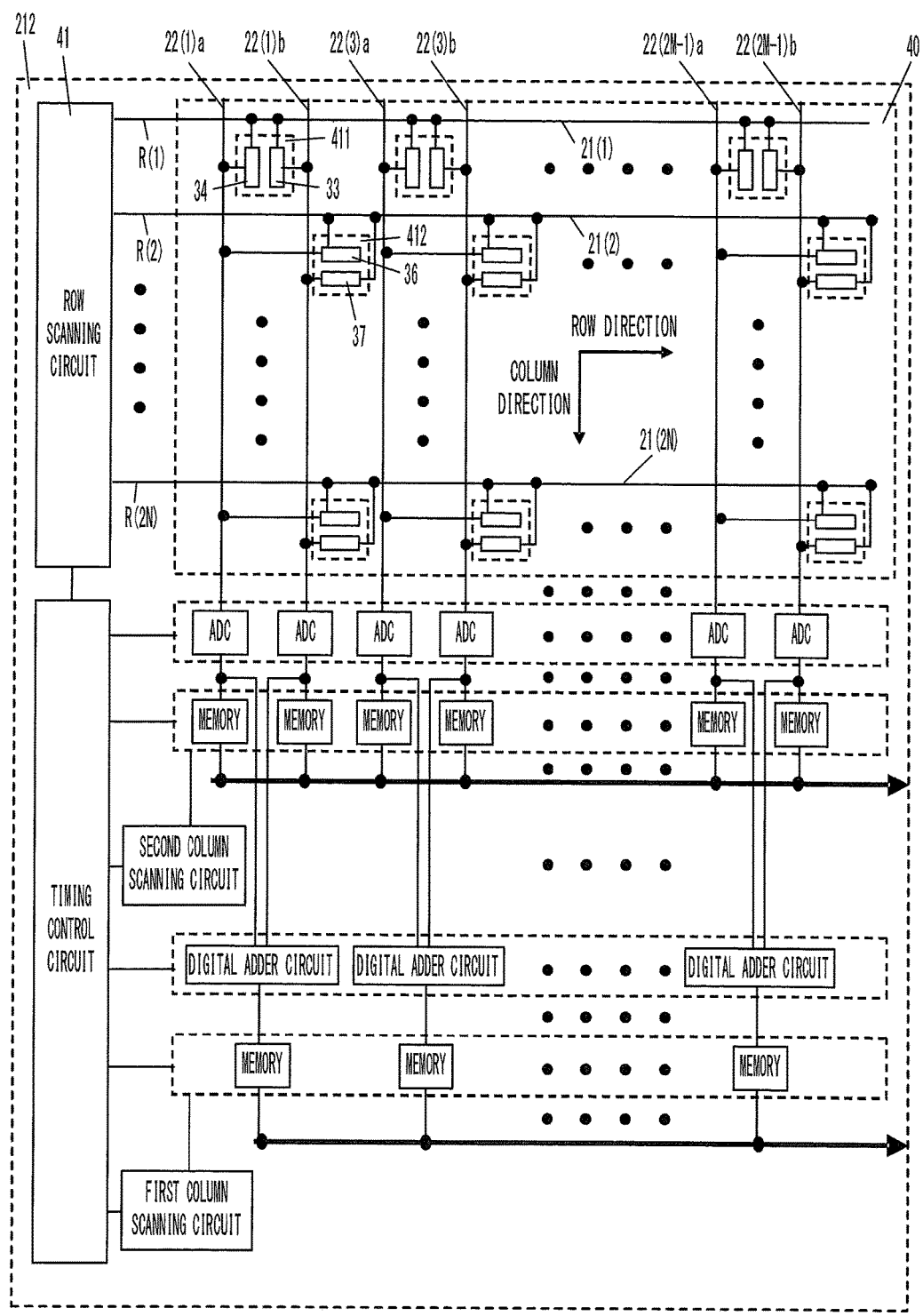

FIG. 40 is a block diagram showing the structure of the image sensor 212 assuming the pixel layout shown in FIG. 39. An explanation given in reference to FIG. 40 will focus on structural differences characterizing the image sensor and an explanation of the structural elements identical to those in FIG. 38 will not be provided. The pixel array unit 40 differs from that shown in FIG. 38 in that the focus detection pixels 412, each having a pair of photoelectric conversion units 36 and 37, separated from each other along the vertical direction, are disposed at even-numbered row/even-numbered column positions.

The pairs of photoelectric conversion units 36 and 37 in the individual focus detection pixels 412 disposed at even-numbered column positions (2m+2) in an even-numbered row are connected, via a common row control line 21, with the row scanning circuit 41. In response to a control signal R(L) (L is an even number), charge storage control and signal read control are simultaneously executed. One of the pair of photoelectric conversion units 36 and 37, i.e., the photoelectric conversion unit 36, at each of the focus detection pixels 412, is connected to one of the two column signal lines, i.e., the column signal line 22(2m+1)a installed in correspondence to an odd-numbered column (2m+1). The output signal (analog signal) from the photoelectric conversion unit 36 is output to the column signal line 22(2m+1)a. The other photoelectric conversion unit 37 in the pair of photoelectric conversion units 36 and 37 in the focus detection pixel 412 is connected to the other column signal line 22(2m+1)b of the two column signal lines installed in correspondence to the particular odd-numbered column (2m+1). The output signal (analog signal) from the photoelectric conversion unit 37 is output to the column signal line 22(2m+1)b.

Via the image sensor 212 structured as described above, a phase difference manifesting with regard to a subject image with a contrast change occurring along the horizontal direction can be detected based upon a pair of sets of data obtained by grouping, along the horizontal direction, the data from the photoelectric conversion units 33 and the data from the photoelectric conversion units 34 in the pairs of photoelectric conversion units 33 and 34 in the focus detection pixels 411 with green color filters disposed at odd-numbered column positions in an odd-numbered row. In addition, a phase difference manifesting with regard to a subject image with a contrast change occurring along the vertical direction can be detected based upon a pair of sets of data obtained by grouping, along the vertical direction, the data from the photoelectric conversion units 36 and the data from the photoelectric conversion units 37 in the pairs of photoelectric conversion units 36 and 37 in the focus detection pixels 412 with red color filters and blue color filters, disposed at an even-numbered column position in even-numbered rows.

Other Embodiments

The present invention is not limited to applications in image sensors with focus detection pixels thereof each having two photoelectric conversion units disposed thereat, and it may be adopted in an image sensor with focus detection pixels thereof, each having two or more photoelectric conversion units. For instance, while the focus detection pixel 311 shown in FIG. 6 includes two photoelectric conversion units 13 and 14 defined by splitting a square into two equal portions separated from each other along the horizontal direction, the present invention may instead be adopted in an image sensor having focus detection pixels thereof each having four photoelectric conversion units achieved by splitting each of the two photoelectric conversion units 13 and 14 into two equal portions separated from each other along the vertical direction. In such a case, the image sensor will include, for instance, four column signal lines installed in correspondence to each column so as to allow the analog signals from the four photoelectric conversion units to be read out independently of one another. The image sensor will further include a column A/D conversion device configured with ADCs that individually convert the analog signals output from the four photoelectric conversion units to digital signals and output the digital signals resulting from the conversion. In addition, the image sensor will include a column digital adder device that includes digital adder circuits, via each of which the digital signals from the four photoelectric conversion units, output by the column A/D conversion device, are digitally added together. Such an image sensor will achieve advantages similar to those of the image sensor shown in FIG. 10.

As an alternative, the image sensor may adopt a structure achieved by regarding two of the four photoelectric conversion units as photoelectric conversion units belonging to a focus detection pixel disposed in one of two virtual adjacent rows and regarding the remaining two photoelectric conversion units as photoelectric conversion units belonging to a focus detection pixel in the other virtual row adjacent to the first virtual row, instead of installing four column signal lines each in correspondence to one of the four photoelectric conversion units. In this alternative structure, the number of column signal lines can be reduced to two. For instance, in conjunction with a focus detection pixel 311 with four photoelectric conversion units, two of which are disposed at an upper stage and the other two of which are disposed at a lower stage, the two upper stage photoelectric conversion units and the two lower stage photoelectric conversion units may be regarded as photoelectric conversion units belonging to focus detection pixels in two virtual rows adjacent to each other so as to reduce the column signal lines to two.

The image sensor achieved in each of the embodiments described above includes a single focus detection data output channel and a single image data output channel installed for the entire image array unit. However, the read speed may be improved by dividing the image array unit into a plurality of areas and installing one focus detection data output channel and one image data output channel in correspondence to each area.

In the image sensor 212 achieved in each of the embodiments described above, the CPUa 222 in the body drive control device 214 detects the focusing condition at the interchangeable lens 202 (optical system) based upon digital signals obtained as the column A/D conversion device 42 converts pairs of analog signals to digital signals. However, the digital signals obtained via the column A/D conversion device 42 where the pairs of analog signals undergo A/D conversion may instead be used as signals for a 3-D camera.

A wiring layer may be either present or absent in the area between the micro-lenses and the photoelectric conversion units at the focus detection pixels shown in FIG. 7. The present invention may be adopted in an image sensor having either type of focus detection pixels. Namely, the present invention may be adopted in a backside illumination-type image sensor arrayed with focus detection pixels with a wiring layer disposed on the side of the photoelectric conversion units that is opposite the side where the micro-lenses are present, as well as in an image sensor arrayed with focus detection pixels with a wiring layer installed between the micro-lenses and the photoelectric conversion units. An image sensor requiring column signal lines 22, such as the image sensor according to the present invention, is bound to include a greater number of wiring layers, in comparison to image sensors in the related art. Since wiring layers can be disposed at a backside illumination-type image sensor without any restrictions imposed with regard to the photoelectric conversion unit layout, the increase in the number of column signal lines can be accommodated with better flexibility.

While the image sensor 212 achieved in each of the embodiments described above includes color filters disposed at the image-capturing pixels thereof in the Bayer array pattern, the structures of such color filters and the array pattern of the color filters are not limited to those in the embodiments, and the present invention may be adopted in conjunction with an array of complementary color filters (green: G, yellow: Ye, magenta: Mg, cyan: Cy) or in conjunction with an arrangement other than the Bayer array. In addition, the present invention may be adopted in a monochromatic image sensor.

The image sensor 212 achieved in each of the embodiments described above, which includes the pixel array unit 40 and other components, is achieved by forming the pixel array unit 40 and the other components on separate substrates and laminating these substrates one on top of the other. However, the present invention is not limited to this example and the pixel array unit 40 and the other components may all the disposed on a single substrate.

It is to be noted that an image-capturing device is not limited to the digital camera with an interchangeable lens mounted at the camera body, as described above. For instance, the present invention may instead be adopted in a digital still camera with an integrated lens or in a video camera. Furthermore, it may also be adopted in a compact camera module built into a mobile telephone or the like, in a visual recognition device in a surveillance camera or a robotic optical system, a vehicular onboard camera or the like.

The disclosure of the following priority application is herein incorporated by reference:
Japanese Patent Application No. 2012-214452 filed Sep. 27, 2012

REFERENCE SIGNS LIST 10 micro-lens
11, 13, 14, 16, 17, 33, 34, 36, 37 photoelectric conversion unit
15, 18 element separation area
21 row control line
22 column signal line
23 ADC (analog-digital conversion circuit)
24, 27 switch
25, 28 memory
26 digital adder circuit
29 semiconductor substrate
30 light shielding mask
31, 32 leveling layer
38 color filter
40 pixel array unit
41 row scanning circuit
42 column A/D conversion device
43 second column switch device
44 second line memory
45 second horizontal output circuit
46 column digital adder circuit
47 first column switch device
48 first line memory
49 first horizontal output circuit
50 timing control circuit
51 second column scanning circuit
52 first column scanning circuit
71 photographic light flux
73, 74 focus detection light flux
90 exit pupil
91 optical axis
93, 94 focus detection pupil
95 area
100 photographic image plane
101 focus detection area
201 digital still camera
202 interchangeable lens
203 camera body
204 mount unit
206 lens drive control device
208 zooming lens
209 lens
210 focusing lens
211 aperture
212 image sensor
213 electrical contact point
214 body drive control device
215 liquid crystal display element drive circuit
216 liquid crystal display element
217 eyepiece lens
219 memory card
220 image sensor control unit
221 buffer memory
222 CPUa
223 CPUb
310 image-capturing pixel
311, 312, 411, 412 focus detection pixel

The invention claimed is:

1. An image sensor comprising:
a pixel having a first photoelectric converter and a second photoelectric converter that convert light and generate charge;
a first signal line that outputs a signal based on the charge generated by the first photoelectric converter;
a second signal line that outputs a signal based on the charge generated by the second photoelectric converter;
an adder circuit that is connected to the first and second signal lines and that adds together the signal based on the charge generated by the first photoelectric converter and the signal based on the charge generated by the second photoelectric converter;
a first output circuit that outputs at least one of the signal output by the first signal line and the signal output by the second signal line; and
a second output circuit that outputs a sum signal generated by the adder circuit.

2. The image sensor according to claim 1, further comprising
a first A/D converter that is connected to the first signal line and that converts an analog signal based on the charge generated by the first photoelectric converter to a digital signal; and
a second A/D converter that is connected to the second signal line and that converts an analog signal based on the charge generated by the second photoelectric converter to a digital signal.

3. The image sensor according to claim 2, wherein
the adder circuit adds together the digital signal converted by the first A/D converter and the digital signal converted by the second A/D converter.

4. The image sensor according to claim 2, wherein
the first output circuit outputs at least one of the digital signal obtained by the conversion of the first A/D converter and the digital signal obtained by the conversion of the second A/D converter.

5. The image sensor according to claim 1, further comprising
an A/D converter that is connected to the first and second signal lines and that converts an analog signal based on the charge generated by the first photoelectric converter to a first digital signal and converts an analog signal based on the charge generated by the second photoelectric converter to a second digital signal.

6. The image sensor according to claim 5, wherein
the adder circuit adds together the first digital signal and the second digital signal.

7. The image sensor according to claim 5, wherein
the first output circuit outputs at least one of the first digital signal and the second digital signal obtained by the conversion of the A/D converter.

8. The image sensor according to claim 1, further comprising
a first memory that is connected to the first signal line and that stores the signal based on the charge generated by the first photoelectric converter; and
a second memory that is connected to the second signal line and that stores the signal based on the charge generated by the second photoelectric converter.

9. The image sensor according to claim 8, further comprising:
a first A/D converter that is connected to the first signal line and that converts an analog signal based on the charge generated by the first photoelectric converter to a digital signal; and
a second A/D converter that is connected to the second signal line and that converts an analog signal based on the charge generated by the second photoelectric converter to a digital signal, wherein:
the first memory stores the digital signal obtained by the conversion of the first A/D converter, and
the second memory stores the digital signal obtained by the conversion of the second A/D converter.

10. The image sensor according to claim 1, further comprising
a third memory that stores the sum signal generated by the adder circuit.

11. The image sensor according to claim 1, wherein
the pixel has a microlens, and
the first and second photoelectric converters convert to charge light transmitting through the microlens.

12. An imaging device comprising:
the image sensor according to claim 1; and
a generator that generates image data based on the sum signal output by the second output circuit.

13. The image sensor according to claim 1, wherein
a chip including the pixel and a chip including the adder circuit are laminated on each other.

14. An imaging device comprising:
the image sensor according to claim 1, which receives light having passed through an optical system; and
a controller that controls a position of the optical system based on the signal output by the first output circuit as an image formed by the optical system on the image sensor to be in focus.

* * * * *